United States Patent [19]
Iwasaki et al.

[11] Patent Number: 6,100,915
[45] Date of Patent: Aug. 8, 2000

[54] LASER DRAWING APPARATUS

[75] Inventors: Etsuo Iwasaki; Takashi Okuyama, both of Tokyo, Japan

[73] Assignee: Asahi Kogaku Kogyo Kabushiki Kaisha, Tokyo, Japan

[21] Appl. No.: 08/917,943

[22] Filed: Aug. 27, 1997

[30] Foreign Application Priority Data

| Aug. 28, 1996 | [JP] | Japan | P08-245644 |
| Sep. 6, 1996 | [JP] | Japan | P08-257844 |
| Oct. 28, 1996 | [JP] | Japan | P08-302508 |

[51] Int. Cl.$^7$ ................................. H04N 1/047
[52] U.S. Cl. .................. 347/249; 347/235; 347/250; 347/252
[58] Field of Search .................. 347/250, 252, 347/235, 249, 116; 358/481

[56] References Cited

U.S. PATENT DOCUMENTS

| 4,920,430 | 4/1990 | Isono et al. | 358/481 |
| 5,046,796 | 9/1991 | Andoh et al. | 359/216 |
| 5,117,106 | 5/1992 | Andon et al. | 250/235 |
| 5,664,251 | 9/1997 | Tachihara et al. | 396/548 |

*Primary Examiner*—N. Le
*Assistant Examiner*—Hai C. Pham
*Attorney, Agent, or Firm*—Greenblum & Bernstein, P.L.C.

[57] ABSTRACT

In a laser drawing apparatus, a pattern is drawn on a workpiece by scanning the workpiece with at least one laser beam. The laser beam is modulated on the basis of raster-graphic data, in accordance with a series of clock pulses. A calculator calulates clock-pulse-phase-shift location data, indicative of where a phase of the clock pulses should be shifted, with a unit of less than 2Π. The calculation is made on the basis of pixel-dot-pitch discrepancy data measured along a scanning line defined by the scanning laser beam. A clock-pulse-outputting controller controls outputting the clock pulses so that the phase of the clock pulses is shifted, with the unit of less than 2Π. The shift occurs whenever the laser beam reaches each of the clock-pulse-phase-shift locations, represented by the clock-pulse-phase shift location data, during scanning of the workpiece with the laser beam. Consequently, a pixel-dot-pitch discrepance in the scanning line can be corrected with a unit of less than a one-pixel-dot size.

48 Claims, 35 Drawing Sheets

——— : ACTUALLY-DRAWN LATTICE PATTERN
------ : THEORETICALLY-DRAWN LATTICE PATTERN

LASER DRAWING APPARATUS

BACKGROUND OF THE INVENTION

1. Field of the Invention

The present invention relates to a laser drawing apparatus for drawing a pattern on a surface of a workpiece by scanning the workpiece surface with laser beams and then modulating the laser beams, on the basis of raster-graphic data, in accordance with a series of clock pulses.

2. Description of the Related Art

Such a laser drawing apparatus is used for drawing a fine pattern on a surface of a suitable workpiece. As a representative use of the laser drawing apparatus, it is known that a fine circuit pattern is drawn on the workpiece when producing a printed circuit board using photolithography. In this case, the workpiece may be either a photosensitive film for producing a photomask or a photoresist layer formed on a suitable substrate.

Recently, a circuit pattern drawing system has been developed for efficiently carrying out a drawing of a circuit pattern by integrating the use of a laser drawing apparatus, a CAD (Computer Aided Design) station for designing a circuit pattern, a CAM (Computer Aided Manufacturing) station for editing the designed circuit, an EWS (engineering work station) for commanding and controlling the drawing operation of the individual laser drawing apparatus and, finally, a LAN (local area network) through which the CAD station, the CAM station, the EWS and the laser drawing apparatuses are all connected to each other.

A circuit pattern is designed and treated as vector-graphic data by the CAD station. The vector-graphic data may be fed from the CAD station to the CAM station, through the LAN, for editing of the designed circuit pattern, if necessary. In either case, the vector-graphic data is fed from the CAD station or CAM station to the EWS, through the LAN, and is stored in a storage medium, such as a hard disk, provided in the EWS.

The EWS suitably feeds the vector-graphic data to one of the laser drawing apparatuses, and the vector-graphic data are converted into raster-graphic data by a vector-to-raster graphic converter provided in the laser drawing apparatus. The raster-graphic data are developed and stored in a pattern memory or bit-map memory and, in a drawing operation, the raster-graphic data are successively read from the bit-map memory.

The laser drawing apparatus comprises a drawing table on which the workpiece is positioned. Also, the laser drawing apparatus comprises a laser beam generator for emitting laser beams, and a laser beam deflector, such as a polygon mirror, for deflecting the laser beams in a main-scanning direction, so that the workpiece placed on the drawing table is scanned with the deflected laser beams. In the drawing operation, the drawing table is moved in a sub-scanning direction, which is perpendicular to the main-scanning direction. The movement of the drawing table is carried out by a drive motor, such as a stepping motor, a servo motor and so on, which is driven in accordance with a series of drive pulses. The deflected laser beams are modulated on the basis of the read raster-graphic data, and the modulation of the laser beams is performed in accordance with a series of clock pulses. Thus, a circuit pattern, based on the raster-graphic data developed in the bit-map memory, is drawn on the workpiece.

The circuit pattern drawn on the workpiece is formed by pixel-dots which are produced along main-scanning-lines, defined on the workpiece by the deflection of the laser beams in the main-scanning direction, and along sub-scanning-lines defined on the workpiece by the movement of the drawing table in the sub-scanning direction. Of course, the production of the pixel-dots is dependent upon the modulation of the laser beams based upon the raster-graphic data, and a pitch of the produced pixel-dots depends upon a frequency of the series of clock pulses.

Ideally, the pixel-dots should be uniformly arranged at a constant pitch along each of the main-scanning-lines and along each of the sub-scanning-lines before the drawn circuit pattern can be obtained with a high quality. Nevertheless, in laser drawing apparatuses, it is impossible to obtain a uniform arrangement of the pixel-dots along the main-scanning-line and the sub-scanning-lines due to assembly error caused during manufacture of the laser drawing apparatus.

Conventionally, after a laser drawing apparatus is assembled, a drawing operation is actually executed in which a test pattern is drawn, and an irregularity of the arrangement of the pixel-dots is measured with respect to the test pattern. Then, a pixel-pitch correction is introduced into the vector-graphic data in the CAM station, on the basis of the measured irregularity of the arrangement of the pixel-dots, so that the pixel-dots can be arranged as uniformly as possible along the main-scanning-lines and along the sub-scanning-lines. Nevertheless, the pixel-pitch correction is merely performed with a unit of one-pixel-dot size with respect to a pattern to be drawn. Namely, in the conventional laser drawing apparatus, it is impossible to perform a precise pixel-pitch correction with a unit of less than one-pixel-dot size.

Alternatively, a precise pixel-pitch correction with a unit of less than one-pixel-dot size can be performed by adjusting both an output-timing of the clock pulses, for the modulation of the laser beams, and an output-timing of the drive pulses, for the drive motor of the drawing table, in accordance with the measured irregularity of the arrangement of the pixel-dots.

In particular, the clock pulses for the modulation of the laser beams are derived from the divisions of a linear scale provided along the main-scanning direction, and the drive pulses for the drive motor of the drawing table are derived from the divisions of a linear scale provided along the sub-scanning direction. If both the divisions of the linear scales are modified in accordance with the measured irregularity of the arrangement of the pixel-dots, a precise pixel-pitch correction with a unit of less than the one-pixel-dot size is made possible. Nevertheless, this approach is unadvisable because sets of the two linear scales, each having the modified divisions, must be prepared with respect to individual laser drawing apparatuses, and this becomes very costly.

Further, in the laser drawing apparatus as mentioned above, a drive mechanism for driving the drawing table is especially susceptible to assembly error, resulting in a disordering of the arrangement of the pixel-dots along the sub-scanning-lines. For example, although the sub-scanning-lines, along each of which the pixel-dots are arranged, should be precisely extended perpendicular to the main-scanning-lines, the sub-scanning-lines may be inclined with respect to the main-scanning-lines due to an assembly error during manufacture of the drive mechanism for driving the drawing table. Further, although the pixel-dots should also be precisely aligned with each other along each of the sub-scanning-lines, a misalignment of pixel-dots along the sub-scanning-lines may also be produced due to an assembly error during manufacture of the drive mechanism for driving the drawing table.

Similar to the conventional case as mentioned above, an irregularity of the arrangement of the pixel-dots along the sub-scanning-lines is measured by actually executing a drawing operation of a test pattern using an assembled laser drawing apparatus. If the measured results represent an inclination of the sub-scanning-lines with respect to the main-scanning-lines, an inclination correction, based upon the measured results, is introduced into the vector-graphic data in the CAM station so that the inclination of the sub-scanning-lines can be improved as much as possible.

If the measured results represent a misalignment of the pixel-dots along the sub-scanning-lines, a misalignment correction, based upon the measured results, is introduced into the vector-graphic data in the CAM station so that the misalignment of the pixel-dots along the sub-scanning-lines can be improved as much as possible. Nevertheless, the inclination correction and the misalignment corrections are merely performed with a unit of one-pixel-dot size with respect to a pattern to be drawn. Namely, in the conventional laser drawing apparatus, it is impossible to perform a precise inclination correction and a precise misalignment correction with a unit of less than one-pixel-dot size.

SUMMARY OF THE INVENTION

Therefore, a first object of the present invention is to provide a laser drawing apparatus which is constituted such that a pixel-pitch correction, as mentioned above, can be performed with a unit of less than one-pixel-dot size with respect to a pattern to be drawn.

A second object of the present invention is to provide a laser drawing apparatus which is constituted such that inclination correction, as mentioned above, can be performed with a unit of less than one-pixel-dot size with respect to a pattern to be drawn.

A third object of the present invention is to provide a laser drawing apparatus which is constituted such that misalignment correction, as mentioned above, can be performed with a unit of less than one-pixel-dot size with respect to a pattern to be drawn.

In accordance with a first aspect of the present invention, there is provided a laser drawing apparatus for drawing a pattern on a workpiece by scanning the workpiece with at least one laser beam and by modulating the laser beam on the basis of raster-graphic data, in accordance with a series of clock pulses.

The apparatus comprises a calculator and a clock pulse-outputting controller. The calculator is for calculating clock-pulse-phase-shift location data, indicating where a phase of the clock pulses should be shifted, with a unit of less than $2\pi$, on the basis of pixel-dot-pitch discrepancy data previously measured along a scanning line defined by the scanning laser beam. The clock-pulse-outputting controller is for controlling outputting of the clock pulses so that the phase of the clock pulses is shifted, with the unit of less than $2\pi$. The phase is shifted whenever the laser beam reaches each of the clock-pulse-phase-shift locations, represented by the clock-pulse-phase-shift location data, during the scanning of the workpiece with the laser beam. Thus, a pixel-dot-pitch discrepancy in the scanning line can be corrected with a unit of less than one-pixel-dot size.

The laser drawing apparatus may further comprise a determiner for determining whether a production of a pixel-dot-pitch discrepancy at each of the clock-pulse-phase-shift locations is due to the pixel-dots being closer to each other or due to the pixel-dots being spaced further away from each other. When the determiner determines that the production of the pixel-dot-pitch discrepancy is due to the fact that the pixel-dots are closer to each other, the shift of the phase of the clock pulses with the unit of less than $2\pi$ is carried out such that a pixel-dot-pitch is made larger. Also, when the determiner determines that the production of the pixel-dot-pitch discrepancy is due to the fact that the pixel-dots are spaced further away from each other, the shift of the phase of the clock pulses with the unit of less than $2\pi$ is carried out such that a pixel-dot-pitch is made smaller.

In accordance with a second aspect of the present invention, there is provided a laser drawing apparatus for drawing a pattern on a workpiece by scanning the workpiece with at least one laser beam, and by modulating the laser beam, on the basis of raster-graphic data, in accordance with a series of clock pulses. The workpiece is scanned with the laser beam by deflecting the laser beam with respect to the workpiece.

The apparatus comprises a calculator and a clock-pulse-outputting controller. The calculator is for calculating clock-pulse-phase-shift location data, indicating where a phase of the clock pulses should be shifted, with a unit of less than $2\pi$, on the basis of pixel-dot-pitch discrepancy data previously measured along a scanning line defined by the deflection of the laser beam in the main-scanning direction. The clock-pulse-outputting controller is for controlling outputting of the clock pulses so that the phase of the clock pulses is shifted, with the unit of less than $2\pi$, whenever the laser beam reaches each of the clock-pulse-phase-shift locations represented by the clock-pulse-phase-shift location data during the scanning of the workpiece with the laser beam. Thus, a pixel-dot-pitch discrepancy in the scanning line can be corrected with a unit of less than one-pixel-dot size.

The apparatus may further comprise a determiner for determining whether a production of a pixel-dot-pitch discrepancy, at each of the clock-pulse-phase-shift locations, is due to the pixel-dots being closer to each other or being spaced further away from each other. When the determiner determines that the production of the pixel-dot-pitch discrepancy is due to the fact that the pixel-dots are closer to each other, the shift of the phase of the clock pulses, with the unit of less than $2\pi$, is carried out such that the phase of the clock pulses is delayed. Also, when it is determined by the determiner that the production of the pixel-dot-pitch discrepancy is due to the fact that the pixel-dot are spaced further away from each other, the shift of the phase of the clock pulses with the unit of less than $2\pi$, is carried out such that the phase of the clock pulses is advanced.

Preferably, the clock-pulse-outputting controller comprises a clock pulse generator, a switcher and a regulator. The clock pulse generating is for producing at least two series of clock pulses on the basis of a series of basic clock pulses. The respective series of clock pulses have phases which are shifted from each other within a range of $2\pi$. The switcher is for selectively outputting any one of the series of clock pulses from the clock pulse generator. The regulator is for regulating the switcher to output any one of the series of clock pulses therefrom in either a first clock-pulse-outputting manner, to cause a delay in the phase of the output clock pulses, or a second clock-pulse-outputting manner, to cause an advance in the phase of the output clock pulses.

When the determiner determines that the production of the pixel-dot-pitch discrepancy is due to the fact that the pixel-dot are closer to each other, the regulator regulates the switcher to output any one of the series of clock pulses therefrom in the first clock-pulse-outputting manner. Also, when the determiner determines that the production of the pixel-dot-pitch discrepancy is due to the fact that the pixel-dots are spaced further away from each other, the regulator regulates the switcher to output any one of the series of clock pulses therefrom in the second clock-pulse-outputting manner.

In accordance with a third aspect of the present invention, there is provided a laser drawing apparatus for drawing a pattern on a workpiece by scanning the workpiece with at least one laser beam, and by modulating the laser beam, on the basis of raster-graphic data, in accordance with a series of clock pulses. The workpiece is scanned with the laser beam by moving the workpiece with respect to the laser beam.

The apparatus comprises a calculator and a clock-pulse outputting controller. The calculator is for calculating clock-pulse-phase-shift location data, indicating where a phase of the clock pulses should be shifted, with a unit of less than $2\pi$, on the basis of pixel-dot-pitch discrepancy data previously measured along a scanning line defined by the movement of the workpiece with respect to the laser beam. The clock-pulse-outputting controller is for controlling outputting of the clock pulses so that the phase of the clock pulses is shifted, with the unit of less than $2\pi$, whenever the laser beam reaches each of the clock-pulse-phase-shift locations, represented by the clock-pulse-phase-shift location data, during the movement of the workpiece along the scanning line. Thus, a pixel-dot-pitch discrepancy in the scanning line can be corrected with a unit of less than one-pixel-dot size.

The apparatus may further comprise a determiner for determining whether a production of a pixel-dot-pitch discrepancy at each of the clock-pulse-phase-shift locations is due to a fact that the pixel-dots are closer to each other or spaced further away from each other. When the determiner determines that the production of the pixel-dot-pitch discrepancy is due to the fact that the pixel-dots are closer to each other, the shift of the phase of the clock pulses, with the unit of less than $2\pi$, is carried out such that the phase of the clock pulses is advanced. Also, when the determiner determines that the production of the pixel-dot-pitch discrepancy is due to the fact that the pixel-dots are spaced further away from each other, the shift of the phase of the clock pulses, with the unit of less than $2\pi$, is carried out such that the phase of the clock pulses is delayed.

Preferably, the clock-pulse-outputting controller comprises a clock pulse generator, a switcher and a regulator. The clock pulse generator is for producing at least two series of clock pulses on the basis of a series of basic clock pulses. The respective series of clock pulses have phases which are shifted from each other within a range of $2\pi$. The switcher is for selectively outputting any one of the series of clock pulses from the clock pulse generator. The regulator is for regulating the switcher so as to output any one of the series of clock pulses therefrom in either a first clock-pulse-outputting manner, to cause a delay in the phase of the output clock pulses, or a second clock-pulse-outputting manner, to cause an advance in the phase of the output clock pulses.

When the determiner determines that the production of the pixel-dot-pitch discrepancy is due to the fact that the pixel-dots are closer to each other, the regulator regulates the switcher so as to output any one of the series of clock pulses therefrom in the second clock-pulse-outputting manner.

Also, when the determiner determines that the production of the pixel-dot-pitch discrepancy is due to the fact that the pixel-dots are spaced further away from each other, the regulator regulates the switcher so as to output any one of the series of clock pulses therefrom in the first clock-pulse-outputting manner.

In accordance with a fourth aspect of the present invention, there is provided a laser drawing apparatus for drawing a pattern on a workpiece by scanning the workpiece with at least one laser beam in both a main-scanning direction and in a sub-scanning direction. The laser beam is modulated on the basis of raster-graphic data, in accordance with a first series of clock pulses. The scanning of the workpiece with the laser beam, in the main-scanning direction, is carried out by deflecting the laser beam with respect to the workpiece. The scanning of the workpiece with the laser beam, in the sub-scanning direction, is carried out by moving the workpiece with respect to the laser beam, in accordance with a second series of clock pulses. The apparatus comprises a first and second calculator and a first and second clock-pulse-outputting controller.

The first calculator is for calculating first clock-pulse-phase-shift location data, indicating where a phase of the first clock pulses should be shifted, with a unit of less than $2\pi$, on the basis of pixel-dot-pitch discrepancy data. The pixel-dot-pitch discrepancy data is previously measured along a main-scanning line defined by the deflection of the laser beam in the main-scanning direction. The second calculator is for calculating second clock-pulse-phase-shift location data, indicating where a phase of the second clock pulses should be shifted, with a unit of less than $2\pi$, on the basis of pixel-dot-pitch discrepancy data previously measured along a sub-scanning line defined by the movement of the workpiece in the sub-scanning direction with respect to the laser beam.

The first clock-pulse-outputting controller is for controlling outputting of the first clock pulses so that the phase of the first clock pulses is shifted. The phase of the first clock pulses is shifted with the unit of less than $2\pi$, whenever the laser beam reaches each of the main-scanning-clock-pulse-phase-shift locations, represented by the first clock-pulse-phase-shift location data, during the scanning of the workpiece with the laser beam in the main-scanning direction. Thus, a pixel-dot-pitch discrepancy in the main-scanning direction can be corrected with a unit of less than one-pixel-dot size. The second clock-pulse-outputting controller is for controlling outputting of the second clock pulses so that the phase of the second clock pulses is shifted, with the unit of less than $2\pi$, whenever the laser beam reaches each of the sub-scanning-clock-pulse-phase-shift locations, represented by the second clock-pulse-phase-shift location data, during the movement of the workpiece in the sub-scanning direction. Thus, a pixel-dot-pitch discrepancy in the sub-scanning direction can be corrected with a unit of less than one-pixel-dot size.

Preferably, the laser drawing apparatus may further comprise a first and second determiner. The first determiner is for determining whether a production of a pixel-dot-pitch discrepancy, at each of the main-scanning-clock-pulse-phase-shift locations, is due to the pixel-dots being closer to each other or being spaced further from each other. The second determiner is for determining whether a production of a pixel-dot-pitch discrepancy, at each of the sub-scanning-clock-pulse-phase-shift locations, is due to the pixel-dots being closer to each other or being spaced further away from each other.

When the first determiner determines that the production of the pixel-dot-pitch discrepancy is due to the fact that the pixel-dots are closer to each other, the shift of the phase of the first clock pulses, with the unit of less than $2\pi$, is carried out such that the phase of the first clock pulses is delayed. When the first determiner determines that the production of the pixel-dot-pitch discrepancy is due to the fact that the pixel-dots are spaced further away from each other, the shift of the phase of the first clock pulses, with the unit of less than $2\pi$, is carried out such that the phase of the first clock pulses is advanced.

When the second determiner determines that the production of the pixel-dot-pitch discrepancy is due to the fact that the pixel-dots are closer to each other, the shift of the phase of the second clock pulses, with the unit of less than $2\pi$, is carried out such that the phase of the second clock pulses is advanced. When the second determiner determines that the production of the pixel-dot-pitch discrepancy is due to the fact that the pixel-dots are spaced further away from each other, the shift of the phase of the second clock pulses, with the unit of less than $2\pi$, is carried out such that the phase of the second clock pulses is delayed.

Preferably, the first clock-pulse-outputting controller comprises a clock pulse generator, a switcher and a regulator. The clock pulse generator is for producing at least two series of clock pulses on the basis of a series of basic clock pulses. The respective series of clock pulses have phases which are shifted from each other within a range of $2\pi$. The switcher is for selectively outputting any one of the series of clock pulses from the clock pulse generator. The regulator is for regulating the switcher to output any one of the series of clock pulses therefrom in either a first clock-pulse-outputting manner, to cause a delay in the phase of the output clock pulses, or a second clock-pulse-outputting manner, to cause an advance in the phase of the output clock pulses.

When the determiner determines that the production of the pixel-dot-pitch discrepancy is due to the fact that the pixel-dots are closer to each other, the regulator regulates the switcher to output any one of the series of clock pulses therefrom in the first clock-pulse-outputting manner. When the determiner determines that the production of the pixel-dot-pitch discrepancy is due to the fact that the pixel-dots are spaced further away from each other, the regulator regulates the switcher to output any one of the series of clock pulses therefrom in the second clock-pulse-outputting manner.

Preferably, the second clock-pulse-outputting controller comprises a clock pulse generator, a seitcher and a regulator. The clock pulse generator is for producing at least two series of clock pulses on the basis of a series of basic clock pulses. The respective series of clock pulses have phases which are shifted from each other within a range of $2\pi$. The switcher is for selectively outputting any one of the series of clock pulses from the clock pulse generator. The regulator is for regulating the switcher to output any one of the series of clock pulses therefrom in either a first clock-pulse-outputting manner, to cause a delay in the phase of the output clock pulses, or a second clock-pulse-outputting manner, to cause an advance in the phase of the output clock pulses.

When the determiner determines that the production of the pixel-dot-pitch discrepancy is due to the fact that the pixel-dots are spaced further away from each other, the regulator regulates the switcher to output any one of the series of clock pulses therefrom in the first clock-pulse-outputting manner. When the determiner determines that the production of the pixel-dot-pitch discrepancy is due to the fact that the pixel-dots are closer to each other, the regulator regulates the switcher to output any one of the series of clock pulses therefrom in the second clock-pulse-outputting manner.

In accordance with a fifth aspect of the present invention, there is provided a laser drawing apparatus for drawing a pattern on a workpiece by scanning the workpiece with at least one laser beam in both a main-scanning direction and in a sub-scanning direction. The laser beam is modulated on the basis of raster-graphic data, read from a memory, in accordance with a series of clock pulses. The scanning of the workpiece with the laser beam, in the main-scanning direction, is carried out by deflecting the laser beam with respect to the workpiece. The scanning of the workpiece with the laser beam, in the sub-scanning direction, is carried out by moving the workpiece with respect to the laser beam. The apparatus comprises a first and second calculator of a first and second controller.

The first calculator is for calculating one-pixel-dot-shift location data, indicating where a main-scan-start position in the main-scanning direction should be shifted by a distance corresponding to one-pixel-dot size, on the basis of inclination data of a sub-scanning line with respect to the main-scanning direction. The sub-scanning line is defined by the movement of the workpiece in the sub-scanning direction with respect to the laser beam. The inclination data of the sub-scanning line is previously measured. The first controller is for controlling the shift of the main-scan-start position by regulating a reading-timing of the raster-graphic data from the memory whenever the laser beam reaches each of the one-pixel-dot-shift locations, represented by the one-pixel-dot-shift location data, during the movement of the workpiece in the sub-scanning direction. Thus, an inclination of the sub-scanning line with respect to the main-scanning direction can be corrected with a unit of one-pixel-dot size.

The second calculator is for calculating clock-pulse-phase-shift location data, indicating where a phase of the clock pulses should be shifted, with a unit of less than $2\pi$, on the basis of the inclination data. The second controller is for controlling outputting of the clock pulses so that the phase of the clock pulses is shifted, with the unit of less than $2\pi$, whenever the laser beam reaches each of the clock-pulse-phase-shift locations represented by the clock-pulse-phase-shift location data during the movement of the workpiece in the sub-scanning direction. Thus, the inclination of the sub-scanning line with respect to the main-scanning direction can be further finely corrected with a unit of less than one-pixel-dot size.

The apparatus may further comprise a determiner for determining whether the inclination of the sub-scanning line is positive or negative. In this case, when a drifted distance of the sub-scanning line, resulting from the inclination thereof, is produced in the main-scanning direction, the inclination of the sub-scanning line is defined as being positive. When a drifted distance of the sub-scanning line, resulting from the inclination thereof, is produced in an opposite direction to the main-scanning direction, the inclination of the sub-scanning line is defined as being negative.

When the determiner determines that the inclination of the sub-scanning line is positive, the reading-timing of the raster-graphic data from the memory is advanced by a time required to read one-pixel raster-graphic datum from the memory. When the determiner determines that the inclination of the sub-scanning line is negative, the reading-timing of the raster-graphic data from the memory is delayed by the time required to read one-pixel raster-graphic datum from the memory. When the determiner determines that the inclination of the sub-scanning line is positive, the shift of the phase of the clock pulses, with the unit of less than $2\pi$, is carried out such that the phase of the clock pulses is advanced. When the determiner determines that the incliantion of the sub-scanning line is negative, the shift of the phase of the clock pulses, with the unit of less than $2\pi$, is carried out such that the phase of the clock pulses is delayed.

Preferably, the second controller comprises a clock pulse generator, a switcher and a regulator. The clock pulse generator is for producing at least two series of clock pulses on the basis of a series of basic clock pulses. The respective series of clock pulses have phases which are shifted from each other within a range of $2\pi$. The switcher is for selectively outputting any one of the series of clock pulses from the clock pulse generator. The regulator is for regulating the switcher so as to output any one of the series of clock pulses therefrom in either a first clock-pulse-outputting manner, to cause a delay in the phase of the output clock pulses, or a second clock-pulse-outputting manner, to cause an advance in the phase of the output clock pulses.

When the determiner determines that the inclination of the sub-scanning line is negative, the regulator regulates the switcher so as to output any one of the series of clock pulses therefrom in the first clock-pulse-outputting manner. When the determiner determines that the inclination of the sub-scanning line is positive, the regulator regulates the switcher to output any one of the series of clock pulses therefrom in the second clock-pulse-outputting manner.

In accordance with a sixth aspect of the present invention, there is provided a laser drawing apparatus for drawing a pattern on a workpiece by scanning the workpiece with at least one laser beam in both a main-scanning direction and in a sub-scanning direction. The laser beam is modulated on the basis of raster-graphic data, read from a memory, in accordance with a series of clock pulses. The scanning of the workpiece with the laser beam, in the main-scanning direction, is carried out by deflecting the laser beam with respect to the workpiece, and the scanning of the workpiece with the laser beam, in the sub-scanning direction, is carried out by moving the workpiece with respect to the laser beam. The apparatus comprises a first and second calculator and a first and second controller.

The first calculator is for calculating one-pixel-dot-shift location data, indicating where a main-scan-start position should be shifted by a distance corresponding to one-pixel-dot size, on the basis of relative inclination data of a sub-scanning line with respect to the main-scanning direction. The sub-scanning line is defined by the movement of the workpiece in the sub-scanning direction with respect to the laser beam. The relative inclination data of the sub-scanning line is prepared on the basis of previously-measured absolute inclination data of the sub-scanning line with respect to the main-scanning direction and inclination data of an axis, defined by positioning-marks of the workpiece, with respect to the main-scanning line.

The first controller is for controlling the shift of the main-scan-start position. The shift is controlled by regulating a reading-timing of the raster-graphic data from the memory whenever the laser beam reaches each of the one-pixel-dot-shift locations, represented by the one-pixel-dot-shift location data, during the movement of the workpiece in the sub-scanning direction. Thus, a relative inclination of the sub-scanning line with respect to the main-scanning direction can be corrected with a unit of one-pixel-dot size. The correction occurs so that the sub-scanning line is approximated to the axis defined by the positioning-marks of the workpiece.

The second calculator is for calculating clock-pulse-phase-shift location data, indicating where a phase of the clock pulses should be shifted, with a unit of less than $2\pi$, on the basis of the relative inclination data. The second controller is for controlling outputting of the clock pulses so that the phase of the clock pulses is shifted, with the unit of less than $2\pi$, whenever the laser beam reaches each of the clock-pulse-phase-shift locations represented by the clock-pulse-phase-shift location data during the movement of the workpiece in the sub-scanning direction. Thus, the relative inclination of the sub-scanning line with respect to the main-scanning direction can be further finely corrected, with the unit of less than one-pixel-dot size. The correction occurs so that the sub-scanning line is more closely approximated to the axis defined by the positioning-marks of the workpiece.

The laser drawing apparatus may further comprise a determiner for determining whether the relative inclination of the sub-scanning line is positive or negative. In this case, when a drifted distance of the sub-scanning line, resulting from the relative inclination thereof, is produced in the main-scanning direction, the relative inclination of the sub-scanning line is defined as being positive. When a drifted distance of the sub-scanning line, resulting from the relative inclination thereof, is produced in an opposite direction to the main-scanning direction, the relative inclination of the sub-scanning line is defined as being negative.

When the determiner determines that the relative inclination of the sub-scanning line is positive, the reading-timing of the raster-graphic data from the memory is advanced by a time required to read one-pixel raster-graphic datum from the memory. When the determiner determines that the relative inclination of the sub-scanning line is negative, the reading-timing of the raster-graphic data from the memory is delayed by the time required to read one-pixel raster-graphic datum from the memory. When the determiner determines that the inclination of the sub-scanning line is positive, the shift of the phase of the clock pulses, with the unit of less than $2\pi$, is carried out such that the phase of the clock pulses is advanced. When the determiner determines that the inclination of the sub-scanning line is negative, the shift of the phase of the clock pulses, with the unit of less than $2\pi$, is carried out such that the phase of the clock pulses is delayed.

Preferably, the second controller comprises a clock pulse generator, a switcher and a regulator. The clock pulse generator is for producing at least two series of clock pulses on the basis of a series of basic clock pulses. The respective series of clock pulses have phases which are shifted from each other within a range of $2\pi$. The switcher is for selectively outputting any one of the series of clock pulses from the clock pulse generator. The regulator is for regulating the switcher to output any one of the series of clock pulses therefrom. The output is in either a first clock-pulse-outputting manner, to cause a delay in the phase of the output clock pulses, or a second clock-pulse-outputting manner, to cause an advance in the phase of the output clock pulses.

When the determiner determines that the relative inclination of the sub-scanning line is negative, the regulator regulates the switcher to output any one of the series of clock pulses therefrom in the first clock-pulse-outputting manner. When the determiner determines that the inclination of the sub-scanning line is positive, the regulator regulates the switcher to output any one of the series of clock pulses therefrom in the second clock-pulse-outputting manner.

The laser drawing apparatus may further comprise a detector for detecting the positioning-marks of the workpiece, and a calculator. The calculator is for calculating the inclination data of the axis, defined by the positioning-marks of the workpiece, on the basis of the detection of the positioning-marks by the detector. Preferably, the detector comprises an image sensor and a video signal processor. The image sensor is for optically and electronically sensing the positioning-marks of the workpiece with respect to a coordinate system, defined in a drawing plane of the apparatus. Thus, the image sensor produces video signals carrying the positioning-marks. The video-signal processor is for processing the video signals to obtain the inclination data of the axis defined by the positioning-marks of the workpiece.

In accordance with a seventh aspect of the present invention, there is a laser drawing apparatus for drawing a pattern on a workpiece by scanning the workpiece with at least one laser beam in both a main-scanning direction and in a sub-scanning direction. The laser beam is modulated on the basis of raster-graphic data, read from a memory, in accordance with a series of clock pulses. The scanning of the workpiece with the laser beam, in the main-scanning direction, is carried out by deflecting the laser beam with respect to the workpiece. The scanning of the workpiece with the laser beam, in the sub-scanning direction, is carried out by moving the workpiece with respect to the laser beam. The apparatus comprises a first and second calculator and a first and second controller.

The first calculator is for calculating one-pixel-dot-shift location data, indicating where a main-scan-start position in the main-scanning direction should be shifted by a distance corresponding to one-pixel-dot size, on the basis of previously-measured pixel-dot-disalignment data of pixel-dots included in a sub-scanning line. The sub-scanning line is defined by the movement of the workpiece in the sub-scanning direction. The first controller is for controlling the shift of the main-scan-start position by regulating a reading-timing of the raster-graphic data from the memory, whenever the laser beam reaches each of the one-pixel-dot-shift locations represented by the one-pixel-dot-shift location data during the movement of the workpiece in the sub-scanning direction. Thus, a pixel-dot-misalignment of pixel-dots included in the sub-scanning line can be corrected with a unit of one-pixel-dot size.

The second calculator is for calculating clock-pulse-phase-shift location data, indicating where a phase of the clock pulses should be shifted, with a unit of less than $2\pi$, on the basis of the pixel-dot-misalignment data. The second controller is for controlling outputting of the clock pulses so that the phase of the clock pulses is shifted, with the unit of less than $2\pi$. The shift occurs whenever the laser beam reaches each of the clock-pulse-phase-shift locations, represented by the clock-pulse-phase-shift location data, during the movement of the workpiece in the sub-scanning direction. Thus, the pixel-dot-misalignment can be further finely corrected with a unit of less than one-pixel-dot size.

The apparatus may further comprise a first and second determiner. The first determiner is for determining whether a production of a pixel-dot-misalignment at each of the one-pixel-dot-shift locations is positive or negative. The second determiner is for determining whether a production of a pixel-dot-misalignment at each of the clock-pulse-phase-shift locations is positive or negative.

The pixel-dot-misalignment is defined as being positive when produced at each of the one-pixel-dot-shift locations in the main-scanning direction. The pixel-dot-misalignment is defined as being negative when produced at each of the one-pixel-dot-shift locations in an opposite direction to the main-scanning direction. Also, the pixel-dot-misalignment is defined as being positive when produced at each of the clock-pulse-phase-shift locations in the main-scanning direction. The pixel-dot-misalignment is defined as being negative when produced at each of the clock-pulse-phase-shift locations in an opposite direction to the main-scanning direction.

When the first determiner determines that the pixel-dot-misalignment is positive, the reading-timing of the raster-graphic data from the memory is advanced by a time required to read one-pixel raster-graphic datum from the memory. When determining by the first determiner that the pixel-dot-misalignment is negative, the reading-timing of the raster-graphic data from the memory is delayed by the time required to read one-pixel raster-graphic datum from the memory. When determining by the determiner that the pixel-dot-misalignment is positive, the shift of the phase of the clock pulses, with the unit of less than $2\pi$, is carried out such that the phase of the clock pulses is advanced. When the determiner determines that the pixel-dot-misalignment is negative, the shift of the phase of the clock pulses, with the unit of less than $2\pi$, is carried out such that the phase of the clock pulses is delayed.

Preferably, the second controller comprises a clock, a switcher and a regulator. The clock pulse generator is for producing at least two series of clock pulses on the basis of a series of basic clock pulses. The respective series of clock pulses have phases which are shifted from each other within a range of $2\pi$. The switcher is for selectively outputting any one of the series of clock pulses from the clock pulse generator. The regulator is for regulating the switcher to output any one of the series of clock pulses therefrom. The output is in either a first clock-pulse-outputting manner, to cause a delay in the phase of the outputted clock pulses, or a second clock-pulse-outputting manner, to cause an advance in the phase of the outputted clock pulses.

When the second determiner determines that the pixel-dot-misalignment is negative, the regulator regulates the switcher to output any one of the series of clock pulses in the first clock-pulse-outputting manner. When the determiner determines that the pixel-dot-misalignment is positive, the regulator regulates the switcher to output any one of the series of clock pulses therefrom in the second clock-pulse-outputting manner.

BRIEF DESCRIPTION OF THE DRAWINGS

The objects and other objects of the present invention will be better understood from the following description, with reference to the accompanying drawings in which.

DESCRIPTION OF THE PREFERRED EMBODIMENTS

Figure 1:
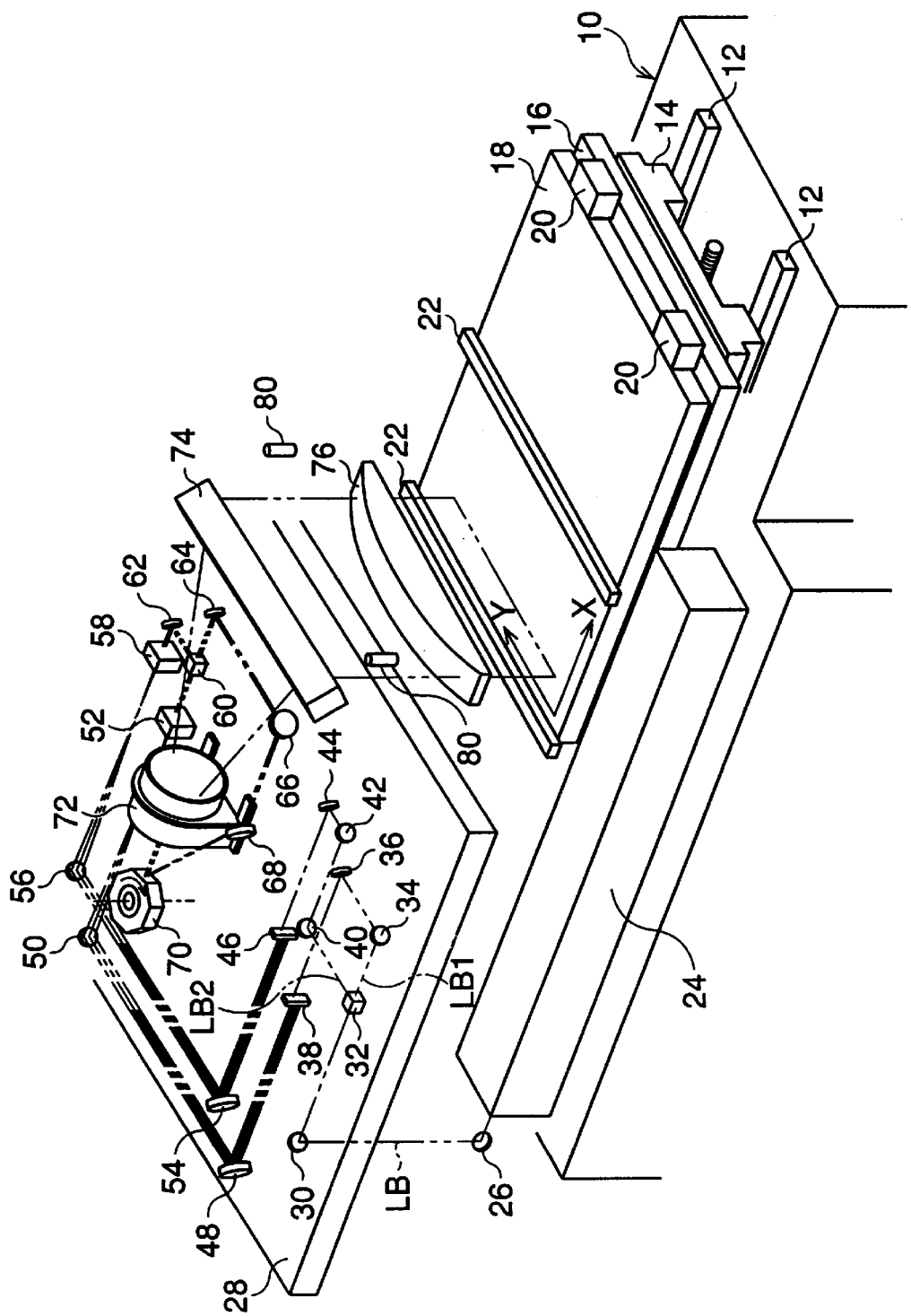
FIG. 1 is a perspective view showing a laser drawing apparatus according to the present invention.

FIG. 1 shows a laser drawing apparatus, which is constituted such that a circuit pattern is directly drawn on a photoresist layer formed on a substrate for producing a printed circuit board. The laser drawing apparatus comprises a base frame 10, comprising a pair of guide rails 12, installed on a floor.

The apparatus also comprises an X-table 14 movably provided on the pair of guide rails 12, a θ-table 16 rotatably provided on the X-table 14, and a drawing table 18 securely mounted on the θ-table 16. The X-table 14 is driven by a suitable drive motor, such as a stepping motor, a servo motor or the like, so as to be moved along the guide rails 12. The θ-table 16 is rotatable around a shaft (not shown) vertically protruding from a center of the X-table 14. Thereby, a rotational position of the θ-table 16, and therefore also the drawing table 18, is minutely adjusted by minute drivers 20 provided on opposite sides of the θ-table 16. Note, in FIG. 1, only two minute drivers 20, provided on one side of the θ-table 16, are illustrated, two further minute drivers, provided on another side of the θ-table 16, are omitted from FIG. 1 to avoid the complication of illustration.

The substrate having the photoresist layer is fed onto the drawing table 18 through a conveyer system, such as a belt conveyer (not shown), and is clamped in place on the surface of the drawing table 18 by a clamper provided on the drawing table 18. Note, in FIG. 1, only a pair of clamping members of the clamper are shown and are designated by reference numeral 22.

Note, as shown in FIG. 1, an X–Y coordinate system is defined on a horizontal plane in which a surface of the drawing table 18 is included, with the X–Y coordinate system being immovable with respect to the base frame 10 of the apparatus. Further, note, for the sake of convenience, a positive direction of the Y-axis is defined as a main-scanning direction, and a negative direction of the X-axis is defined as a sub-scanning direction.

The apparatus further comprises an argon laser generator 24 provided on the base frame 10 and supported by suitable structural elements (not shown). A laser beam LB emitted from the argon laser generator 24 is reflected upward by a beam bender 26. Note, in this embodiment, the argon laser generator 24 is a water-cooled type, having an output power of 1.8 W, with a wavelength of the emitted laser bean being 488 nm.

A beam bender 30 is arranged on the plate-like frame 28, and receives the laser beam LB reflected by the beam bender 26. The laser beam LB, received by the beam bender 30, is then directed to a beam splitter 32 which divides the laser beam LB into two laser beams LB1 and LB2. Beam benders 34 and 36 are arranged on the plate-like frame 28 to direct the laser beam LB1 to a beam separator 38. Likewise, beam benders 40, 42, and 44 are arranged to direct the laser beam LB2 to a beam separator 46.

The beam separator 38 further divides the laser beam LB1 into eight parallel laser beams, and the beam separator 46 further divides the laser beam LB2 into eight parallel laser beams. Beam benders 48 and 50 are arranged on the plate-like frame 28 such that the eight parallel laser beams divided by the beam separator 38 are directed to an electronic shutter 52. Beam benders 54 and 56 are arranged such that the eight parallel laser beams divided by the beam separator 46 are directed to an electric shutter 58.

Each of the electronic shutters 52 and 58 includes eight respective acoustic-optical modulators corresponding to the eight parallel laser beams concerned. The eight respective parallel laser beams passing through the electronic shutter 52 are directed to an optical composer 60, comprising a polarization beam splitter, and the eight respective parallel laser beams passing through the electronic shutter 58 are directed to the optical composer 60 via a beam bender 62. Both the groups of eight parallel laser beams are combined with each other by the optical composer 60, to produce sixteen parallel laser beams.

Beam benders 64, 66 and 68 are arranged on the plate-like frame 28 to direct the sixteen parallel laser beams, emitted from the optical composer 60, to a polygon mirror 70. In this embodiment, the polygon mirror 70 is a hexagonal mirror having six reflecting surfaces formed therearound. The sixteen parallel laser beams, made incident on one of the reflecting surfaces of the polygon mirror 70, are directed to an fθ lens 72. Then, the sixteen parallel laser beams passing through the fθ lens 72 are directed to a turning mirror 74, which turns the laser beams toward the surface of the drawing table 18. Thus, the turned laser beams are projected onto the surface of the drawing table 18 through a condenser lens 76.

During a drawing-operation of the apparatus, the polygon mirror 70 is rotated so that the sixteen parallel laser beams are repeatedly deflected along the main-scanning direction (i.e., the positive direction of the Y-axis). Thus, a workpiece is completely and continuously scanned with the sixteen scanning-laser beams. During the scanning operation, the sixteen respective laser beams are modulated by the sixteen acoustic-optical modulators of the electronic shutters 52 and 58 on the basis of the raster-graphic data in accordance with the series of clock pulses. Thus, the circuit pattern based upon the raster-graphic data can be drawn and recorded on the workpiece. Of course, the drawn circuit pattern is formed by the pixel-dots produced on the basis of the raster-graphic data, and a pitch of the pixel-dots depends upon a frequency of the series of clock pulses.

Figure 2:
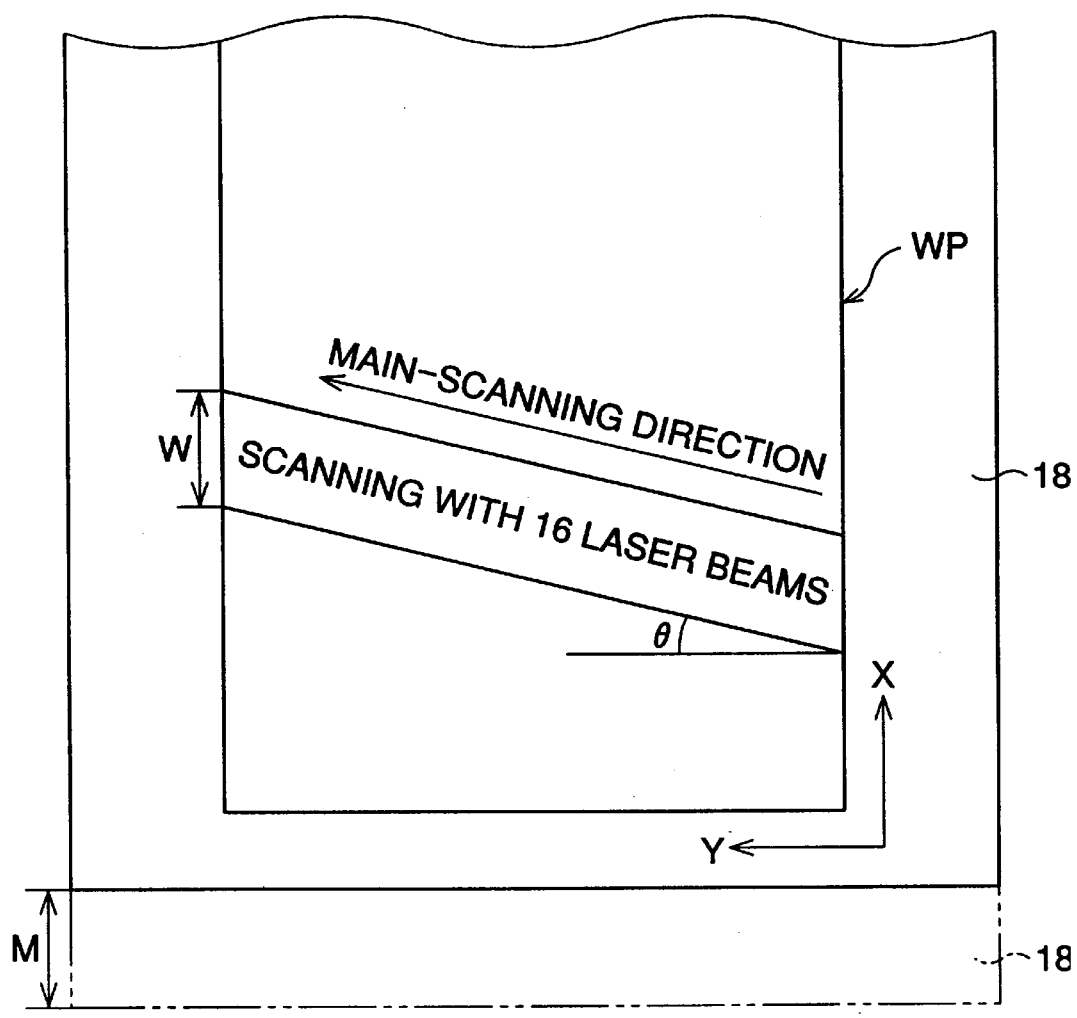
FIG. 2 is a conceptual view showing a manner of scanning a workpiece, using sixteen scanning-laser beams all at once in the laser drawing apparatus of FIG. 1.

Strictly speaking, as shown in FIG. 2, the main-scanning direction of the sixteen laser beams defines an angle of θ with the Y-axis, because the drawing table 18 is moved in the sub-scanning direction (i.e., the negative direction of the X-axis) during the scanning of the workpiece with the sixteen laser beams. In particular, when the scanning of the workpiece with the sixteen laser beams is completed once, the drawing table 18 is moved by a distance M corresponding to a width W of the sixteen laser beams, resulting in the fact that the sixteen laser beams are deflected perpendicularly to the X-axis, along the main-scanning direction. Note, in FIG. 2, the workpiece or substrate placed on the drawing table 18 is indicated by reference WP.

Figure 3:
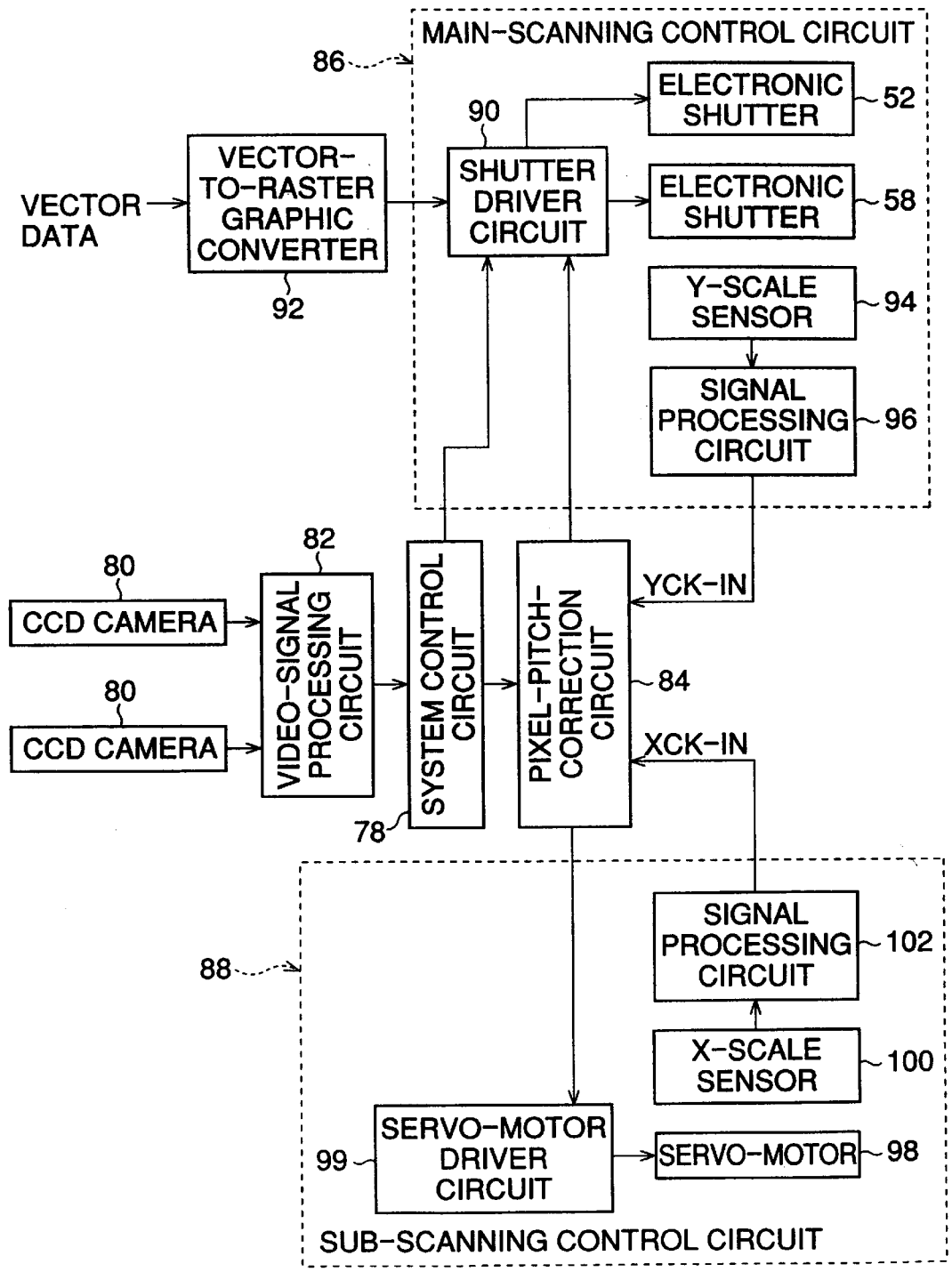
FIG. 3 is a block diagram of a first embodiment of the laser drawing apparatus according to the present invention.

FIG. 3 shows a block diagram of a first embodiment of the laser drawing apparatus according to this invention, in which a pixel-pitch correction for correcting an irregular arrangement of pixel-dots in both the main-scanning direction and the sub-scanning direction is performed with a unit of less than one-pixel size with respect to a pattern to be drawn.

In FIG. 3, reference numeral 78 indicates a system control circuit which may be constituted as a microcomputer comprising a central processing unit (CPU) or processor, a read-only memory (ROM) for storing programs, constants, etc, and a random access memory (RAM) for storing temporary data.

A pair of CCD (charge-coupled device) cameras 80 are connected to the system control circuit 78 through a video-signal processing circuit 82. As shown in FIG. 1, the CCD cameras 80 are disposed above the drawing table 18 beside the ends of the condenser lens 76, and are securely supported by a frame structure (not shown) of the apparatus to be immovable with respect to the X–Y coordinate system.

The CCD cameras 80 are used to detect four positioning marks provided at four corners of the workpiece. Thus, a position of the workpiece placed on the drawing table 18 is precisely determined with respect to the X–Y coordinate system. The positional determination of the workpiece allows the laser drawing apparatus to draw a circuit pattern on the surface of the workpiece at a proper position thereof. Namely, whenever a circuit pattern is drawn on a surface of an individual workpiece with the sixteen scanning-laser beams, scan-start positions in the main-scanning direction and the sub-scanning direction are regulated on the basis of the positional determination of the workpiece. Thus, the circuit pattern can then be drawn on the surface of the workpiece at the proper position.

Figure 4:
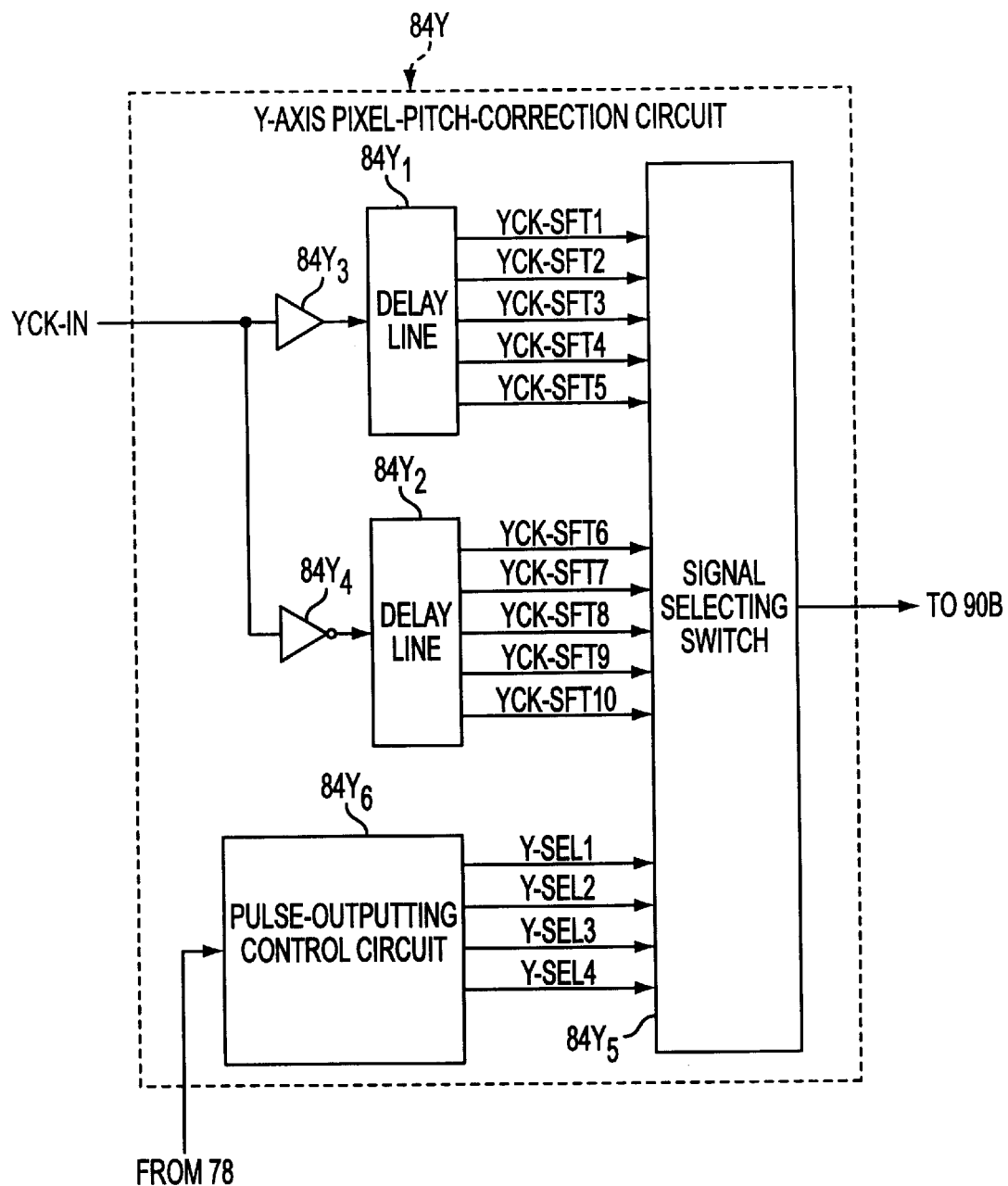
FIG. 4 is a block diagram showing a Y-axis pixel-pitch-correction circuit included in the pixel-pitch-correction circuit shown in FIG. 3.
Figure 5:
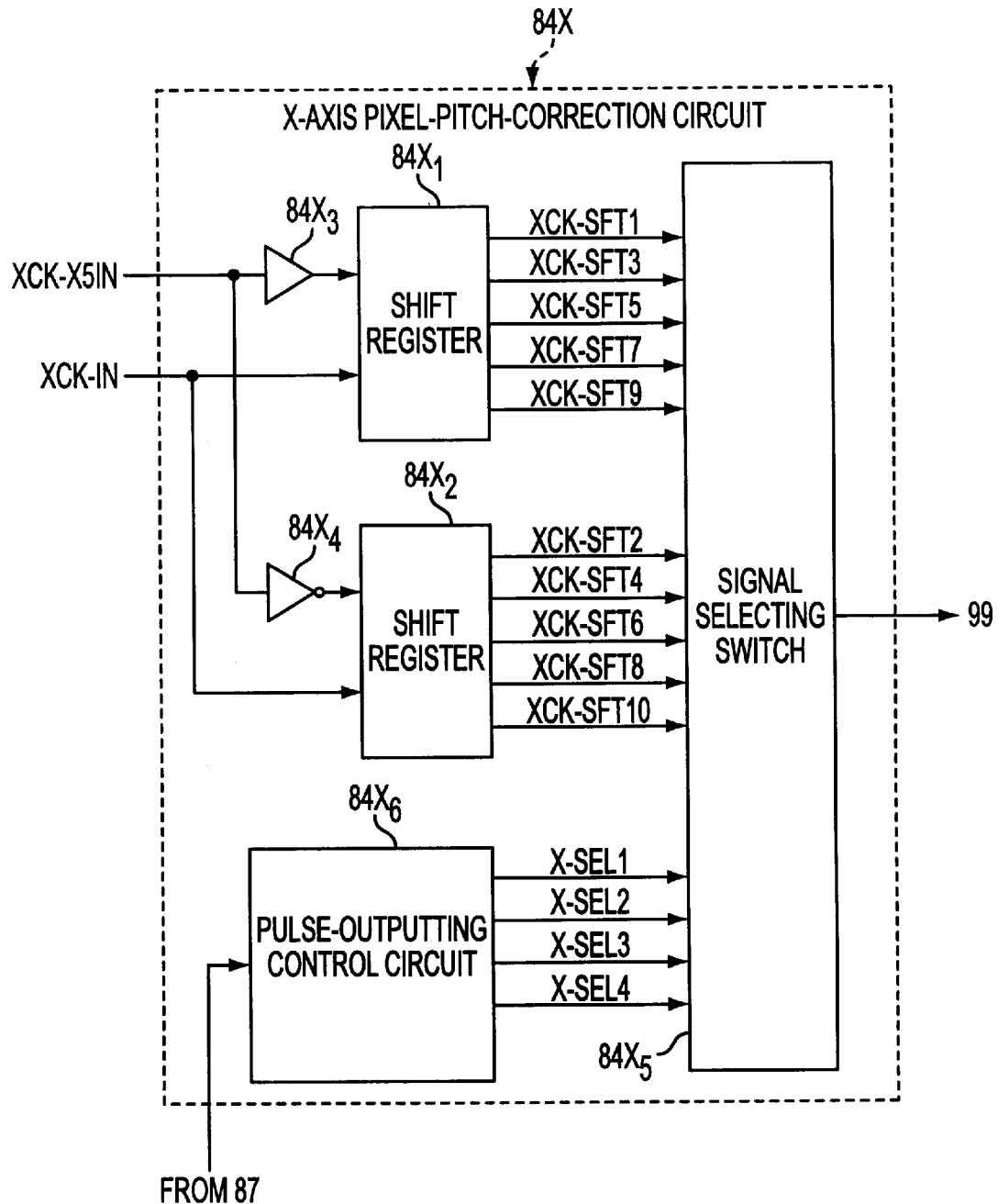
FIG. 5 is a block diagram showing an X-axis pixel-pitch-correction included in the pixel-pitch-correction circuit shown in FIG. 3.

A pixel-pitch-correction circuit 84 is connected to the system control circuit 78, and comprises a Y-axis pixel-pitch-correction circuit 84Y, as shown in FIG. 4, and an X-axis pixel-pitch-correction circuit 84X, as shown in FIG. 5. The Y-axis pixel-pitch-correction circuit 84Y governs a main-scanning control circuit 86, and the X-axis pixel-pitch-correction circuit 84X governs a sub-scanning control circuit 88, as shown in FIG. 3.

As is apparent from FIG. 4, the Y-axis pixel-pitch-correction circuit 84Y includes a first delay line 84Y$_1$, a second delay line 84Y$_2$, a buffer 84Y$_3$, and an inverter 84Y$_4$. A series of basic clock pulses YCK-IN is input simultaneously to the first delay line 84Y$_1$, through the buffer 84Y$_3$, and to the second delay line 84Y$_2$ through the inverter 84Y$_4$. Note, a phase of the basic clock pulses YCK-IN, inverted by the inverter 84Y$_4$ and input to the second delay line 84Y$_2$, is shifted by $\pi$ with respect to a phase of the basic clock pulses YCK-IN input to the first delay line 84Y$_1$.

In the first delay line 84Y$_1$, five series of clock pulses: first clock pulses YCK-SFT1; second clock pulses YCK-SFT2; third clock pulses YCK-SFT3; fourth clock pulses YCK-SFT4; and fifth clock pulses YCK-SFT5, are successively produced on the basis of the basic clock pulses YCK-IN, and are output. Also, in the second delay line 84Y$_2$, five further series of clock pulses: sixth clock pulses YCK-SFT6; seventh clock pulses YCK-SFT7; eighth clock pulses YCK-SFT8; ninth clock pulses YCK-SFT9; and tenth clock pulses YCK-SFT10, are successively produced on the basis of the inverted basic clock pulses YCK-IN, and are output.

Figure 6:
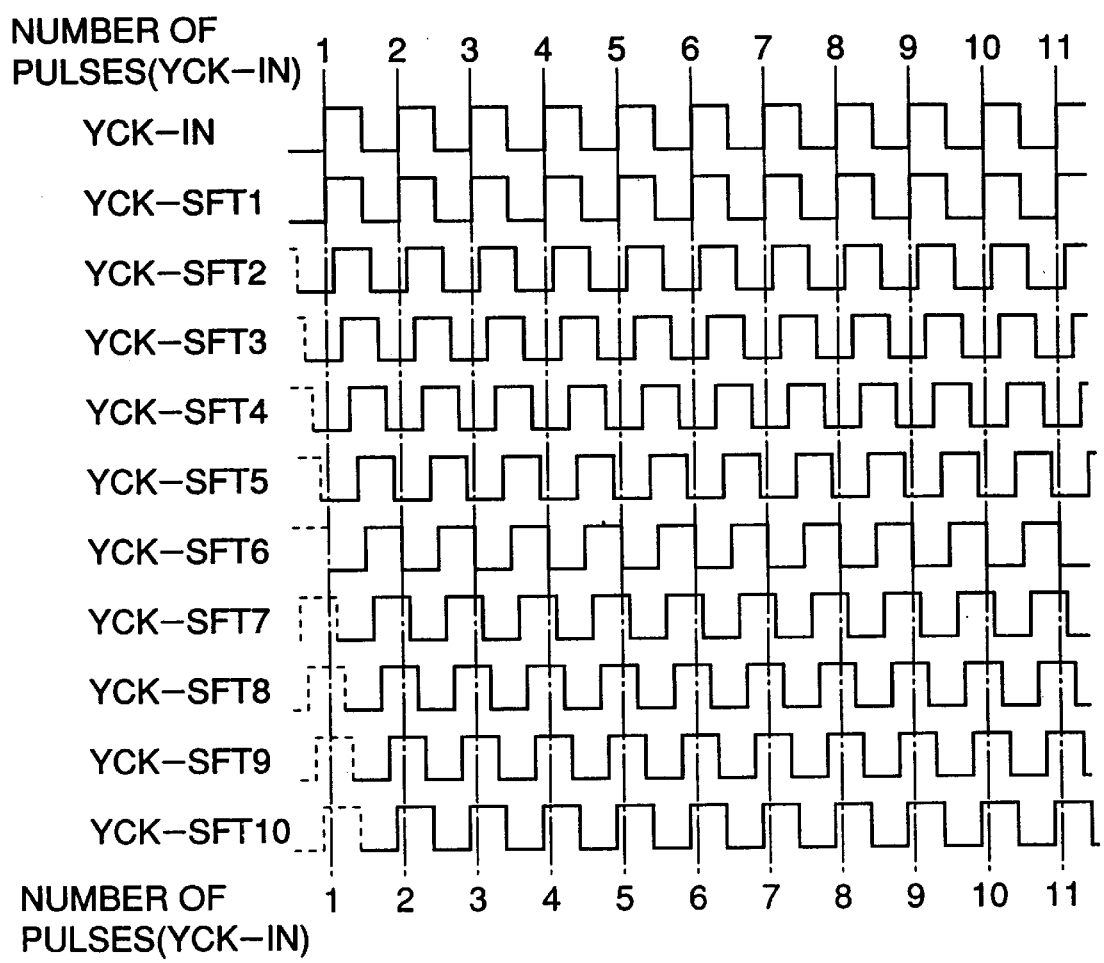
FIG. 6 is a timing-chart showing ten series of clock pulses produced in and output from the Y-axis pixel-pitch-correction circuit of FIG. 4.

As shown in a timing chart of FIG. 6, the first clock pulses YCK-SFT1, output from the first delay line 84Y$_1$, have the same phase as the basic clock pulses YCK-IN. The outputting of the second clock pulses YCK-SFT2, from the first delay line 84Y$_1$, is delayed in such a manner that a phase of the second clock pulses YCK-SFT2 is shifted by $\pi/5$ with respect to the first clock pulses YCK-SFT1. Similarly, the outputting of the consecutive clock pulses YCK-SFT3; YCK-SFT4; and YCK-SFT5, from the first delay line 84Y$_1$, are successively delayed in the same manner as the second clock pulses YCK-SFT2. Thus, a phase of the fifth clock pulses YCK-SFT5 is shifted by $4\pi/5$ with respect to the first clock pulses YCK-SFT1.

As shown in the timing chart of FIG. 6, a phase of the sixth clock pulses YCK-SFT6, output from the second delay line 84Y$_2$, is shifted by $\pi$ with respect to the basic clock pulses YCK-IN. Namely, the sixth clock pulses YCK-SFT6 correspond to the basic clock pulses YCK-IN inverted by the inverter 84Y$_4$. The outputting of the seventh clock pulses YCK-SFT7, from the second delay line 84Y$_2$, is delayed in such a manner that a phase of the seventh clock pulses YCK-SFT7 is shifted by $\pi/5$ with respect to the sixth clock pulses YCK-SFT6. Similarly, the outputting of the consecutive clock pulses YCK-SFT8; YCK-SFT9; and YCK-SFT10, from the second delay line 84Y$_2$, are successively delayed in the same manner as the seventh clock pulses YCK-SFT7. Thus, a phase of the tenth clock pulses YCK-SFT10 is shifted by $9\pi/5$ with respect to the first clock pulses YCK-SFT1. Note, when a phase of the tenth clock pulses YCK-SFT10 is further shifted by $\pi/5$, the shifted phase becomes coincident with that of the first clock pulses YCK-SFT1.

As shown in FIG. 4, the Y-axis pixel-pitch-correction circuit 84Y also includes a multiplexer 84Y$_5$ to which ten output lines, extending from the first and second delay lines 84Y$_1$ and 84Y$_2$, are connected. Namely, the ten series of clock pulses: YCK-SFT1; YCK-SFT2; YCK-SFT3; YCK-SFT4; YCK-SFT5; YCK-SFT6; YCK-SFT7; YCK-SFT8; YCK-SFT9; and YCK-SFT10, are input to the multiplexer 84Y$_5$. Any one of the ten series of clock pulses is selectively output to the main-scanning control circuit 86. The Y-axis pixel-pitch-correction circuit 84Y further includes a pulse-outputting control circuit 84Y$_6$ by which it is determined which series of clock pulses should be output from the multiplexer 84Y$_5$.

In particular, the pulse-outputting control circuit 84Y$_6$ outputs four selection-signals: Y-SEL1; Y-SEL2; Y-SEL3; and Y-SEL4, to the multiplexer 84Y$_5$, and each of these selection-signals is changed from either a low level "L" to a high level "H" or from a high level "H" to a low level "L", under control of the system control circuit 78. By a combination of output-levels "L" and "H" of the selection-signals: Y-SEL1; Y-SEL2; Y-SEL3; and Y-SEL4, it is determined which series of clock pulses: YCK-SFT1; YCK-SFT2; YCK-SFT3; YCK-SFT4; YCK-SFT5; YCK-SFT6; YCK-SFT7; YCK-SFT8; YCK-SFT9; or YCK-SFT10, should be output from the multiplexer 84Y$_5$, as shown in TABLE 1 as follows:

TABLE 1

| SELECTION-SIGNALS | LEVEL | SELECTED CLOCK PULSES | SELECTION-SIGNALS | LEVEL | SELECTED CLOCK PULSE |
|---|---|---|---|---|---|
| Y-SEL1 | H |  | Y-SEL1 | L |  |
| Y-SEL2 | L | YCK-SFT1 | Y-SEL2 | H | YCK-SFT6 |
| Y-SEL3 | L |  | Y-SEL3 | H |  |
| Y-SEL4 | L |  | Y-SEL4 | L |  |
| Y-SEL1 | L |  | Y-SEL1 | H |  |
| Y-SEL2 | H | YCK-SFT2 | Y-SEL2 | H | YCK-SFT7 |
| Y-SEL3 | L |  | Y-SEL3 | H |  |
| Y-SEL4 | L |  | Y-SEL4 | L |  |
| Y-SEL1 | H |  | Y-SEL1 | L |  |
| Y-SEL2 | H | YCK-SFT3 | Y-SEL2 | L | YCK-SFT8 |
| Y-SEL3 | L |  | Y-SEL3 | L |  |
| Y-SEL4 | L |  | Y-SEL4 | H |  |
| Y-SEL1 | L |  | Y-SEL1 | H |  |
| Y-SEL2 | L | YCK-SFT4 | Y-SEL2 | L | YCK-SFT9 |
| Y-SEL3 | H |  | Y-SEL3 | L |  |
| Y-SEL4 | L |  | Y-SEL4 | H |  |
| Y-SEL1 | H |  | Y-SEL1 | L |  |
| Y-SEL2 | L | YCK-SFT5 | Y-SEL2 | H | YCK-SFT10 |
| Y-SEL3 | H |  | Y-SEL3 | L |  |
| Y-SEL4 | L |  | Y-SEL4 | H |  |

As is apparent from TABLE 1, for example, when the output-level of the selection-signals Y-SEL1 and Y-SEL2 are of a high level "H", and when the output-level of the selection-signals Y-SEL3 and Y-SEL4 are of a low level "L", the third clock pulses YCK-SFT3 are output from the multiplexer 84Y$_5$. Also, when the output-level of the selection-signals Y-SEL1 and Y-SEL4 are of a high level "H", and when the output-level of the selection-signals Y-SEL2 and Y-SEL3 are of a low level "L", the ninth clock pulses YCK-SFT9 are output from the multiplexer 84Y$_5$.

As shown in FIG. 5, the X-axis pixel-pitch-correction circuit 84X includes a first shift register 84X$_1$, a second shift register 84X$_2$, a buffer 84X$_3$, and an inverter 84X$_4$. A series of basic clock pulses XCK-IN is input to the first and second shift registers 84X$_1$ and 84X$_2$. Further, a series of clock pulses XCK-5IN is input simultaneously to the first shift register 84X$_1$, through the buffer 84X$_3$, and to the second shift register 84X$_2$, through the inverter 84X$_4$.

Figure 7:
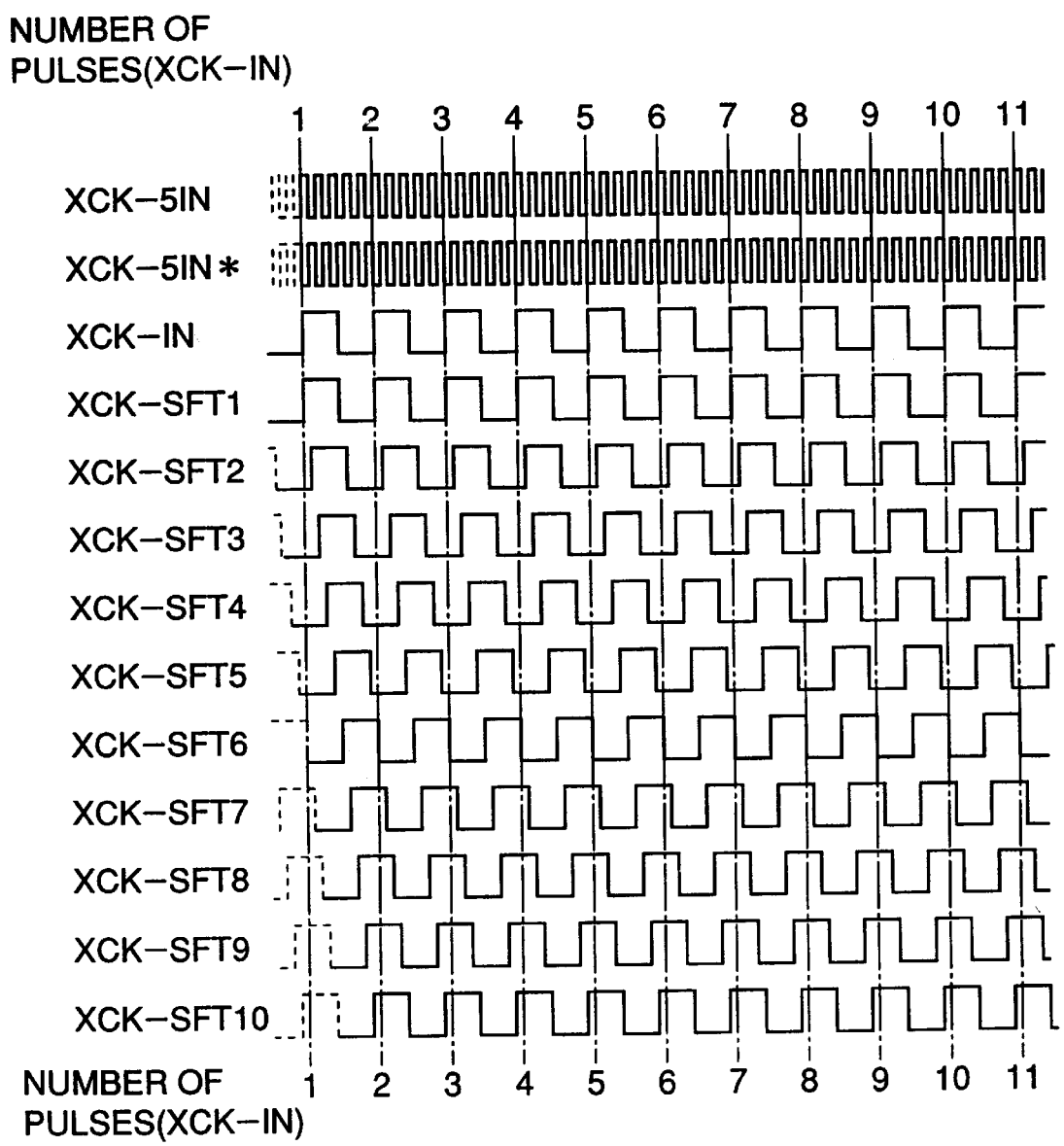
FIG. 7 is a timing-chart showing ten series of clock pulses produced in and output from the X-axis pixel-pitch-correction circuit of FIG. 5.

As shown in a timing chart of FIG. 7, the clock pulses XCK-5IN have a frequency which is five times the frequency of the basic clock pulses XCK-IN. In this timing chart, a series of clock pulses XCK-5IN* corresponds to the series of clock pulses XCK-5IN which has been inverted by the inverter $84X_4$, and then input to the second shift register $84X_2$.

In the first shift register $84X_1$, a first series of clock pulses XCK-SFT1 is produced on the basis of both the basic clock pulses XCK-IN and the clock pulses XCK-5IN, and is output therefrom. As is apparent from the timing chart of FIG. 7, the first clock pulses XCK-SFT1, output from the first shift register $84X_1$, have the same phase as the basic clock pulses XCK-IN.

In the second shift register $84X_2$, a second series of clock pulses XCK-SFT2 is produced, on the basis of both the basic clock pulses XCK-IN and the clock pulses XCK-5IN*, and is output therefrom. As shown in the timing chart of FIG. 7, the outputting of the second clock pulses XCK-SFT2, from the second shift register $84X_2$, is delayed in such a manner that a phase of the second clock pulses XCK-SFT2 is shifted by $\pi/5$ with respect to that of the first clock pulses XCK-SFT1.

In the first shift register $84X_1$, a third series of clock pulses XCK-SFT3 is produced, on the basis of both the first clock pulses XCK-SFT1 and the clock pulses XCK-5IN, and is output therefrom. As shown in the timing chart of FIG. 7, the outputting of the third clock pulses XCK-SFT3, from the first shift register $84X_1$, is delayed in such a manner that a phase of the third clock pulses XCK-SFT3 is shifted by $\pi/5$ with respect to that of the second clock pulses XCK-SFT2.

In the second shift register $84X_2$, a fourth series of clock pulses XCK-SFT4 is produced, on the basis of both the second clock pulses XCK-SFT2 and the clock pulses XCK-5IN*, and is output therefrom. As shown in the timing chart of FIG. 7, the outputting of the forth clock pulses XCK-SFT4, from the second shift register $84X_2$, is delayed in such a manner that a phase of the fourth clock pulses XCK-SFT4 is shifted by $\pi/5$ with respect to that of the third clock pulses XCK-SFT3.

In the first shift register $84X_1$, a fifth series of clock pulses XCK-SFT5 is produced, on the basis of both the third clock pulses XCK-SFT3 and the clock pulses XCK-5IN, and is output therefrom. As shown in the timing chart of FIG. 7, the outputting of the fifth clock pulses XCK-SFT5, from the first shift register $84X_1$, is delayed in such a manner that a phase of the fifth clock pulses XCK-SFT3 is shifted by $\pi/5$ with respect to that of the fourth clock pulses XCK-SFT4.

In the second shift register $84X_2$, a sixth series of clock pulses XCK-SFT6 is produced, on the basis of both the fourth clock pulses XCK-SFT4 and the clock pulses XCK-5IN*, and is output therefrom. As shown in the timing chart of FIG. 7, the outputting of the sixth clock pulses XCK-SFT6, from the second shift register $84X_2$, is delayed in such a manner that a phase of the sixth clock pulses XCK-SFT6 is shifted by $\pi/5$ with respect to that of the fifth clock pulses XCK-SFT5.

In the first shift register $84X_1$, a seventh series of clock pulses XCK-SFT7 is produced, on the basis of both the fifth clock pulses XCK-SFT5 and the clock pulses XCK-5IN, and is output therefrom. As shown in the timing chart of FIG. 7, the outputting of the seventh clock pulses XCK-SFT7, from the first shift register $84X_1$, is delayed in such a manner that a phase of the seventh clock pulses XCK-SFT7 is shifted by $\pi/5$ with respect to that of the sixth clock pulses XCK-SFT6.

In the second shift register $84X_2$, an eighth series of clock pulses XCK-SFT8 is produced, on the basis of both the sixth clock pulses XCK-SFT6 and the clock pulses XCK-5IN*, and is output therefrom. As shown in the timing chart of FIG. 7, the outputting of the eighth clock pulses XCK-SFT8, from the second shift register $84X_2$, is delayed in such a manner that a phase of the eighth clock pulses XCK-SFT8 is shifted by $\pi/5$ with respect to that of the seventh clock pulses XCK-SFT7.

In the first shift register $84X_1$, a ninth series of clock pulses XCK-SFT9 is produced, on the basis of both the seventh clock pulses XCK-SFT7 and the clock pulses XCK-5IN, and is output therefrom. As shown in the timing chart of FIG. 7, the outputting of the ninth clock pulses XCK-SFT9, from the first shift register $84X_1$, is delayed in such a manner that a phase of the ninth clock pulses XCK-SFT9 is shifted by $\pi/5$ with respect to that of the eighth clock pulses XCK-SFT8.

In the second shift register $84X_2$, a tenth series of clock pulses XCK-SFT10 is produced, on the basis of both the eighth clock pulses XCK-SFT8 and the clock pulses XCK-5IN*, and is output therefrom. As shown in the timing chart of FIG. 7, the outputting of the tenth clock pulses XCK-SFT10, from the second shift register $84X_2$, is delayed in such a manner that a phase of the tenth clock pulses XCK-SFT10 is shifted by $\pi/5$ with respect to that of the ninth clock pulses XCK-SFT10.

As is apparent from the timing chart of FIG. 7, a phase of the tenth clock pulses XCK-SFT10 is shifted by $9\pi/5$ with respect to the first clock pulses XCK-SFT1. Accordingly, when a phase of the tenth clock pulses XCK-SFT10 is further shifted by $\pi/5$, the shifted phase becomes coincident with that of the first clock pulses XCK-SFT1.

As shown in FIG. 5, the X-axis pixel-pitch-correction circuit 84X also includes a multiplexer $84X_5$ to which ten output lines, extended from the first and second shift registers $84X_1$ and $84X_2$, are connected. Namely, the ten series of clock pulses: XCK-SFT1; XCK-SFT2; XCK-SFT3; XCK-SFT4; XCK-SFT5; XCK-SFT6; XCK-SFT7; XCK-SFT8; XCK-SFT9; and XCK-SFT10, are input to the multiplexer $84X_5$, and any one of the ten series of clock pulses is selectively output to the sub-scanning control circuit 88. The X-axis pixel-pitch-correction circuit 84X further includes a pulse-outputting control circuit $84X_6$ by which it is determined which series of clock pulses should be output from the multiplexer $84X_5$.

In particular, the pulse-outputting control circuit $84X_6$ outputs four selection-signals: X-SEL1; X-SEL2; X-SEL3; and X-SEL4, to the multiplexer $84X_6$. Each of these selection-signals is changed from either a low level "L" to a high level "H" or from a high level "H" to a low level "L", under control of the system control circuit 78. By a combination of output-levels "L" and "H" of the selection-signals: X-SEL1; X-SEL2; X-SEL3; and X-SEL4, it is determined which series of clock pulses: XCK-SFT1; XCK-SFT2; XCK-SFT3; XCK-SFT4; XCK-SFT5; XCK-SFT6; XCK-SFT7; XCK-SFT8; XCK-SFT9; or XCK-SFT10, should be output from the multiplexer $84X_5$, as shown in TABLE 2 as follows:

TABLE 2

| SELEC-TION-SIGNALS | LEVEL | SELECTED CLOCK PULSES | SELEC-TION-SIGNALS | LEVEL | SELECTED CLOCK PULSE |
|---|---|---|---|---|---|
| X-SEL1 | H | | X-SEL1 | L | |
| X-SEL2 | L | XCK-SFT1 | X-SEL2 | H | XCK-SFT6 |

TABLE 2-continued

| SELECTION-SIGNALS | LEVEL | SELECTED CLOCK PULSES | SELECTION-SIGNALS | LEVEL | SELECTED CLOCK PULSE |
|---|---|---|---|---|---|
| X-SEL3 | L | | X-SEL3 | H | |
| X-SEL4 | L | | X-SEL4 | L | |
| X-SEL1 | L | | X-SEL1 | H | |
| X-SEL2 | H | XCK-SFT2 | X-SEL2 | H | XCK-SFT7 |
| X-SEL3 | L | | X-SEL3 | H | |
| X-SEL4 | L | | X-SEL4 | L | |
| X-SEL1 | H | | X-SEL1 | L | |
| X-SEL2 | H | XCK-SFT3 | X-SEL2 | L | XCK-SFT8 |
| X-SEL3 | L | | X-SEL3 | L | |
| X-SEL4 | L | | X-SEL4 | H | |
| X-SEL1 | L | | X-SEL1 | H | |
| X-SEL2 | L | XCK-SFT4 | X-SEL2 | L | XCK-SFT9 |
| X-SEL3 | H | | X-SEL3 | L | |
| X-SEL4 | L | | X-SEL4 | H | |
| X-SEL1 | H | | X-SEL1 | L | |
| X-SBL2 | L | XCK-SFT5 | X-SEL2 | H | XCK-SFT1O |
| X-SEL3 | H | | X-SEL3 | L | |
| X-SEL4 | L | | X-SEL4 | H | |

As is apparent from TABLE 2, for example, when the output-level of the selection-signals X-SEL1 and X-SEL3 are of a high level "H", and when the output-level of the selection-signals X-SEL2 and X-SEL4 are of a low level "L", the fifth clock pulses XCK-SFT5 are output from the multiplexer $84X_5$. Also, when the output-level of the selection-signals X-SEL2 and X-SEL3 are of a high level "H", and when the output-level of the selection-signals X-SEL1 and X-SEL4 are of a low level "L", the sixth clock pulses XCK-SFT6 are output from the multiplexer $84X_5$.

Figure 8:
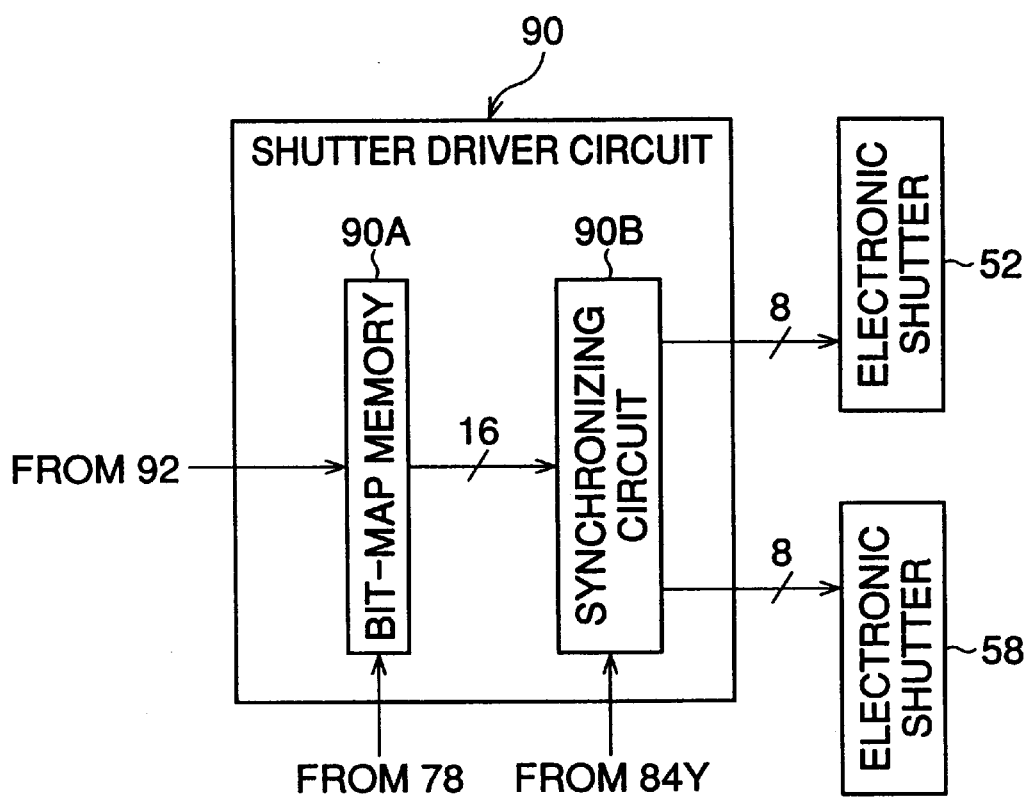
FIG. 8 is a block diagram of the electronic-shutter driver circuit shown in FIG. 3.

Referring again to FIG. 3, the main-scanning control circuit 86 is provided with a shutter driver circuit 90 for driving the electronic shutters 52 and 58. As shown in FIG. 8, the shutter driver circuit 90 includes a pattern memory or bit-map memory 90A connected to a vector-to-raster graphic converter 92 (FIG. 3). A synchronizing circuit 90B is connected to the bit-map memory 90A at an input side thereof, and is connected to the electronic shutters 52 and 58 at an output side thereof.

Although not illustrated in FIG. 3, the vector-to-raster graphic converter 92 is connected to an engineering work station (EWS) through a local area network (LAN), so that the EWS can feed vector-graphic data to the vector-to-raster graphic converter 92. The vector-graphic data is converted into raster-graphic data by the vector-to-raster graphic converter 92 under control of the system control circuit 78. The converted raster-graphic data is developed and stored in the bit-map memory 90A.

The bit-map memory 90A has a capacity for temporarily storing more than 16 main-scanning-lines of raster-graphic pixel data. The 16-bit raster-graphic pixel data included in the sixteen consecutive main-scanning-lines, are successively read from the bit-map memory 90A in accordance with a series of clock pulses output from the system control circuit 78 to the bit-map memory 90A. The 16-bit raster-graphic pixel data read from the bit-map memory 90A is input to the synchronizing circuit 90B.

On the other hand, the synchronizing circuit 90B is arranged to output sixteen respective driving-signals to the sixteen acoustic-optical modulators of the electronic shutters 52 and 58, on the basis of the 16-bit raster-graphic pixel data, in accordance with any one of the ten series of clock pulses (YCK-SFT1; . . . and YCK-SFT10) output from the Y-axis pixel-pitch-correction circuit 84Y to the synchronizing circuit 90B. Namely, a pitch of pixel-dots to be recorded along a main-scanning-line is defined by a frequency of the clock pulses concerned (YCK-SFT1; . . . YCK-SFT10). Also, the output-timing of the sixteen driving-signals to the electronic shutters 52 and 58 can be regulated by successively switching the outputting of the ten series of clock pulses (YCK-SFT1; . . . ; and YCK-SFT10).

For example, when the outputting of the ten series of clock pulses (YCK-SFT1; . . . and YCK-SFT10) is switched over such that a phase of the clock pulses is delayed by $\pi/5$, the output-timing of the sixteen driving signals to the electronic shutters 52 and 58 is also delayed by a period of time corresponding to the phase-discrepancy of $\pi/5$. In this case, the pixel-dot, which is recorded just after the switching-over of the outputting of the clock pulses, is shifted away by one-tenth of one-pixel-dot size so as to be spaced further from the pixel-dot which has just been recorded before the switching-over of the outputting of the clock pulses.

On the contrary, when the outputting of the ten series of clock pulses (YCK-SFT1; . . . and YCK-SFT10) is switched over, such that a phase of the clock pulses is advanced by $\pi/5$, the output-timing of the sixteen driving signals to the electronic shutters 52 and 58 is also advanced by a period of time corresponding to the phase-discrepancy of $\pi/5$. In this case, the pixel-dot, which is recorded just after the switching-over of the outputting of the clock pulses, is shifted nearer by one-tenth of one-pixel-dot size to be closer to the pixel-dot which has just been recorded before the switching-over of the outputting of the clock pulses.

The main-scanning control circuit 86 is further provided with a Y-scale sensor 94, and a signal processing circuit 96 connected thereto. The Y-scale sensor 94 forms a part of a Y-scale detection system incorporated in the laser drawing apparatus, as shown in FIG. 1, and the Y-scale detection system per se is well known in this field. The Y-scale detection system includes a Y-linear scale (not shown) arranged along the Y-axis. The Y-linear scale has the divisions which represent a distance along which the sixteen scanning-laser beams are deflected during the scanning of the workpiece with the sixteen scanning-laser beams.

In short, the Y-scale sensor 94 is associated with the Y-linear scale to detect the distance along which the sixteen scanning-laser beams are deflected during the scanning of the workpiece with the sixteen scanning-laser beams. A series of signals, detected by the Y-scale sensor 94, is derived from the divisions of the Y-linear scale and is input to the signal processing circuit 96, in which the detected signals are processed to produce a series of clock pulses. The produced clock signals are outputted as the basic clock pulses YCK-IN from the signal processing circuit 96 to the Y-axis pixel-pitch-correction circuit 84Y (FIGS. 3 and 4).

The sub-scanning control circuit 88 is provided with a servo-motor 98 for driving the X-table 14 along the X-axis of the X–Y coordinate system, and a servo-motor driver circuit 99, connected to the servo-motor 98, for outputting a series of drive pulses thereto. During the scanning operation, per every one pulse of the drive pulses, the X-table 14 (i.e., the workpiece placed on the drawing table 18) is moved by a distance corresponding to a one-pixel-dot size of a pattern to be drawn.

The outputting of the drive pulses from the servo-motor driver circuit 99 to the servo-motor 98, is carried out in accordance with any one of the ten series of clock pulses (XCK-SFT1; . . . and XCK-SFT10) output from the X-axis pixel-pitch-correction circuit 84X to the servo-motor driver circuit 99. Namely, a pitch of pixel-dots to be recorded along a sub-scanning-line is defined by a frequency of the clock pulses concerned (XCK-SFT1; . . . XCK-SFT10). Also, the output-timing of the drive pulses to the servo-motor 98 can be regulated by successively switching over the outputting of the ten series of clock pulses (XCK-SFT1; . . . and XCK-SFT10).

For example, when the outputting of the ten series of clock pulses (XCK-SFT1; . . . and XCK-SFT10) is switched over such that a phase of the clock pulses is delayed by $\pi/5$, the output-timing of the drive pulses to the servo-motor 98 is also delayed by a period of time corresponding to the phase-discrepancy of $\pi/5$. In this case, the pixel-dot, which is recorded just after the switching-over of the outputting of the clock pulses, is shifted by one-tenth of one-pixel-dot size to be closer to the pixel-dot which has just been recorded before the switching-over of the outputting of the clock pulses. The shift occurs because the drawing table 18 is moved in the negative direction of the X-axis during the scanning operation.

On the contrary, when the outputting of the ten series of clock pulses (XCK-SFT1; . . . and XCK-SFT10) is switched over such that a phase of the clock pulses is advanced by $\pi/5$, the output-timing of the drive pulses to the servo-motor 98 is also advanced by a period of time corresponding to the phase-discrepancy of $\pi/5$. In this case, the pixel-dot, which is recorded just after the switching-over of the outputting of the clock pulses, is shifted by one-tenth of one-pixel-dot size to be spaced further from the pixel-dot which has just been recorded before the switching-over of the outputting of the clock pulses.

The sub-scanning control circuit 88 is further provided with an X-scale sensor 100, and a signal processing circuit 102 connected thereto. The X-scale sensor 100 forms a part of an X-scale detection system incorporated in the laser drawing apparatus shown in FIG. 1. The X-scale detection system per se is well known in this field. The X-scale detection system includes an X-linear scale (not shown) arranged along the X-axis. The X-linear scale has the divisions which represent a distance, along which the drawing table 18 is moved, during the scanning of the workpiece with the sixteen scanning-laser beams.

In short, the X-scale sensor 100 is associated with the X-linear scale to detect the distance along which the drawing table 18 is moved during the scanning of the workpiece with the sixteen scanning-laser beams. A series of signals, detected by the X-scale sensor 100, is derived from the divisions of the X-linear scale and is input to the signal processing circuit 102, in which the detected signals are processed to produce a series of clock pulses. The produced clock signals are output as the basic clock pulses XCK-IN from the signal processing circuit 102 to the X-axis pixel-pitch-correction circuit 84X (FIGS. 3 and 5). Note, the series of clock pulses XCK-5IN are output from the system control circuit 78 to the X-axis pixel-pitch-correction circuit 84X.

A principle of the pixel-pitch-correction according to this invention will now be explained below.

Figure 9:
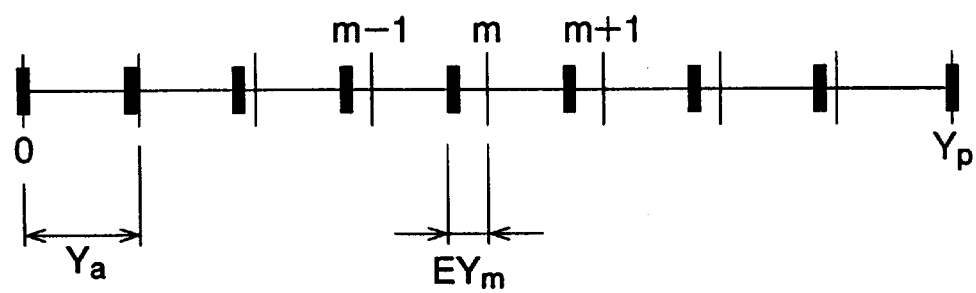
FIG. 9 is a conceptual view showing pixel-dot-pitch discrepancies produced in a main-scanning-range.
Figure 10:
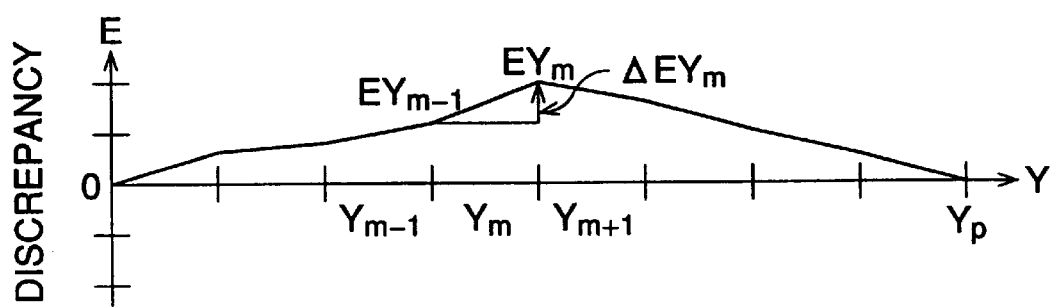
FIG. 10 is a graph representing the pixel-dot-pitch discrepancies shown in FIG. 9.
Figure 11:
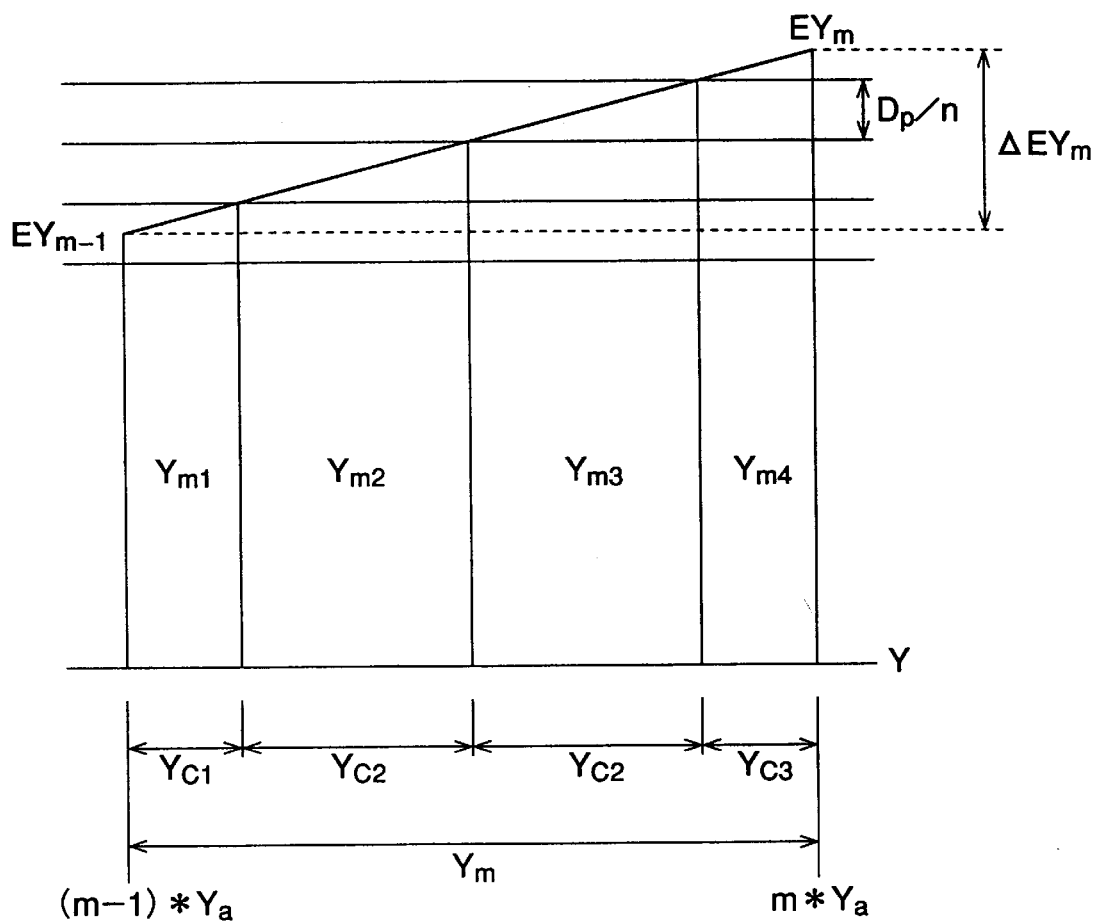
FIG. 11 is a conceptual view explaining a principle of a Y-axis pixel-pitch correction according to the present invention, for correcting the pixel-dot-pitch discrepancies in the main-scanning range, as shown in FIGS. 9 and 10.

First, with reference to FIGS. 9 to 11, a principle of a Y-axis pixel-pitch correction is described.

FIG. 9 conceptually shows a main-scanning-range as a line segment, which is scanned in the main-scanning direction with one of the sixteen laser beams. In this drawing, a distance of the main-scanning-range is indicated by reference $Y_p$. Namely, "0" indicates a scan-start position of the main-scanning-range, and "$Y_p$" indicates a scan-end position of the main-scanning-range.

If one-pixel-dot size is indicated by reference $D_p$, a number of pixel-dots, which are arranged along each main-scanning-line of the main-scanning-range, is represented by $Y_p/D_p$. For example, if the distance of the main-scanning-range is 400 mm and if one-pixel-dot size is 5 μm, a number of 80,000 pixel-dots, arranged along each main-scanning-line of the main-scanning-range of 400 mm, is derived. In this case, the arrangement of the 80,000 pixel-dots along the main-scanning-range of 400 mm cannot be uniform, due to an assembly error produced during manufacture of the laser drawing apparatus, as mentioned previously.

The main-scanning-range, having the distance of $Y_p$, is equally divided into a suitable integer number of sections $\underline{a}$, each section having a distance of $Y_a$. In the above-mentioned example, if $\underline{a}=8$, the main-scanning-range of 400 mm is divided into eight sections. In this case, each of the sections has a distance of $Y_a=50$ mm, and includes 10,000 pixel-dots. The Y-axis pixel-dot correction is introduced into each of the sections, as stated hereinafter in detail.

In FIG. 9, boundaries of the sections having the distance of $Y_a$ are indicated by thin bars, and are represented by ordering numbers . . . , m−1, , m, m+1 . . . . Also, each of the thick solid bars represents locations of specific pixel-dots. Each of the specific pixel-dots should be inherently positioned on a given boundary of the sections. But, in reality, the specific pixel-dots are shifted from the given boundary of the sections due to the assembly error produced during manufacture of the laser drawing apparatus. In FIG. 9, a difference between the boundary represented by the ordering number $\underline{m}$ and the specific pixel-dot to be inherently positioned thereon is indicated as a pitch-discrepancy $Ey_m$. In short, although the pixel-dots between the two adjacent thick solid bars should be uniformly arranged in the corresponding section, in reality, an irregularity of the arrangement of the pixel-dots is produced, as shown in FIG. 9.

FIG. 10 shows a graph in which the pitch-discrepancies $EY_m$ as defined above are represented. Note, in this graph, the origin "0" is the scan-start position of the scanning-range; the abscissa represents a distance which is measured from the scan-start position along the distance of the scanning-range; and the ordinate represents a degree of the pitch-discrepancies $EY_m$. Also, note, the respective sections are indicated by references . . . , $Y_{m-1}$, $Y_m$, $Y_{m+1}$ . . . .

As shown in the graph of FIG. 10, an arrangement of pixel-dots included in the section $Y_m$ has a relative pitch-discrepancy $\Delta EY_m$ as defined by the following formula:

$$\Delta EY_m = EY_m - EY_{m-1}$$

In this case, when the relative pitch-discrepancy is positive (i.e., $\Delta EY_m > 0$), the arrangement of the pixel-dots to be included in the section $Y_m$ is contracted, i.e., the pixel-dots are closer to each other. On the other hand, when the relative pitch-discrepancy is negative (i.e., $\Delta EY_m < 0$), the arrangement of the pixel-dots to be included in the section $Y_m$ is expanded, i.e., the pixel-dots are spaced further away from each other.

Note, the positive/negative data of the relative pitch-discrepancy $\Delta EY_m$ are preferably stored in a non-volatile memory, such as an electrically erasable read only memory (EEROM), provided in the system control circuit 78. Of course, the positive/negative data of the relative pitch-discrepancy $\Delta EY_m$ may be stored in the ROM of the system control circuit 78, if necessary.

Also, in the case of FIG. 10, the arrangement of pixel-dots included in the section $Y_m$ exhibits a degree of pixel-dot discrepancy ($\Delta SY_m$) as defined by the following formula:

$$\Delta SY_m = \Delta EY_m / Y_a$$

According to the present invention, the Y-axis pixel-pitch correction is performed with a unit of less than the one-pixel-dot size $D_p/n$. Accordingly, the Y-axis pixel-pitch correction is introduced into the sections ( . . . , $Y_{m-1}$, $Y_m$, $Y_{m+1}$ . . . ) which have a relative pitch-discrepancy of more than $D_p/n$. For this reason, the relative pitch-discrepancies ( . . . , $\Delta EY_{m-1}$, $\Delta EY_m$, $\Delta EY_{m+1}$ . . . ) of the sections ( . . . , $Y_{m-1}$, $Y_m$, $Y_{m+1}$ . . . ) are gauged with the unit of $D_p/n$, and each of the sections ( . . . , $Y_{m-1}$, $Y_m$, $Y_{m+1}$ . . . ) is further divided into sub-sections on the basis of the gauging of the relative pitch-discrepancies with the unit of $D_p/n$.

For example, as shown in FIG. 11, the section $Y_m$ is divided into four sub-sections $Y_{m1}$, $Y_{m2}$, $Y_{m3}$ and $Y_{m4}$, on the basis of the gauging of the relative pitch-discrepancy $\Delta EY_m$ with the unit of $D_p/n$. In this case, the sub-section $Y_{m1}$ has a distance $Y_{c1}$; each of the sub-sections $Y_{m2}$ and $Y_{m3}$ has a distance $Y_{c2}$; and the sub-section $Y_{m4}$ has a distance $Y_{c3}$. The respective distances $Y_{c1}$, $Y_{c2}$ and $Y_{c3}$ of the sub-sections are defined by the following formulas:

$$Y_{c1} = (D_p/n - mod[EY_{m-1}*n/D_p])/\Delta SY_m$$

$$Y_{c2} = D_p/n * \Delta SY_m$$

$$Y_{c3} = mod[EY_m*n/D_p]/\Delta SY_m$$

Herein, "*" represents a multiplication, and "mod[ . . . ]" represents the surplus of the bracketed division.

As is apparent from FIG. 11, the sub-sections $Y_{m1}$, $Y_{m2}$ and $Y_{m3}$ exhibit a pixel-discrepancy corresponding to $D_p/n$, but the sub-section $Y_{m4}$ exhibits a pixel-discrepancy of less than $D_p/n$. Accordingly, the Y-axis pixel-pitch correction is executed in each of the sub-sections $Y_{m1}$, $Y_{m2}$ and $Y_{m3}$, but the Y-axis pixel-pitch correction is not executed in the sub-section $Y_{m4}$.

The execution of the Y-axis pixel-pitch correction is effected by switching over the outputting of the series of clock pulses (YCK-SFT1; . . . ; and YCK-SFT10) from the Y-axis pixel-pitch-correction circuit 84Y to the synchronizing circuit 90B whenever a scanning-laser beam reaches a trailing end of each of the sub-sections $Y_{m1}$, $Y_{m2}$ and $Y_{m3}$.

Of course, when the relative pitch-discrepancy $\Delta EY_m$ is positive, i.e., when the arrangement of the pixel-dots included in the section $Y_m$ are subjected to a contraction, the outputting of the series of clock pulses (YCK-SFT1; . . . and YCK-SFT10) is switched over such that the phase of the clock pulses is delayed by $\pi/5$. On the other hand, when the relative pitch-discrepancy $\Delta EY_m$ is negative, i.e., when the arrangement of pixel-dots included in the section $Y_m$ is subjected to an expansion, the outputting of the series of clock pulses (YCK-SFT1; . . . and YCK-SFT10) is switched over such that the phase of the clock pulses is advanced by $\pi/5$.

Note, in this embodiment, because the ten series of clock pulses (YCK-SFT1; . . . and YCK-SFT10) are used for the Y-axis pixel-pitch correction, n=10. Namely, the Y-axis pixel-pitch correction is performed with a unit of one-tenth of the one-pixel-dot size.

A number of times h(m), that the switching-over of the outputting of the ten clock pulses (YCK-SFT1; . . . and YCK-SFT10) should be carried out in each of the sections ( . . . , $Y_{m-1}$, $Y_m$, $Y_{m+1}$ . . . ), is defined by the following formula:

$$h(m) = int[EY_m*n/D_p] - int[EY_{m-1}*n/D_p]$$

Herein, "int[ . . . ]" represents the quotient of the bracketed division.

Also, a location $LY_t$, at which the switching-over of the outputting of the ten clock pulses (YCK-SFT1; . . . and YCK-SFT10) should be carried out and which is measured from the sub-scan-start position corresponding to the origin of the X–Y coordinate system, is defined by the following formula:

$$LY_t = (m-1)*Y_a + Y_{c1} + j*y_{c2}$$

Herein $$t = \sum_{m=0}^{m-1} |h(m)| + j, \quad 0 \leq j \leq h(m) \ (j: \text{integer})$$

Figure 12:
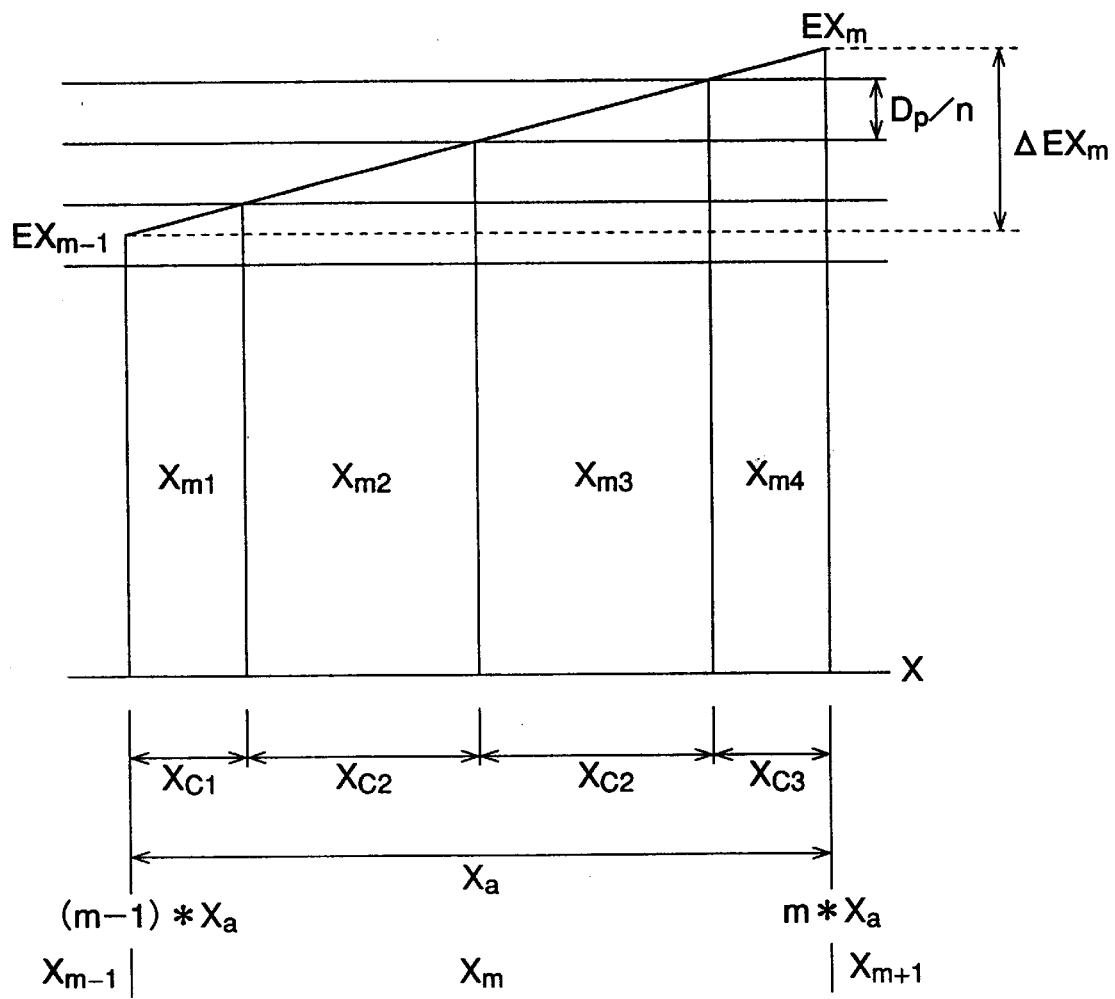
FIG. 12 is a conceptual view explaining a principle of an X-axis pixel-pitch correction according to the present invention, for correcting pixel-dot-pitch discrepancies in a sub-scanning range.

With reference to FIG. 12 corresponding to FIG. 11, a principle of an X-axis pixel-pitch correction is described.

The principle of the X-axis pixel-pitch correction is similar to the principle of the Y-axis pixel-pitch correction. In FIG. 12, a sub-scanning-range in the sub-scanning direction is equally divided into sections, and each of the sections has a distance of $X_a$, as shown in FIG. 12. Also, the respective sections are indicated by references . . . , $X_{m-1}$, $X_m$, $X_{m+1}$, . . . .

An arrangement of pixel-dots included in the section $X_m$ has a relative pitch-discrepancy $\Delta EX_m$ as defined by the following formula:

$$\Delta EX_m = EX_m - EX_{m-1}$$

Similar to the above-mentioned case, when the relative pitch-discrepancy $\Delta EX_m$ is positive, the arrangement of the pixel-dots to be included in the section $X_m$ is contracted, i.e., the pixel-dots are closer to each other. On the other hand, when the relative pitch-discrepancy $\Delta EX_m$ is negative, the arrangement of the pixel-dots to be included in the section $X_m$ is expanded, i.e., the pixel-dots are spaced further away from each other.

Note, the positive/negative data of the relative pitch-discrepancy $\Delta EX_m$ also are stored in either the electrically erasable read only memory (EEROM) or the ROM of the system control circuit 78.

The arrangement of pixel-dots included in the section $X_m$ has a degree of pixel-dot discrepancy ($\Delta SX_m$) as defined by the following formula:

$$\Delta SX_m = \Delta EX_m / X_a$$

According to the present invention, the X-axis pixel-pitch correction is also performed with a unit of less than the one-pixel-dot size $D_p/n$. Accordingly, the X-axis pixel-pitch correction is introduced into the sections ( . . . , $X_{m-1}$, $X_m$, $X_{m+1}$ . . . ) which have a relative pitch-discrepancy of more than $D_p/n$. For this reason, the relative pitch-discrepancies ( . . . , $\Delta EX_{m-1}$, $\Delta EX_m$, $\Delta EX_{m+1}$ . . . ) of the sections ( . . . , $X_{m-1}$, $X_m$, $X_{m+1}$ . . . ) are gauged with the unit of $D_p/n$, and each of the sections ( . . . , $X_{m-1}$, $X_m$, $X_{m+1}$ . . . ) is further divided into sub-sections on the basis of the gauging of the relative pitch-discrepancies with the unit of $D_p/n$.

As shown in FIG. 12, by way of example, the section $X_m$ is divided into four sub-sections $X_{m1}$, $X_{m2}$, $X_{m3}$ and $X_{m4}$, on the basis of the gauging of the relative pitch-discrepancy $\Delta EX_m$ with the unit of $D_p/n$. In this example, the sub-section $X_{m1}$ has a distance $X_{c1}$; each of the sub-sections $X_{m2}$ and $X_{m3}$ has a distance $X_{c2}$; and the sub-section $X_{m4}$ has a distance $X_{c3}$. The respective distances $X_{c1}$, $X_{c2}$ and $X_{c3}$ of the sub-sections are defined by the following formulas:

$$X_{c1}=(D_p/n-mod[EX_{m-1}*n/D_p])/\Delta SX_m$$

$$X_{c2}=D_p/n*\Delta SX_m$$

$$X_{c3}=mod[EX_m*n/D_p]/\Delta SX_m$$

As is apparent from FIG. 12, the sub-sections $X_{m1}$, $X_{m2}$ and $X_{m3}$ exhibit a pixel-discrepancy corresponding to $D_p/n$, but the sub-section $X_{m4}$ exhibits a pixel-discrepancy of less than $D_p/n$. Accordingly, the X-axis pixel-pitch correction is executed in each of the sub-sections $X_{m1}$, $X_{m2}$ and $X_{m3}$, but the X-axis pixel-pitch correction is not executed in the sub-section $X_{m4}$.

The execution of the X-axis pixel-pitch correction is effected by switching over the outputting of the series of clock pulses (XCK-SFT1; . . . ; and XCK-SFT10) from the X-axis pixel-pitch-correction circuit 84X to the servo-motor driver circuit 99 whenever a scanning-laser beam reaches a trailing end of each of the sub-sections $X_{m1}$, $X_{m2}$ and $X_{m3}$.

Of course, when the degree of pixel-dot discrepancy $\Delta EX_m$ is positive, i.e., when the arrangement of pixel-dots included in the section $X_m$ is subjected to a contraction, the outputting of the series of clock pulses (XCK-SFT1; . . . and XCK-SFT10) is switched over such that the phase of the clock pulses is advanced by $\pi/5$. On the other hand, when the degree of pixel-dot discrepancy $\Delta EX_m$ is negative, i.e., when the arrangement of pixel-dots included in the section $X_m$ is subjected to an expansion, the outputting of the series of clock pulses (XCK-SFT1; . . . and XCK-SFT10) is switched over such that the phase of the clock pulses is delayed by $\pi/5$.

Note, because the ten series of clock pulses (XCK-SFT1; . . . and XCK-SFT10) are used for the X-axis pixel-pitch correction, n=10. Namely, the X-axis pixel-pitch correction is also performed with a unit of one-tenth of the one-pixel-dot size.

A number of times g(m), that the switching-over of the outputting of the ten clock pulses (XCK-SFT1; . . . and XCK-SFT10) should be carried out in each of the sections ( . . . , $X_{m-1}$, $X_m$, $X_{m+1}$ . . . ) is defined by the following formula:

$$g(m)=int[EX_m*n/D_p]-int[EX_{m-1}*n/D_p]$$

Also, a location $LX_s$, where the switching-over of the outputting of the ten clock pulses (XCK-SFT1; . . . and XCK-SFT10) should be carried out and which is measured from the origin or scan-start position, is defined by the following formula:

$$LX_s=(m-1)*X_a+X_{c1}+i*X_{c2}$$

Herein, $$s = \sum_{m=0}^{m-1} |g(m)| + i, \quad 0 \le i \le g(m) \ (i : \text{integer}).$$

The Y-axis pixel-discrepancies $\Delta EY_m$ and the X-axis pixel-discrepancies $\Delta EX_m$ are actually measured in the following manner:

First, a photographic glass plate is positioned in place on the drawing table 18. Then, a suitable pattern, such as a lattice pattern, is drawn as a latent image on the photographic glass plate by actually operating the laser drawing apparatus. After the drawing operation, the photographic glass plate is photographically treated so that the latent image of the lattice pattern is developed and fixed thereon.

Figure 13:
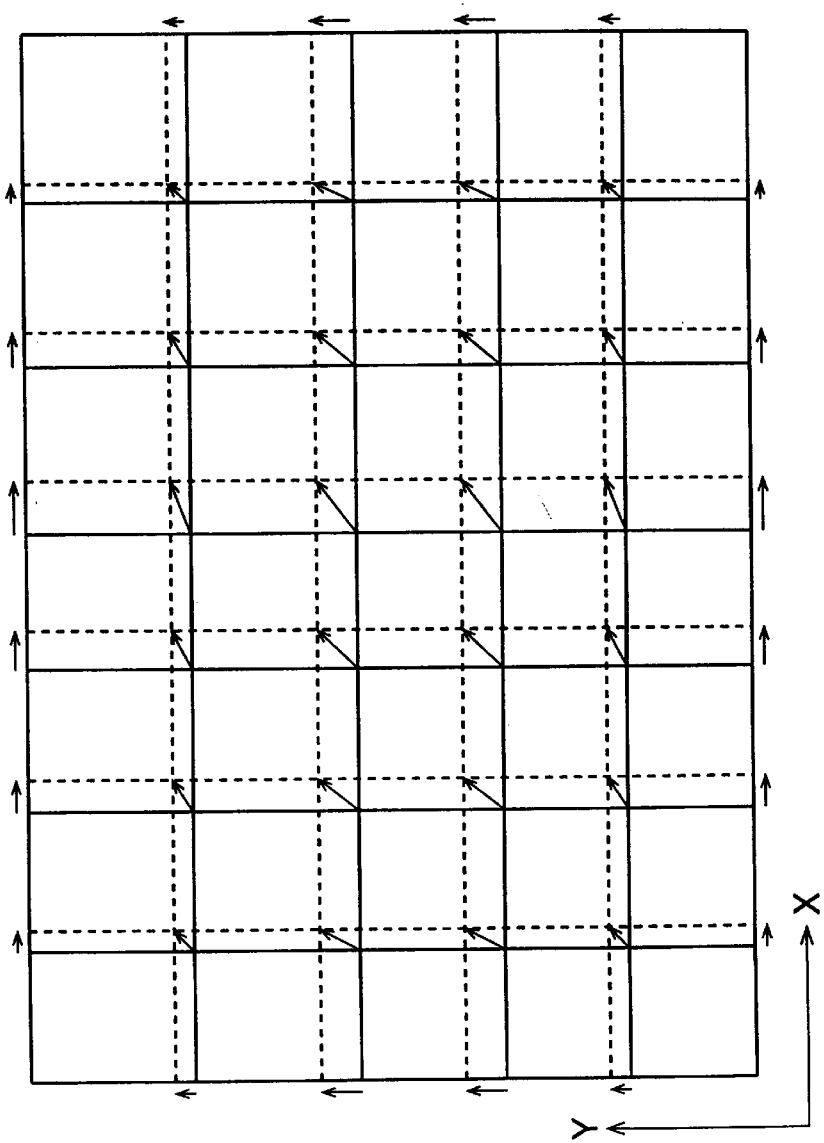
FIG. 13 is a conceptual view explaining a manner for actually measuring the pixel-dot-pitch discrepancies produced due to an assembly error during manufacture of a laser drawing apparatus.

The developed and fixed lattice pattern is compared with an ideal lattice pattern which is theoretically drawn, as shown in FIG. 13. In this drawing, the actually-drawn lattice pattern is shown by solid lines, and the theoretically-drawn ideal lattice pattern is shown by broken lines. Positional differences between the actually-drawn lattice pattern and the theoretically-drawn lattice pattern are measured as the Y-axis pixel-discrepancies $\Delta EY_m$ and the X-axis pixel-discrepancies $\Delta EX_m$.

Note, the measured pixel-discrepancy data ($\Delta EY_m$; $\Delta EX_m$) and the pixel-dot size data ($D_p$) also are stored in either the electrically erasable read only memory (EEROM) or the ROM of the system control circuit 78.

Figure 14:
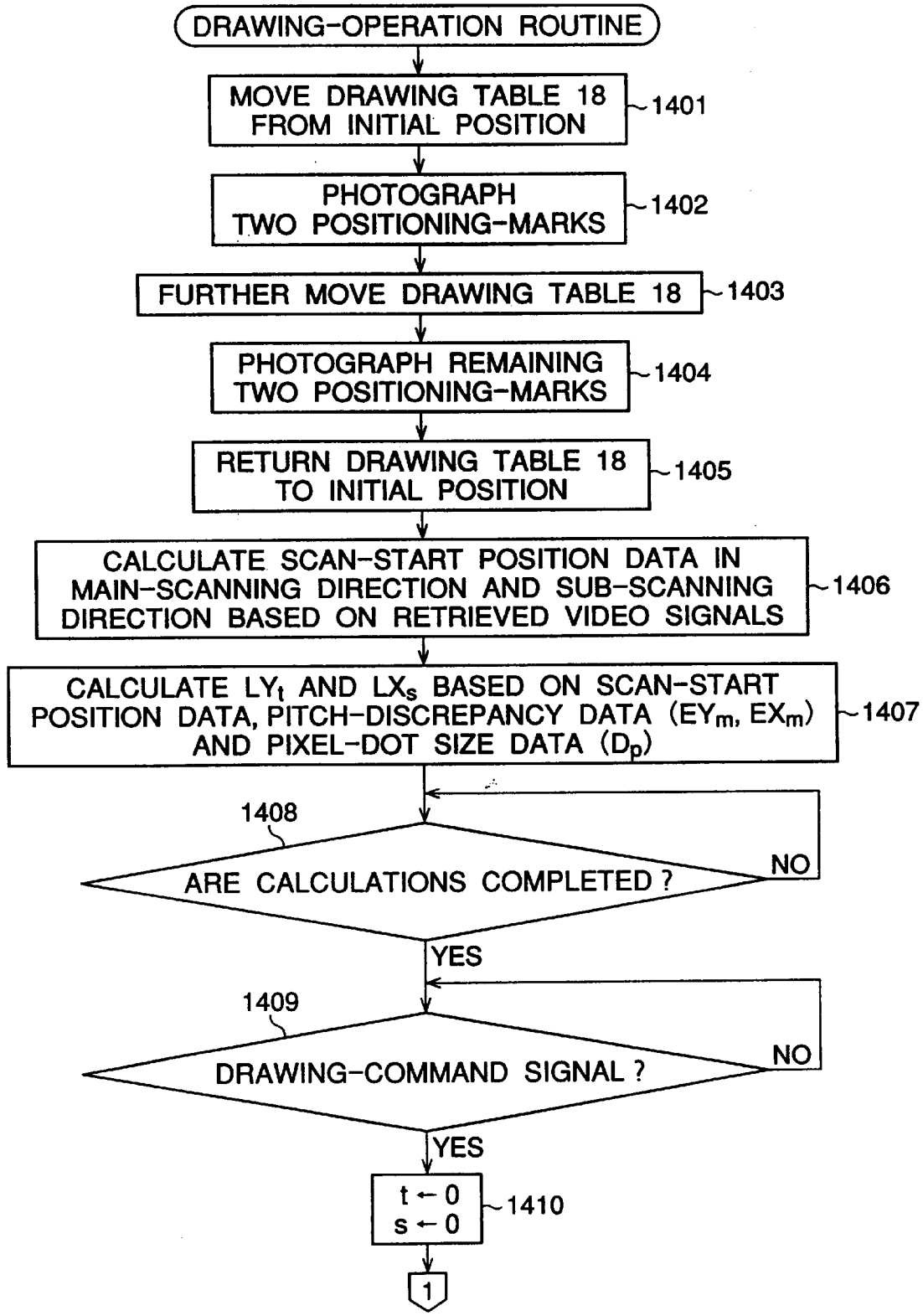
FIG. 14 is a part of a flowchart showing a drawing operation routine with a pixel-pitch correction, executed in the first embodiment of the laser drawing apparatus according to the present invention.
Figure 15:
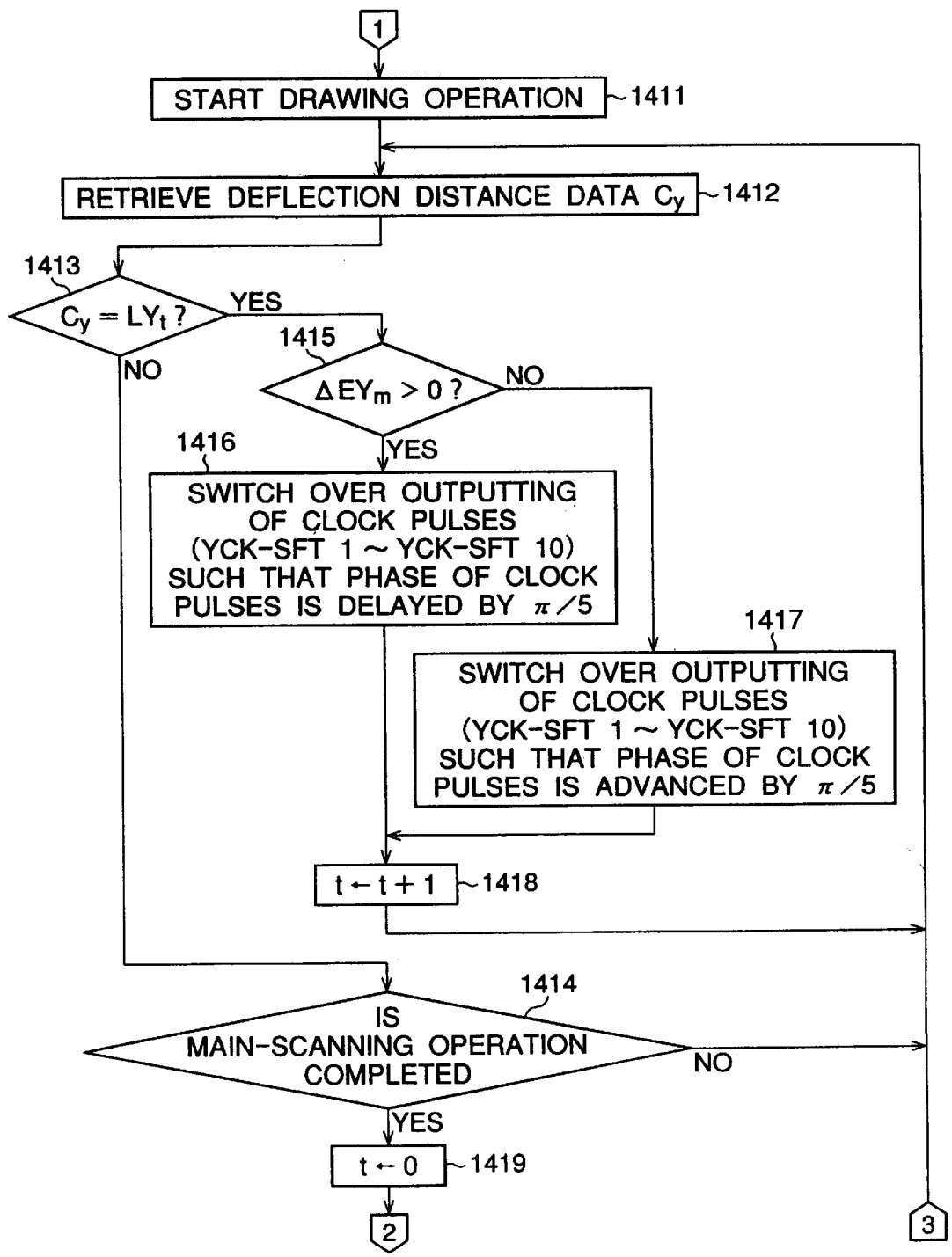
FIG. 15 is another part of the flowchart showing the drawing operation routine with the pixel-pitch correction, executed in the first embodiment of the laser drawing apparatus according to the present invention.
Figure 16:
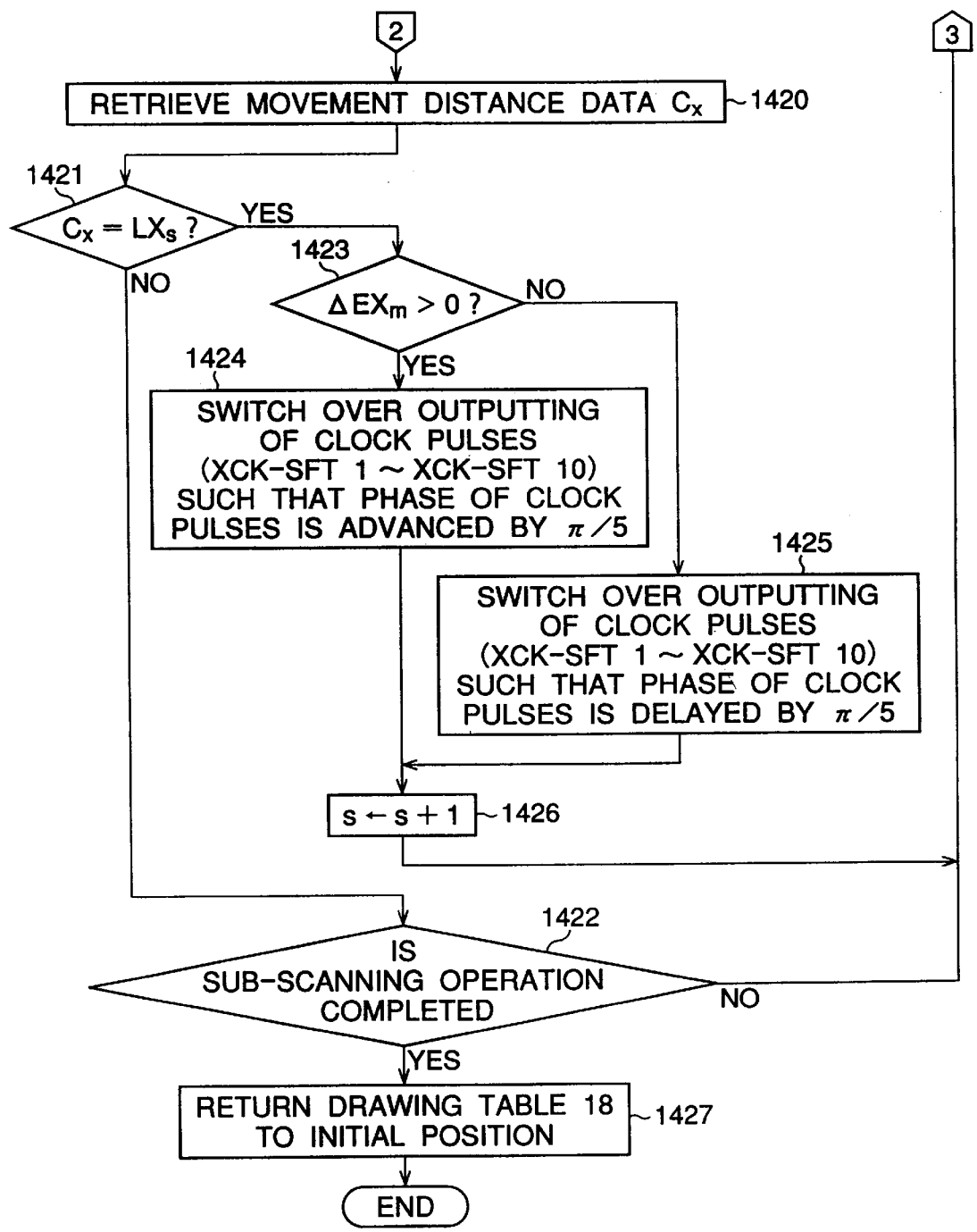
FIG. 16 is the remaining part of the flowchart showing the drawing operation routine with the pixel-pitch correction, executed in the first embodiment of the laser drawing apparatus according to the present invention.

FIGS. 14 to 16 show a flowchart for a drawing operation routine executed in the first embodiment of the laser drawing apparatus according to the present invention.

At step 1401, the drawing table 18 is moved from an initial position or retracted position along the X-axis of the X–Y coordinate system by driving the servo-motor 98 until two of the four positioning-marks of a workpiece, placed on the drawing table 18, are observed by the CCD cameras 80. When the positioning-marks are observed by the CCD cameras 80, the drawing table 18 is stopped.

At step 1402, the positioning-marks are photographed by the CCD cameras 80. Namely, the respective photographed positioning-mark images are converted into video signals by the CCD image sensors of the CCD cameras 80. The converted video signals are suitably processed in the video-signal processing circuit 82, and are then retrieved by the system control circuit 78.

At step 1403, the drawing table 18 is further moved in the X-axis direction of the X–Y coordinate system by driving the servo-motor 98 until the remaining two positioning-marks of the workpiece, placed on the drawing table 18, are observed by the CCD cameras 80. When the remaining two positioning-marks are observed by the CCD cameras 80, the drawing table 18 is again stopped.

At step 1404, the remaining two positioning-marks are photographed by the CCD cameras 80. Namely, the respective photographed positioning-mark images are converted into video signals by the CCD image sensors of the CCD cameras 80. The converted video signals are suitably processed in the video-signal processing circuit 82, and are then retrieved by the system control circuit 78.

At step 1405, the drawing table 18 is returned to the initial position or retracted position.

At step 1406, a main-scan-start position, along the main-scanning direction, and a sub-scan-start position, along the sub-scanning direction, are calculated on the basis of the processed video signals of the positioning-marks of the workpiece. The calculated main-scan-start position data and sub-scan-start position data are temporarily stored in the RAM of the system control circuit 78.

At step 1407, clock-pulse-phase-shift location data $LY_t$ and $LX_s$ are calculated on the basis of the scan-start position data, the pixel-pitch discrepancy data ($\Delta EY_m$, $\Delta EX_m$) and the pixel-dot size data ($D_p$). The calculated clock-pulse-phase-shift location data $LY_t$ and $LX_s$ are also temporarily stored in the RAM of the system control circuit 78.

At step 1408, it is determined whether or not the calculations have been completed. When the completion of the calculations is confirmed, the control proceeds from step 1408 to step 1409, in which it is determined whether or not a signal for commanding a drawing-operation is received from the EWS (engineering work station) through the LAN (local area network). When it is confirmed that the drawing-command signal is received, the control proceeds to step 1410, in which counters t and s are reset.

Then, at step 1411, a drawing-operation is started. Namely, the workpiece placed on the drawing table 18 is moved from the initial position toward a drawing-start position, defined by the main-scanning position and the sub-scanning position. The movement of the drawing table 18 is carried out by driving the servo-motor 98 in accordance with any one of the ten series of clock pulses (XCK-SFT1; . . . and XCK-SFT10). As soon as the workpiece reaches the drawing-start position, the workpiece is scanned with the sixteen laser beams, which are modulated, on the basis of raster-graphic data, in accordance with any one of the ten series of clock pulses (YCK-SFT1; . . . and YCK-SFT10).

At step 1412, deflection-distance data $C_y$ of the sixteen scanning laser beams is retrieved from the Y-scale sensor 94 by the system control circuit 78. The deflection-distance data $C_y$ represents a distance over which the sixteen laser beams are deflected from the scanning-start position in the main-scanning direction, at the time when the deflection-distance data $C_y$ is retrieved.

At step 1413, it is determined whether or not the retrieved deflection-distance data $C_y$ has coincided with a first clock-pulse-phase-shift location data $LY_{t=0}$. If $C_y \neq LY_{t=0}$, the control proceeds from step 1413 to step 1414, in which it is determined whether or not an initial pass of the main-scanning operation of the workpiece, with the sixteen laser beams, has been completed.

When the entire main-scanning operation is not yet completed, the control returns from step 1414 to step 1412, in which deflection-distance data $C_y$ is again retrieved from the Y-scale sensor 94 by the system control circuit 78. Namely, the routine comprising steps 1412, 1413 and 1414 is repeated until the retrieved deflection-distance data $C_y$ coincides with the first phase-shift location data $LY_{t=0}$.

At step 1413, when the retrieved deflection-distance data $C_y$ has coincided with the first phase-shift location data $LY_{t=0}$, the control proceeds from step 1413 to step 1415, in which it is determined whether the arrangement of pixel-dots, included in a first section $Y_{m=0}$, is contracted or expanded, i.e., whether the relative pixel-dot discrepancy $\Delta EY_{m=0}$ is positive or negative.

As already mentioned above, when the arrangement of pixel-dots included in the first section $Y_{m=0}$ is subjected to a contraction ($\Delta EY_{m=0} > 0$), the control proceeds from step 1415 to step 1416, in which the switching-over of the outputting of the ten series of clock pulses (YCK-SFT1; . . . and YCK-SFT10) is carried out such that the phase of the clock pulses is delayed by $\pi/5$. On the other hand, when the arrangement of pixel-dots included in the first section $Y_{m=0}$ is subjected to an expansion ($\Delta EY_{m=0} < 0$), the control proceeds from step 1415 to step 1417, in which the switching-over of the outputting of the ten series of clock pulses (YCK-SFT1; . . . and YCK-SFT10) is carried out such that the phase of the clock pulses is advanced by $\pi/5$.

After the switching-over of the outputting of the ten series of clock pulses (YCK-SFT1; . . . and YCK-SFT10) is carried out at step 1416 or step 1417, the control proceeds to step 1418, in which a count number of the counter t is incremented by "1". Then, the control returns to step 1412. Namely, the routine comprising steps 1412 through 1418 is repeatedly executed until the entire main-scanning operation is completed once.

At step 1414, when the completion of the main-scanning operation is confirmed, the control proceeds from step 1414 to step 1419, in which the counter t is reset. At step 1420, movement-distance data $C_x$ of the drawing table 18 is retrieved from the X-scale sensor 100 by the system control circuit 78. The movement-distance data $C_x$ represents a distance over which the drawing table 18 is moved from the sub-scanning-start position in the sub-scanning direction, at the time when the movement-distance data $C_x$ is retrieved.

At step 1421, it is determined whether or not the retrieved movement-distance data $C_x$ coincides with a first clock-pulse-phase-shift location data $LX_{s=0}$. If $C_x \neq LX_{s=0}$, the control proceeds from step 1421 to step 1422, in which it is determined whether or not a sub-scanning operation of the workpiece, with the sixteen laser beams, is completed.

When the sub-scanning operation is not yet completed, the control returns from step 1422 to step 1412. Namely, a second pass of the main-scanning operation of the workpiece, with sixteen laser beams, is performed in the same manner as the first or initial pass of the main-scanning operation of the workpiece with the sixteen laser beams.

At step 1414, when the completion of the second pass of the main-scanning operation, with the sixteen laser beams, has been confirmed, the control proceeds from step 1414 to step 1419, in which the counter t is reset. Then, at step 1420, movement-distance data $C_x$ is again retrieved from the X-scale sensor 100 by the system control circuit 78. Namely, the routine comprising steps 1412 through 1422 is repeated until the retrieved movement-distance data $C_x$ coincides with the first clock-pulse-phase-shift location data $LX_{s=0}$.

At step 1421, when the retrieved movement-distance data $C_x$ has coincided with the first clock-pulse-phase-shift location data $LX_{s=0}$, the control proceeds from step 1421 to step 1423, in which it is determined whether the arrangement of pixel-dots included in a first section $X_{m=0}$ is contracted or expanded, i.e., whether the relative pixel-dot discrepancy $\Delta EX_{m=0}$ is positive or negative.

As already mentioned above, when the arrangement of pixel-dots included in the first section $X_{m=0}$ is subjected to a contraction ($\Delta EX_{m=0} > 0$), the control proceeds from step 1423 to step 1424, in which the switching-over of the outputting of the ten series of clock pulses (XCK-SFT1; . . . and XCK-SFT10) is carried out such that the phase of the clock pulses is advanced by $\pi/5$. On the other hand, when the arrangement of pixel-dots included in the first section $X_{m=0}$ is subjected to an expansion ($\Delta EX_{m=0} < 0$), the control proceeds from step 1423 to step 1425, in which the switching-over of the outputting of the series of clock pulses (XCK-SFT1; . . . and XCK-SFT10) is carried out such that the phase of the clock pulses is delayed by $\pi/5$.

After the switching-over of the outputting of the series of clock pulses (XCK-SFT1; . . . and XCK-SFT10) is carried out at step 1424 or step 1425, the control proceeds to step 1426, in which a count number of the counter s is incremented by "1", and then the control returns to step 1412. Namely, the routine comprising steps 1412 through 1426 is repeatedly executed until the entire sub-scanning operation is completed.

At step 1422, when the completion of the sub-scanning operation is confirmed, i.e., when the drawing-operation is entirely completed, the control proceeds from step 1422 to step 1427, in which the drawing table 18 is returned to the initial position by driving the servo-motor 98. Thus, the execution of the drawing-operation is completed.

Figure 17:
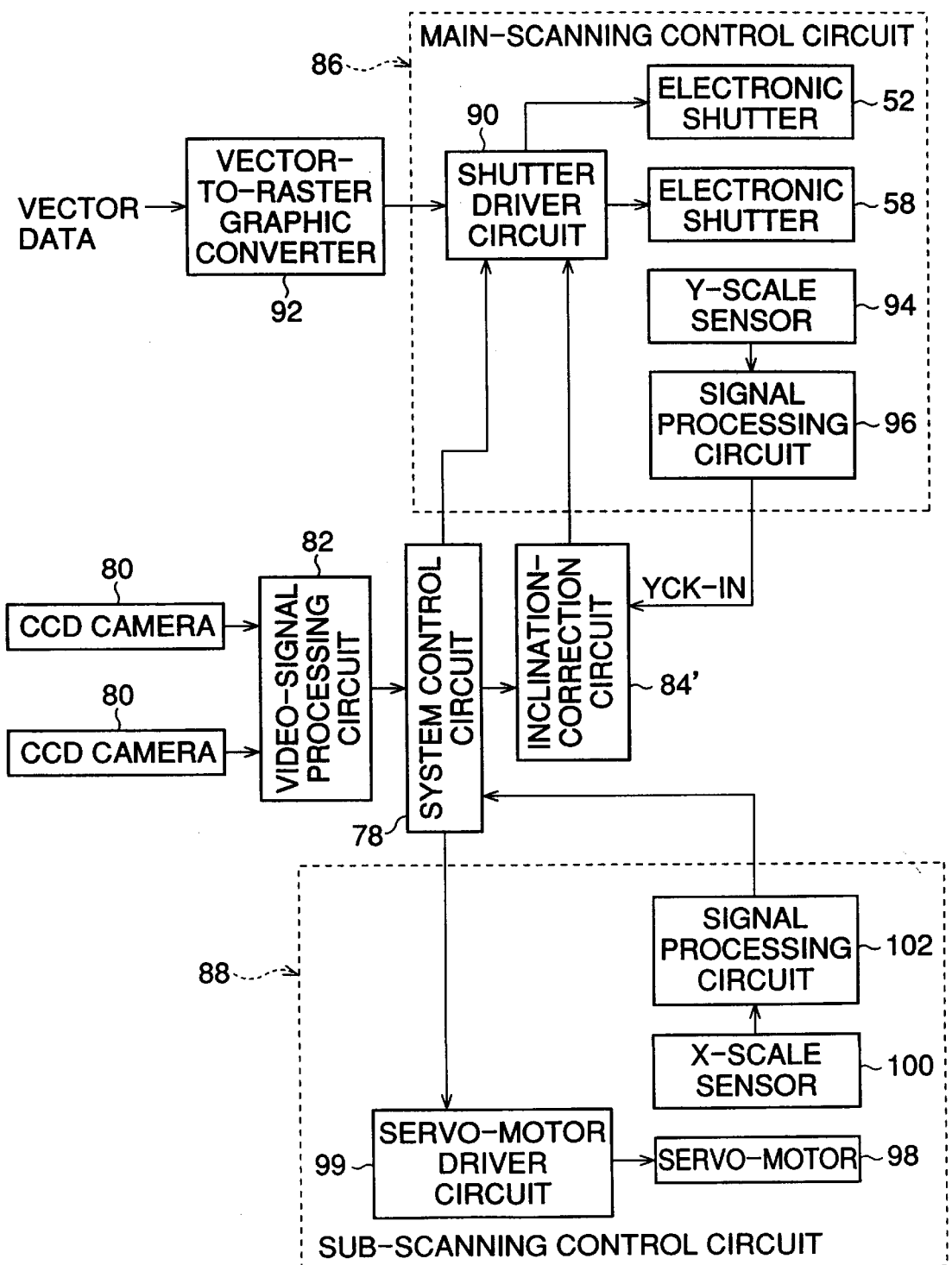
FIG. 17 is a block diagram of a second embodiment of the laser drawing apparatus according to the present invention.

FIG. 17 shows a block diagram of a second embodiment of the laser drawing apparatus according to this invention, in which an inclination correction is performed with a unit of less than one-pixel-dot size with respect to a pattern to be drawn. The inclination correction is for correcting an inclination of the sub-scanning-lines with respect to the main-scanning direction. Note, in FIG. 17, the features similar to those of FIG. 3 are indicated by the same reference numerals.

In the block diagram of FIG. 17, an inclination-correction circuit 84' has substantially the same arrangement as that of the Y-axis pixel-pitch correction circuit 84Y shown in FIG. 4. Namely, any one of the ten-series of clock pulses: YCK-SFT1; YCK-SFT2; YCK-SFT3; YCK-SFT4; YCK-SFT5; YCK-SFT6; YCK-SFT7; YCK-SFT8; YCK-SFT9; and YCK-SFT10, is selectively output from the inclination-correction circuit 84' to the synchronizing circuit 90B (FIG. 8), included in the shutter driver circuit 90 of the main-scanning control circuit 86. The outputting of the ten series of clock pulses (YCK-SFT1; . . . and YCK-SFT10) is switched over by the combination of the output levels of the selection-signals Y-SEL1, Y-SEL2, Y-SEL3 and Y-SEL4, as shown in TABLE 1.

In the second embodiment, a series of clock pulses output from the signal processing circuit 102 is directly input to the system control circuit 78. Thus, the system control circuit 78 outputs a series of clock pulses to the servo-motor driver circuit 99 on the basis of the clock pulses input from the signal processing circuit 102. Then, the servo-motor driver circuit 99 outputs a series of drive pulses to the servo-motor 98 in accordance with the series of clock pulses input from the system control circuit 78.

Figure 18:
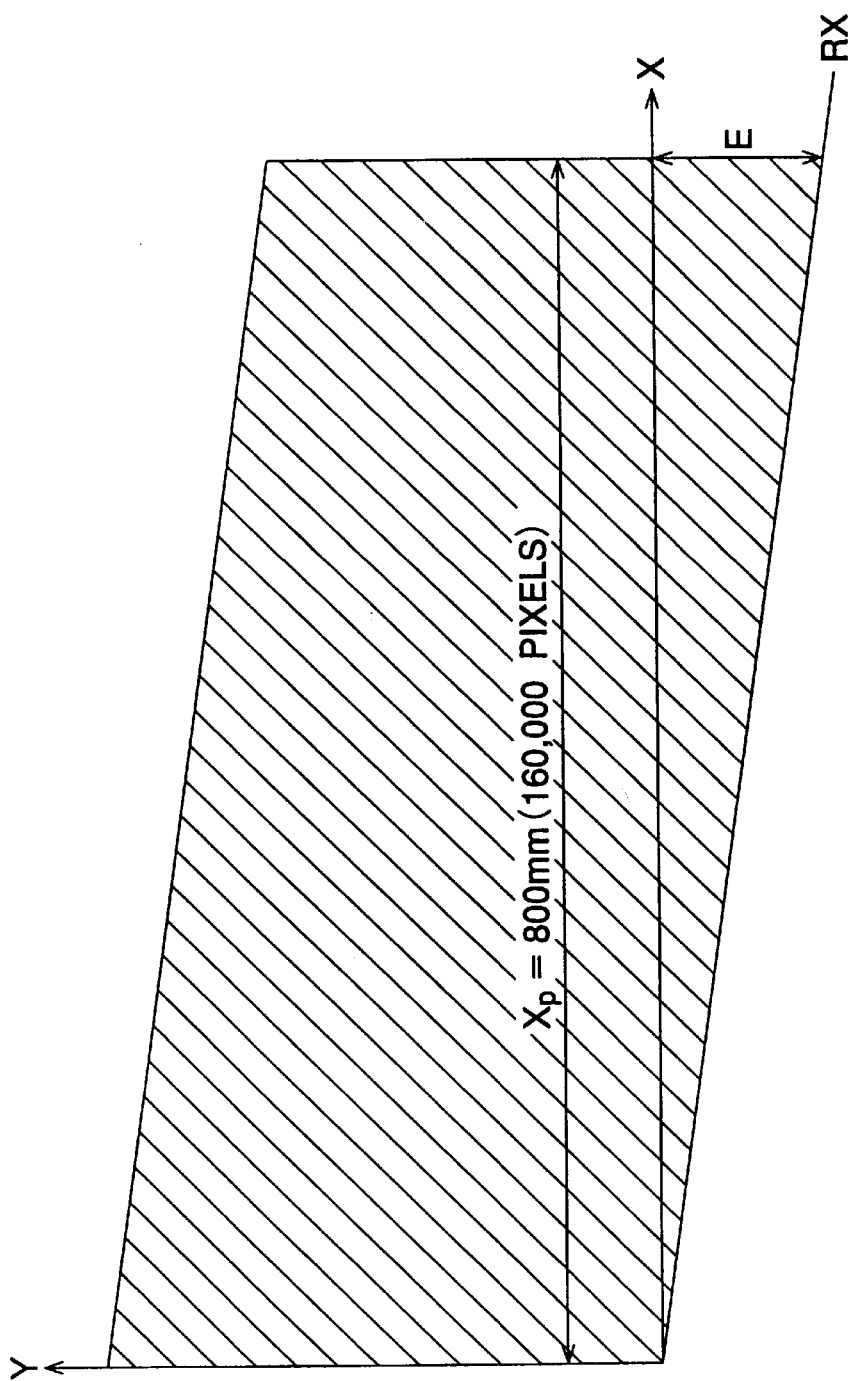
FIG. 18 is a graph representing an inclination of a sub-scan-line with respect to a main-scan-line.
Figure 19:
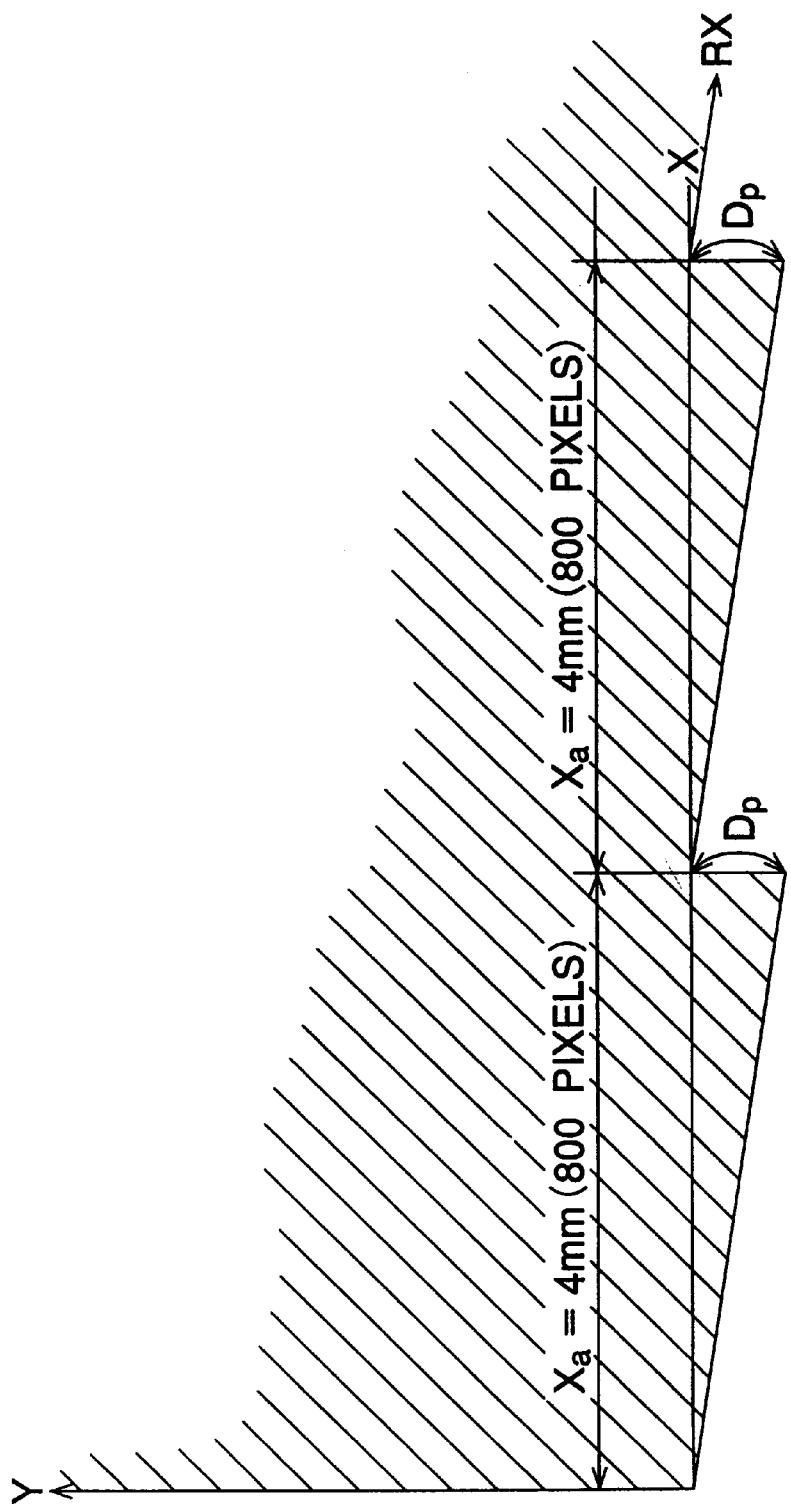
FIG. 19 is a graph illustrating a principle of rough inclination-correction, according to the present invention, for roughly correcting the inclination of the sub-scan-line as shown in FIG. 18.
Figure 20:
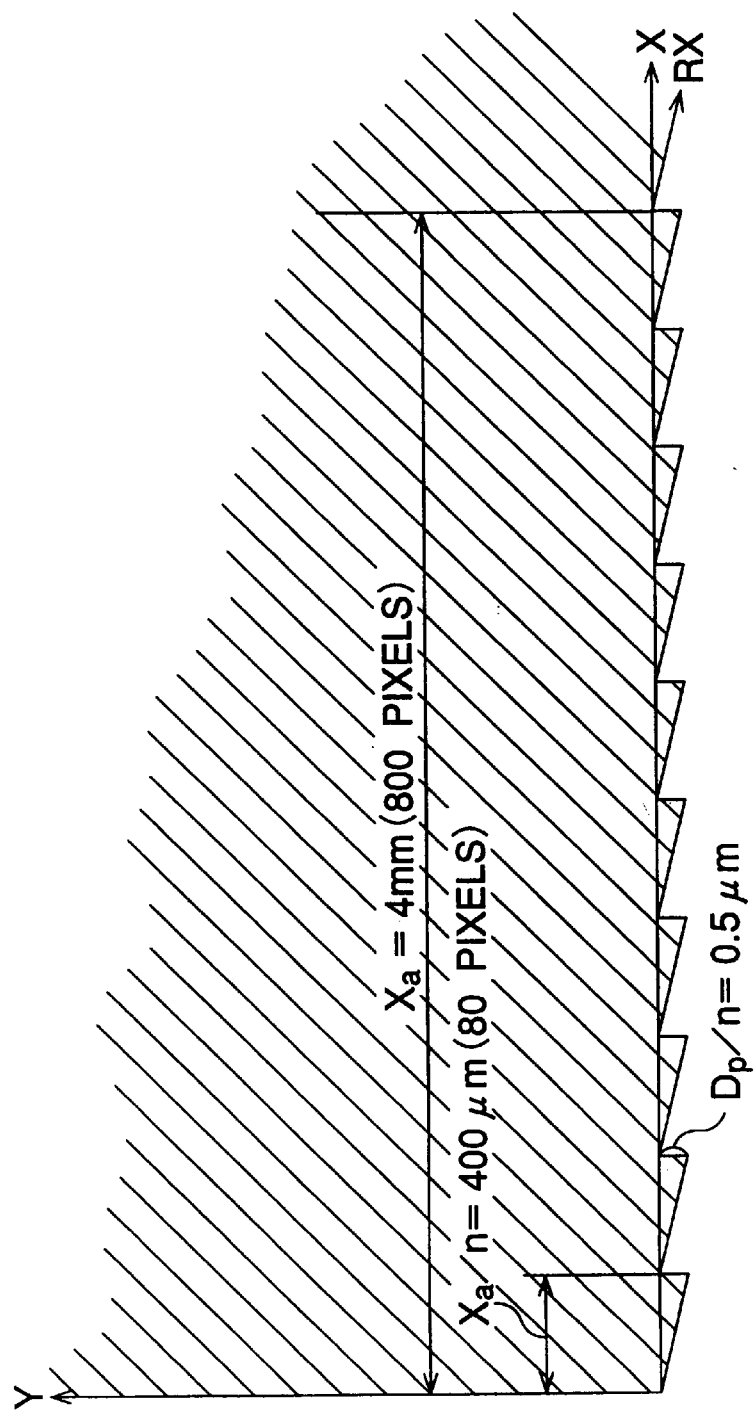
FIG. 20 is a graph illustrating a principle of a fine inclination-correction, according to the present invention, for finely correcting the inclination of the sub-scan-line as shown in FIG. 19.

With reference to FIGS. 18, 19 and 20, a principle of the inclination correction according to the present invention will now be explained below.

In FIG. 18, a hatched zone represents a rectangular solid pattern drawn and recorded on a suitable substrate such as a photographic glass plate, by actually operating the laser drawing apparatus. The sub-scanning-lines of the rectangular solid pattern should be inherently extended in the sub-scanning direction (X-axis) perpendicular to the main-scanning direction (Y-axis). But, the sub-scanning-lines of the rectangular solid pattern are inclined with respect to the main-scanning direction (Y-axis), due to an assembly error produced during manufacture of the laser drawing apparatus. In FIG. 18, the inclined sub-scanning-lines are represented by an inclined axis RX, and a degree of the inclination of the sub-scanning-lines is indicated as a drifted distance E on a boundary of the rectangular solid pattern.

Also, in FIG. 18, a distance of the sub-scanning-range is indicated by reference $X_p$. If one-pixel-dot size is $D_p$, a number of pixel-dots, which are arranged along each sub-scanning-line of the sub-scanning-range, is represented by $X_p/D_p$. For example, if the distance $X_p$ of the sub-scanning-range is 800 mm, and if the one-pixel-dot size is 5 μm, a number of 160,000 pixel-dots are arranged along each sub-scanning-line of the scanning-range of 800 mm.

In the inclination correction according to the present invention, first, as shown in FIG. 19, the sub-scanning-range $X_p$ is divided into sections, each of which has a distance $X_a$ as defined by the following formula:

$$X_a = X_p * D_p / E$$

In the example as mentioned above, if the drifted distance E is 1 mm, $X_a$=4 mm. In this case, the 4 mm distance of the sections $X_a$ corresponds to an arrangement of 800 pixel-dots.

Then, a rough inclination correction is introduced into each of the sections ($X_a$), with a unit of one-pixel-dot size, so that the inclined axis RX is approximated to the X-axis as a zigzag line shown in FIG. 19. The rough inclination correction, based upon the unit of one-pixel-dot size, is made possible by controlling a reading-timing of the raster-graphic data from the bit-map memory 90A (FIG. 8).

In particular, whenever the drawing table 18, and therefore the workpiece, is moved by consecutive distances of 4 mm from the sub-scan-start position coinciding with the origin of the X–Y coordinate system in FIG. 19, the main-scan-start position, is shifted by a distance corresponding to one-pixel-dot size $D_p$. The shift of the main-scan-start position by the distance corresponding to one-pixel-dot size $D_p$ is carried out by delaying or advancing the reading-timing of the raster-graphic data from the bit-map memory 90A by a time required to read a one-pixel raster-graphic datum from the bit-map memory 90A.

As the example shown in FIG. 18, when the inclined axis RX defines an obtuse angle with the Y-axis, the reading-timing of the raster-graphic data, from the bit-map memory 90A, is delayed by the time required to read the one-pixel raster-graphic datum from the bit-map memory 90A. Consequently, the rough inclination correction is achieved based upon a unit of one-pixel-dot size as shown in FIG. 19.

On the contrary, if the inclined axis RX defines an acute angle with the Y-axis, the reading-timing of the raster-graphic data from the bit-map memory 90A is advanced by the time required to read the one-pixel raster-graphic datum from the bit-map memory 90A. Thus, the inclined axis RX, which defines the acute angle with the Y-axis, can also be approximated to the X-axis in substantially the same manner as shown in FIG. 19.

A one-pixel-dot-shift location $X_t$, at which the main-scan-start position should be shifted by the distance corresponding to one-pixel-dot size, is defined by the following formula:

$$X_t = X_a * t \text{ (t: integer)}$$

According to the present invention, a fine inclination correction is further introduced into each of the sections ($X_a$), with a unit ($D_p/n$) of less than one-pixel-dot size, so that the inclined axis RX is more closely approximated to the X-axis as a fine zigzag line shown in FIG. 20. The fine inclination correction, based upon a unit of less than one-pixel-dot size, is made possible by successively switching over the outputting of the ten series of clock pulses (YCK-SFT1; . . . and YCK-SFT10) from the inclination-correction circuit 84' to the synchronizing circuit 90B (FIG. 8).

Note, in the second embodiment, because the ten series of clock pulses (YCK-SFT1; . . . and YCK-SFT10) are used for the fine inclination correction, n=10. Namely, the inclination correction is performed with a unit of one-tenth of one-pixel-dot size.

For the introduction of the fine inclination correction, each of the sections ($X_a$) is further divided into ten sub-sections, each having a distance of $X_a/n$, as shown in FIG. 20. In the example as mentioned above, the distance $X_a/n$ of each sub-section is 400 μm. The 400 μm distance of the sub-sections $X_a/n$ corresponds to an arrangement of 80 pixel-dots.

Whenever the drawing table 18, and therefore the workpiece, is moved by consecutive distances of 400 μm from the sub-scan-start position, the outputting of the ten series of clock pulses (YCK-SFT1; . . . and YCK-SFT10) is successively switched over. The switch occurs so that a phase of the output clock pulses (YCK-SFT1; . . . ; YCK-SFT10) is shifted by π/5. The sub-scan-start position coincides with the origin of the X–Y coordinate system in FIG. 20.

As shown in the example in FIG. 18, when the inclined axis RX defines the obtuse angle with the Y-axis, the switching-over of the outputting of the ten series of clock pulses (YCK-SFT1; ... and YCK-SFT10) is carried out so that a phase of the output clock pulses (YCK-SFT1; ...; YCK-SFT10) is delayed by $\pi/5$. Consequently, the fine inclination correction is achieved based upon a unit of less than one-pixel-dot size, as shown in FIG. 20.

On the contrary, if the inclined axis RX defines an acute angle with the Y-axis, the switching-over of the outputting of the ten series of clock pulses (YCK-SFT1; ... and YCK-SFT10) is carried out so that a phase of the output clock pulses (YCK-SFT1; ...; YCK-SFT10) is advanced by $\pi/5$. Thus, the inclined axis RX, which defines the acute angle with the Y-axis, can also be approximated to the X-axis, in substantially the same manner as shown in FIG. 20.

A clock-pulse-phase-shift-location $X_s$, where the phase of the output clock pulses (YCK-SFT1; ...; YCK-SFT10) should be shifted, is defined by the following formula:

$$X_s = (X_a/n)^* s \text{ (s: integer)}$$

The drifted distance data (E) and the pixel-dot size data ($D_p$) are preferably stored in a non-volatile memory, such as an electrically erasable read only memory (EEROM), provided in the system control circuit 78. Of course, the drifted distance data and the pixel-dot size data may be stored in the ROM of the system control circuit 78, if necessary.

Figure 21:
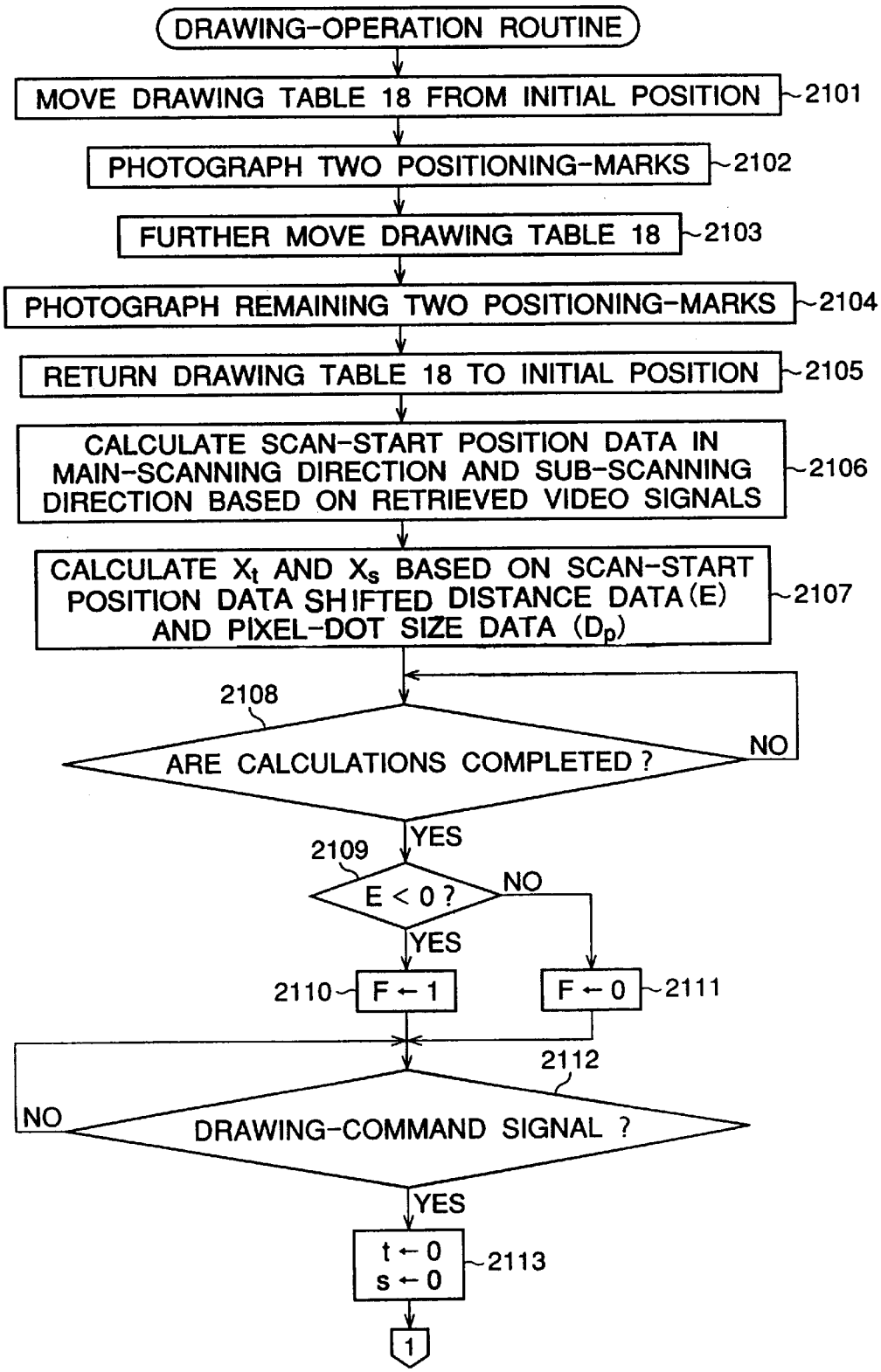
FIG. 21 is a part of a flowchart showing a drawing operation routine with the inclination-correction, executed in the second embodiment of the laser drawing apparatus according to the present invention.
Figure 22:
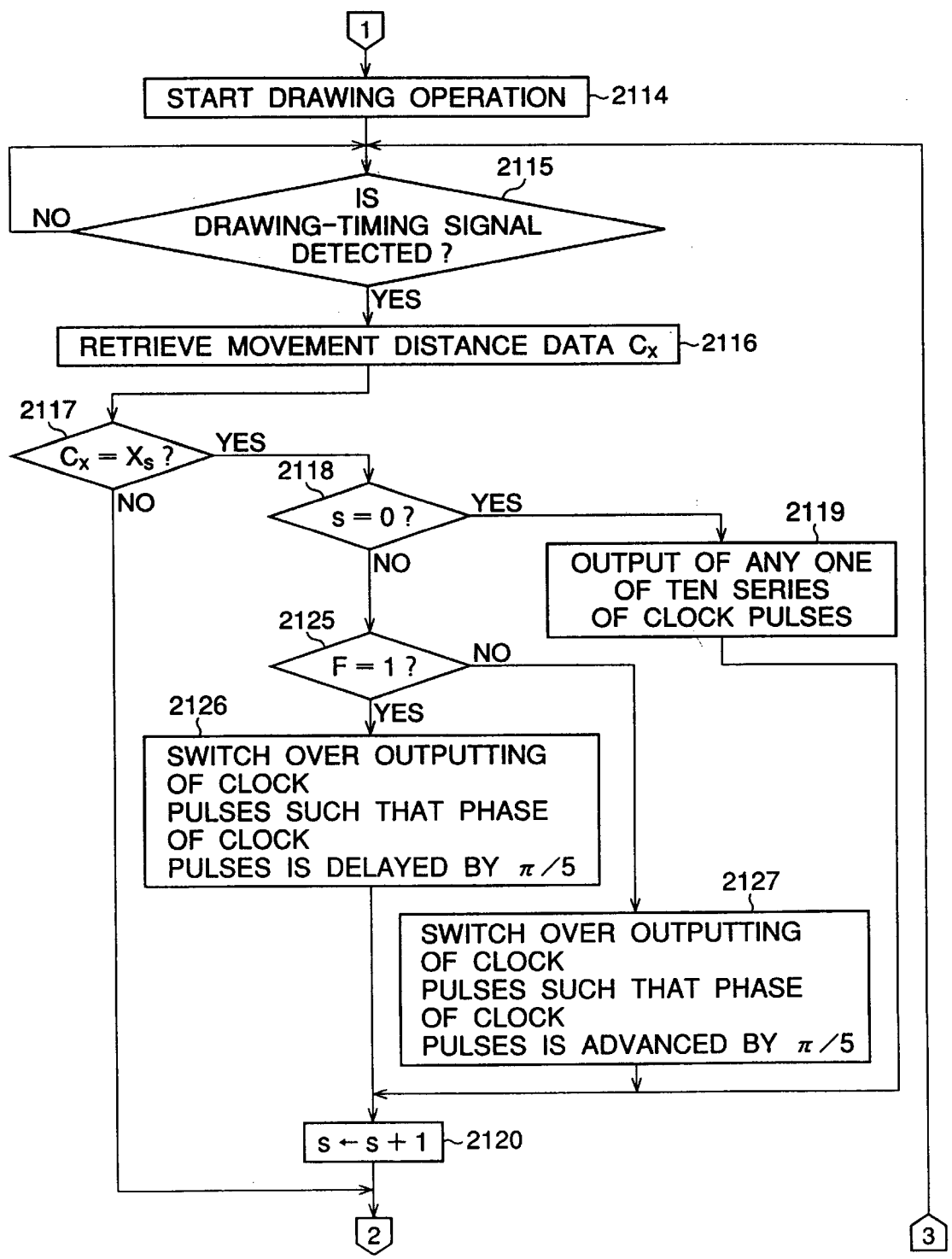
FIG. 22 is another part of the flowchart showing the drawing operation routine with the inclination-correction, executed in the second embodiment of the laser drawing apparatus according to the present invention.
Figure 23:
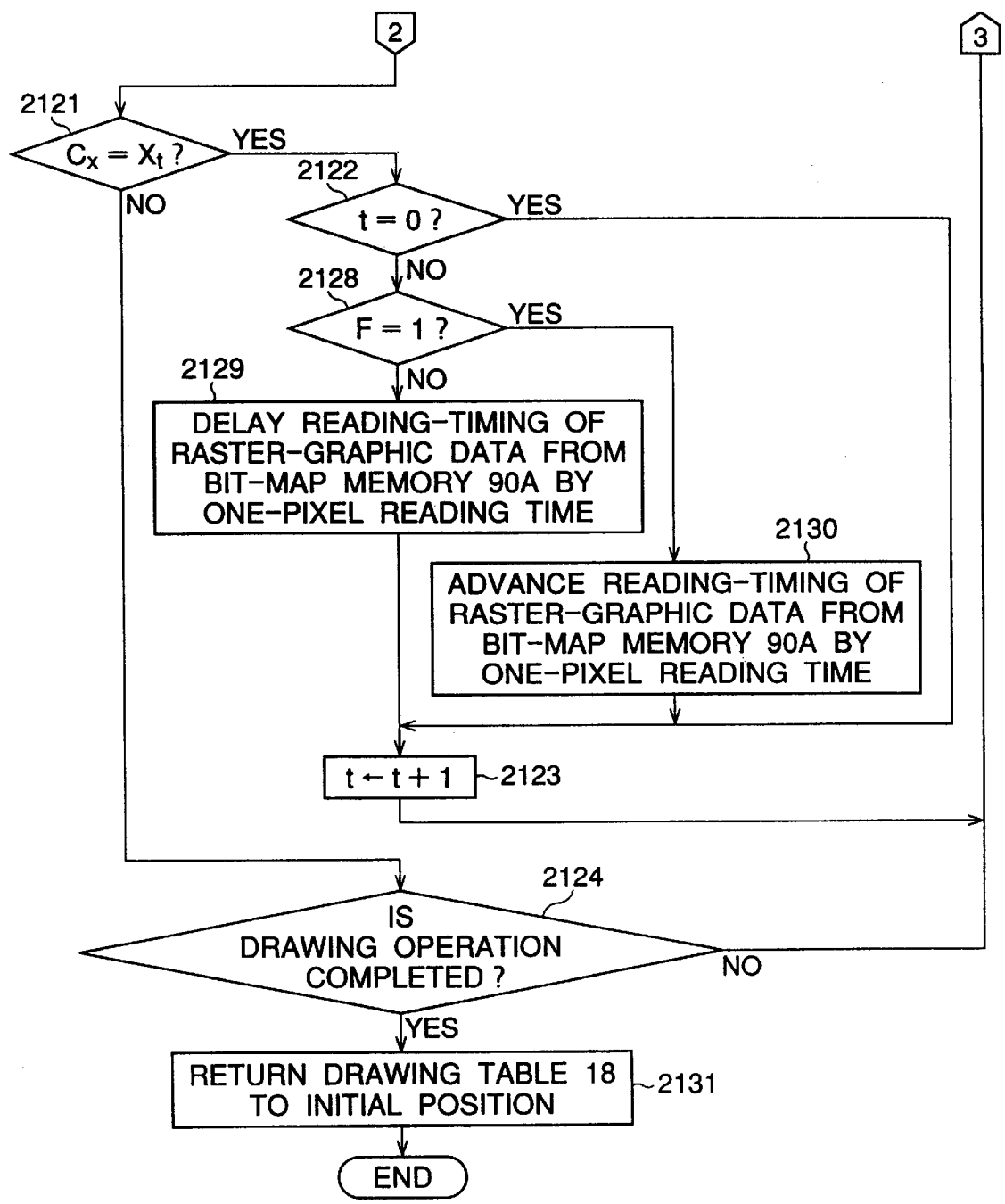
FIG. 23 is the remaining part of the flowchart showing the drawing operation routine with the inclination-correction, executed in the second embodiment of the laser drawing apparatus according to the present invention.

FIGS. 21 to 23 show a flowchart for a drawing operation routine executed in the second embodiment of the laser drawing apparatus according to the present invention.

At step 2101, the drawing table 18 is moved from an initial position or retracted position along the X-axis of the X–Y coordinate system, by driving the servo-motor 98 until two of the four positioning-marks of a workpiece, placed on the drawing table 18, are observed by the CCD cameras 80. When the positioning-marks are observed by the CCD cameras 80, the drawing table 18 is stopped.

At step 2102, the positioning-marks are photographed by the CCD cameras 80. Namely, the respective photographed positioning-mark images are converted into video signals by the CCD image sensors of the CCD cameras 80. The converted video signals are suitably processed in the video-signal processing circuit 82, and are then retrieved by the system control circuit 78.

At step 2103, the drawing table 18 is further moved in the X-axis direction of the X–Y coordinate system, by driving the servo-motor 98, until the remaining two positioning-marks of the workpiece, placed on the drawing table 18, are observed by the CCD cameras 80. When the remaining two positioning-marks are observed by the CCD cameras 80, the drawing table 18 is stopped.

At step 2104, the remaining two positioning-marks are photographed by the CCD cameras 80. Namely, the respective photographed positioning-mark images are converted into video signals by the CCD image sensors of the CCD cameras 80. The converted video signals are suitably processed in the video-signal processing circuit 82, and are then retrieved by the system control circuit 78.

At step 2105, the drawing table 18 is returned to the initial position or retracted position.

At step 2106, a main-scan-start position, along the main-scanning direction and a sub-scan-start position, along the sub-scanning direction, are calculated on the basis of the processed video signals of the positioning-marks of the workpiece. The calculated main-scan-start position data and sub-scan-start position data are temporarily stored in the RAM of the system control circuit 78.

At step 2107, one-pixel-dot-shift location data ($X_t$) and clock-pulse-phase-shift location data ($X_a$) are calculated on the basis of the scan-start position data, the shifted distance data (E) and the pixel-dot size data ($D_p$). The calculated location data ($X_t$, $X_s$) are also temporarily stored in the RAM of the system control circuit 78.

At step 2108, it is determined whether or not the calculations have been completed. When the completion of the calculations is confirmed, the control proceeds from step 2108 to step 2109, in which it is determined whether the drifted distance data (E) is negative or positive.

Note, in this embodiment, when the inclined axis RX forms an obtuse angle with the Y-axis, as shown in FIG. 18, it is defined that the drifted distance data (E) is negative, and when the inclined axis RX forms an acute angle with the Y-axis, it is defined that the drifted distance data (E) is positive.

When the drifted distance data (E) is negative (E<0), the control proceeds from step 2109 to step 2110, in which a flag F is made "1". On the other hand, when the drifted distance data (E) is positive (E>0), the control proceeds from step 2109 to step 2111, in which the flag F is made "0".

At step 2112, it is determined whether or not a signal for commanding a drawing-operation is received from the EWS (engineering work station) through the LAN (local area network). When it is confirmed that the drawing-command signal is received, the control proceeds to step 2113, in which counters t and s are reset.

Then, at step 2114, a drawing-operation is started. Namely, the workpiece placed on the drawing table 18 is moved from the initial position toward a drawing-start position, defined by the main-scanning position and the sub-scanning position. The movement of the drawing table 18 is carried out by driving the servo-motor 98 in accordance with the series drive pulses output from the servo-motor driver circuit 99.

At step 2115, it is monitored whether or not an initial drawing-timing signal is detected by the system control circuit 78, during the movement of the drawing table 18 toward the drawing-start position. The drawing-timing signal is used to properly draw a pattern on the basis of the raster-graphic data stored and developed in the bit-map memory 90A (FIG. 8).

In particular, before the proper drawing of the pattern can be achieved, the modulation of the laser beams, based upon the raster-graphic data read from the bit-map memory 90A, must be commenced whenever the deflected laser beams reach the main-scan-start position in the main-scanning direction. To ensure the commencement of the modulation of the laser beams, at the time when the laser beams reach the main-scan-start position, a mirror is provided at the outside of the main-scanning range such that one of the deflected laser beams passes through the mirror. The drawing-timing signal is produced by detecting a laser beam reflected from the mirror, and the commencement of the modulation of the laser beams is controlled on the basis of the production of the drawing-timing signal, to ensure the proper drawing of the pattern.

When the production of the drawing-timing signal is detected by the system control circuit 78, the control proceeds from step 2115 to step 2116, in which movement-distance data $C_x$ of the drawing table 18 is retrieved from the X-scale sensor 100 by the system control circuit 78. The movement-distance data $C_x$ represents a distance over which the drawing table 18 is moved, from the sub-scanning-start position in the sub-scanning direction, at the time when the movement-distance data $C_x$ is retrieved.

At step 2117, it is determined whether or not the retrieved movement-distance data $C_x$ has coincided with an initial clock-pulse-phase-shift location data ($X_{s=0}$). At the initial stage, the retrieved movement-distance data $C_x$ corresponds to the sub-scan-start position, which coincides with the initial clock-pulse-phase-shift location $X_{s=0}$. Nevertheless, the switching-over of the outputting of the ten clock pulses (YCK-SFT1; ... ; YCK-SFT10), as mentioned above, cannot be carried out, because none of the ten series of clock pulses (YCK-SFT1; ... ; YCK-SFT10) has been output from the inclination correction circuit 84' to the synchronizing circuit 90B (FIG. 8). Note, the initial clock-pulse-phase-shift location $X_{s=0}$ corresponds to the origin of the X–Y coordinate system, as shown in FIGS. 18 to 20.

Namely, the control proceeds from step 2117 to step 2118, in which it is determined whether or not a count number of the counter s is "0". Then, the control proceeds to step 2119 (s=0 at the initial stage), in which any one of the ten series of clock pulses (YCK-SFT1; ... ; YCK-SFT10), for example, the first series of clock pulses YCK-SFT1, is output from the inclination-correction circuit 84' to the synchronizing circuit 90B.

Thereafter, at step 2120, the count number of the counter s is incremented by "1". Then, the control proceeds to step 2121, in which it is further determined whether or not the retrieved movement-distance data $C_x$ coincides with an initial one-pixel-dot-shift location data $(X_{t=0})$. As mentioned above, at the initial stage, the retrieved movement-distance data $C_x$ corresponds to the sub-scan-start position, which also coincides with the initial one-pixel-dot-shift location $X_{t=0}$. Nevertheless, the shift of the main-scan-start position by the distance corresponding to one-pixel-dot size, as mentioned above, cannot be carried out, because the initial one-pixel-dot-shift location $X_{t=0}$ corresponds to the origin of the X–Y coordinate system as shown in FIGS. 18 to 20.

Namely, the control proceeds from step 2121 to step 2122, in which it is determined whether or not a count number of the counter t is "0". Then, the control proceeds to step 2123 (t=0 at the initial stage), in which the count number of the counter t is incremented by "1".

Thereafter, the control returns from step 2123 to step 2115, in which it is monitored whether or not a next drawing-timing signal is detected by the system control circuit 78. When the production of the next drawing-timing signal is detected by the system control circuit 78, the control proceeds to step 2116, in which movement-distance data $C_x$ of the drawing table 18 is retrieved from the X-scale sensor 100 by the system control circuit 78.

At step 2117, it is determined whether or not the retrieved movement-distance data $C_x$ coincides with a clock-pulse-phase-shift location data $(X_{s=1})$. Note, in the example shown in FIGS. 18 to 20, $X_{s=1}$=400 µm. At this second stage, because $C_x \neq X_{s=1}$, the control proceeds from step 2117 to step 2121, in which it is further determined whether or not the retrieved movement-distance data $C_x$ coincides with one-pixel-dot-shift location data $(X_{t=1})$. Note, in the example shown in FIGS. 18 to 20, $X_{t=1}$=4 mm. At this second stage, since $C_x \neq X_{t=1}$, the control proceeds from step 2121 to step 2124, in which it is determined whether or not the entire drawing-operation is completed.

At the second stage, because the entire drawing-operation is not yet completed, the control again returns from step 2124 to step 2115. Namely, the routine comprising steps 2115, 2116, 2117, 2121 and 2124 is repeatedly executed until the retrieved movement-distance data $C_x$ coincides with the clock-pulse-phase-shift location data $(X_{s=1})$.

At step 2117, when the retrieved movement-distance data $C_x$ has coincided with the clock-pulse-phase-shift location data $(X_{s=1})$, the control proceeds from step 2117 to step 2125 through step 2118 (s≠0). At step 2125, it is determined whether the flag F is "1" or "0".

When the flag F is "1", i.e., when the drifted distance data (E) is negative (E<0), the control proceeds from step 2125 to step 2126, in which the outputting of the ten series of clock pulses (YCK-SFT1; ... ; YCK-SFT10) is switched over so that a phase of the clock pulses is delayed by π/5. For example, when the series of clock pulses YCK-SFT1 has been output from the inclination-correction circuit 84', the outputting of the series of clock pulses YCK-SFT1 is switched over to the outputting of the series of clock pulses YCK-SFT2.

On the other hand, when the flag F is "0", i.e., when the drifted distance data (E) is positive (E>0), the control proceeds from step 2125 to step 2127, in which the outputting of the ten series of clock pulses (YCK-SFT1; ... ; YCK-SFT10) is switched over so that a phase of the clock pulses is advanced by π/5. For example, when the series of clock pulses YCK-SFT1 has been output from the inclination-correction circuit 84', the outputting of the series of clock pulses YCK-SFT1 is switched over to the outputting of the series of clock pulses YCK-SFT10.

After the switching-over of the outputting of the series of clock pulses (YCK-SFT1; ... and YCK-SFT10) is carried out at step 2126 or step 2127, the control proceeds to step 2120, in which the count number of the counter s is incremented by "1". Then, the control proceeds to step 2121, in which it is further determined whether or not the retrieved movement-distance data $C_x$, which coincides with the clock-pulse-phase-shift location data $(X_{s=1})$, coincides with the one-pixel-dot-shift location data $(X_{t=1})$. Of course, at this stage, since $C_x \neq X_{t=1}$, the control proceeds from step 2121 to step 2124, in which it is determined whether or not the entire drawing-operation is completed.

At this stage, since the entire drawing-operation is not yet completed, the control further returns from step 2124 to step 2115. Namely, the routine comprising steps 2115, 2116, 2117, 2121, 2124, 2118, 2125, 2126, 2127 and 2120 is repeatedly executed until the retrieved movement-distance data $C_x$ coincides with the one-pixel-dot-shift location data $(X_{t=1})$.

At step 2121, when the retrieved movement-distance data $C_x$ coincides with the one-pixel-dot-shift location data $(X_{t=1})$, the control proceeds from step 2121 to step 2128 through step 2122 (t≠0). At step 2128, it is determined whether the flag F is "1" or "0".

When the flag F is "1", i.e., when the drifted distance data (E) is negative (E<0), the control proceeds from step 2128 to step 2129, in which the reading-timing of raster-graphic data from the bit-map memory 90A is delayed by a time required to read a one-pixel raster-graphic datum from the bit-map memory 90A. Namely, the main-scan-start position, at which the modulation of the scanning laser beams, based upon the raster-graphic data, is commenced, is shifted by a distance, corresponding to one-pixel-dot size $D_p$, toward the positive side of the Y-axis, as shown in FIG. 19.

On the other hand, when the flag F is "0", i.e., when the drifted distance data (E) is positive (E>0), the control proceeds from step 2128 to step 2130, in which the reading-timing of the raster-graphic data from the bit-map memory 90A is advanced by the time required to read the one-pixel raster-graphic datum from the bit-map memory 90A. Namely, the main-scan-start position, where the modulation of the scanning laser beams is commenced, is shifted by the distance, corresponding to one-pixel-dot size $D_p$, toward the negative side of the Y-axis.

After the shift of the main-scan-start position by one-pixel-dot size $D_p$ is carried out at step 2129 or step 2130, the control proceeds to step 2123, in which the count number of the counter t is incremented by "1". Then, the control further returns to step 2115. Namely, the routine comprising steps 2115, 2116, 2117, 2121, 2124, 2118, 2125, 2126, 2127, 2120, 2122, 2128, 2129, 2130 and 2123 is repeatedly executed until the entire sub-scanning operation is completed.

At step 2124, when the completion of the entire drawing-operation is confirmed, the control proceeds from step 2124 to step 2131, in which the drawing table 18 is returned to the initial position by driving the servo-motor 98. Thus, the execution of the drawing-operation is completed.

In the example shown in FIGS. 18 to 20, the inclination correction is carried out so that the sub-scanning-lines, which are inclined with respect to the Y-axis, are extended along the X-axis perpendicular to the Y-axis. Nevertheless, it is frequently demanded that a pattern is drawn so as to conform to a quardrilateral area defined by the positioning-marks provided at the four corners of the workpiece. In this case, although the quardrilateral area defined by the positioning-marks is not an exact quardrilateral area, the pattern to be drawn must necessarily conform to the required area. Namely, although a side of the quadrilateral area is inclined with respect to the Y-axis, the pattern must be drawn such that the sub-scanning lines extend in parallel with the inclined side of the quadrilateral area. According to the present invention, a relative inclination correction may be introduced into a drawing operation to extend the sub-scanning-lines in parallel with the inclined side of the quardrilateral area.

Figure 24:
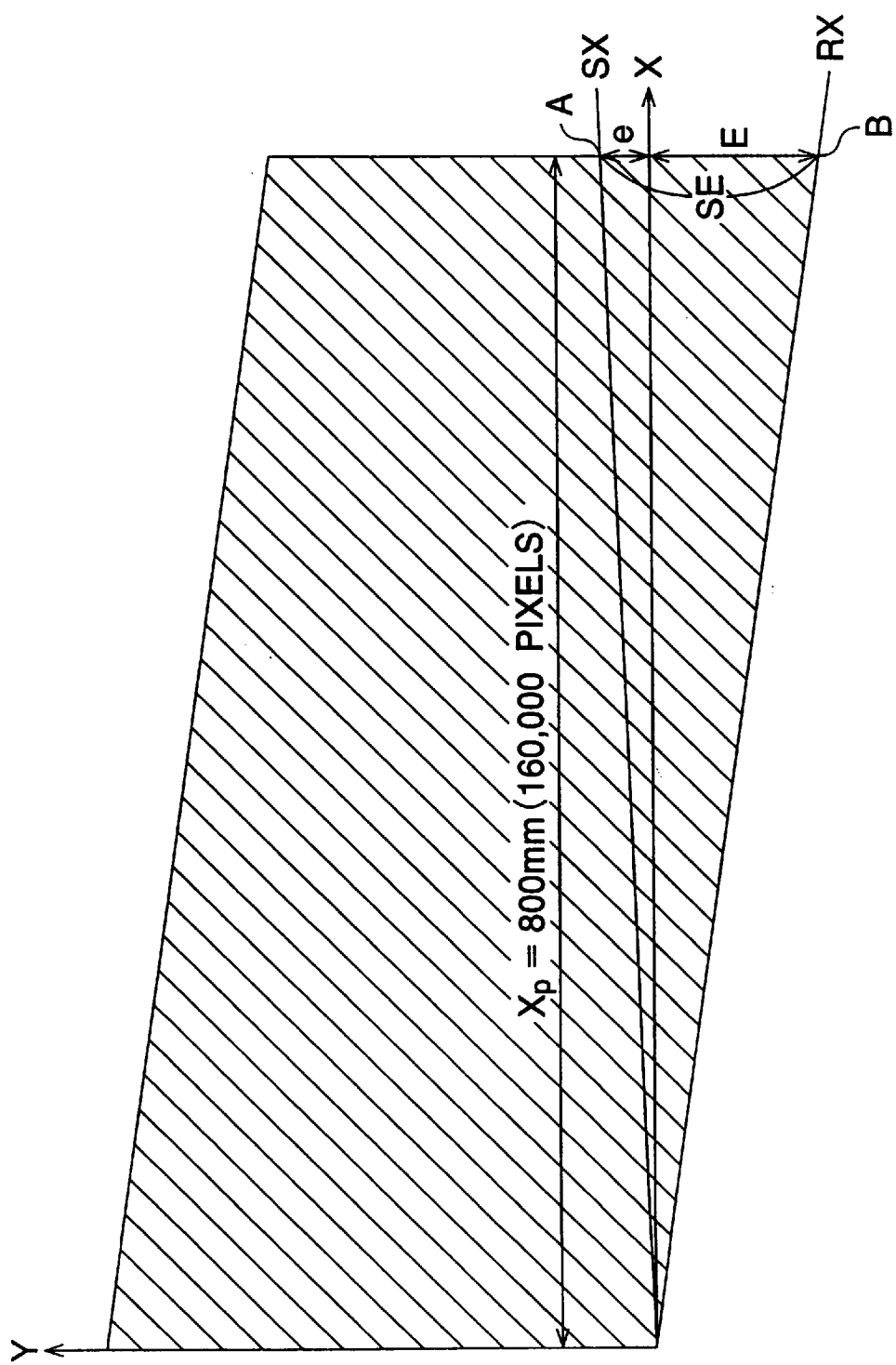
FIG. 24 is a graph, similar to the graph of FIG. 18, to which a positively-inclined axis of an inexact square area defined by positioning-marks of a workpiece is added, and in which a relative inclination-correction is introduced to approximate the sub-scan-line to the positively-inclined axis.
Figure 25:
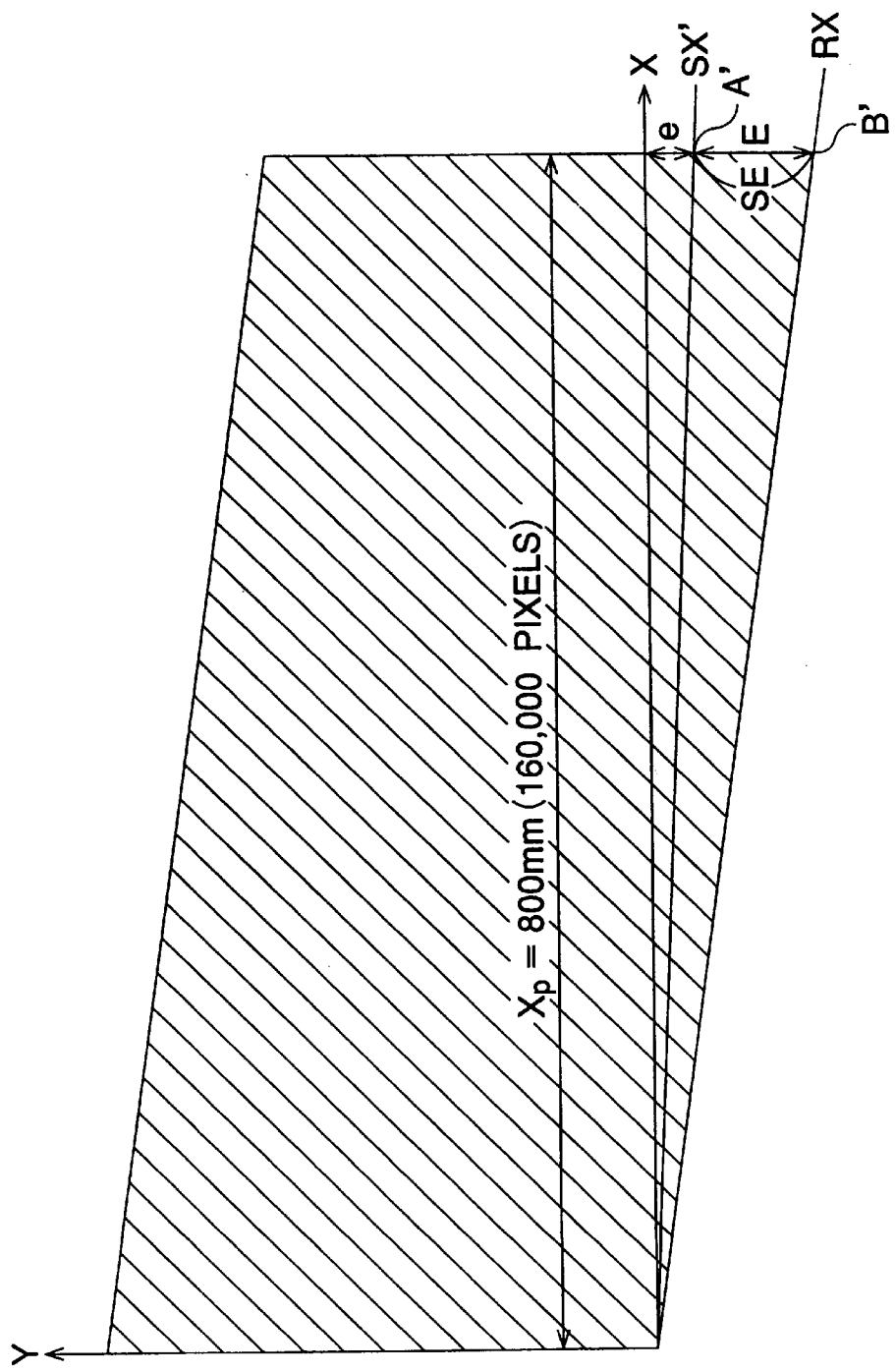
FIG. 25 is a graph, similar to the graph of FIG. 18, to which a negatively-inclined axis of an inexact square area defined by positioning-marks of a workpiece is added, and in which a relative inclination-correction is introduced to approximate the sub-scan-line to the negatively-inclined axis.

With reference to FIGS. 24 and 25, a principle of the relative inclination correction according to the present invention will be now explained below.

FIG. 24 is the same drawing as FIG. 18 except that an axis SX, which represents the inclined side of the quadrilateral area defined by the positioning-marks of the workpiece, is written therein. The axis SX deviates from the X-axis toward the positive side of the Y-axis. A degree of the deviation is indicated as a deviated distance e, on a boundary of the rectangular or parallelogram solid pattern shown by the hatched area. In this case, the inclined axis RX may be approximated to the axis SX as a zigzag line, in the same manner as shown in FIG. 19.

In particular, similar to the inclination correction shown in FIGS. 18 to 20, the sub-scanning range ($X_p$) is divided into sections, each section having a distance $X_a$ as defined by the following formula:

$$X_a = X_p * D_p / |SE| (SE = |E| + |e|)$$

The distance SE is calculated on the basis of the X–Y coordinates of a point A and the coordinates of a point B as shown in FIG. 24. Note, the point A represents one of the positioning-marks of the workpiece, and the point B represents one of the corners of the parallelogram solid pattern.

Also, FIG. 25 is the same drawing as FIG. 18 except that an axis SX', which represents the inclined side of the quardrilateral area defined by the positioning-marks of the workpiece, is written therein. In this case, the axis SX' deviates from the X-axis toward the negative side of the Y-axis, and a degree of the deviation is indicated as a deviated distance e, on a boundary of the parallelogram solid pattern shown by the hatched area. In this case, the inclined axis RX also may be approximated to the axis SX' as a zigzag line, in the same manner as shown in FIG. 19.

In particular, a distance $X_a$, into which the rough inclination correction is introduced, is defined as follows:

$$X_a = X_p * D_p / |SE| (SE = |E| - |e|)$$

Note, the distance SE is calculated on the basis of the coordinates of a point A' and the coordinates of a point B' as shown in FIG. 25. Note, similar to the case of FIG. 24, the point A' represents one of the positioning-marks of the workpiece, and the point B' represents one of the corners of the rectangular solid pattern.

In the relative inclination correction, a one-pixel-dot-shift location $X_t$, where the main-scan-start position should be shifted by the distance corresponding to one-pixel-dot size, is defined by the following formula:

$$X_t = X_a * t \ (t: integer)$$

Also, a clock-pulse-phase-shift-location $X_s$, where the phase of the outputted clock pulses (YCK-SFT1; . . .; YCK-SFT10) should be shifted, is defined by the following formula:

$$X_s = (X_a/n) * s \ (s: integer)$$

Note, of course, in both the formulas, $X_a = X_p * D_p / |SE|$.

Figure 26:
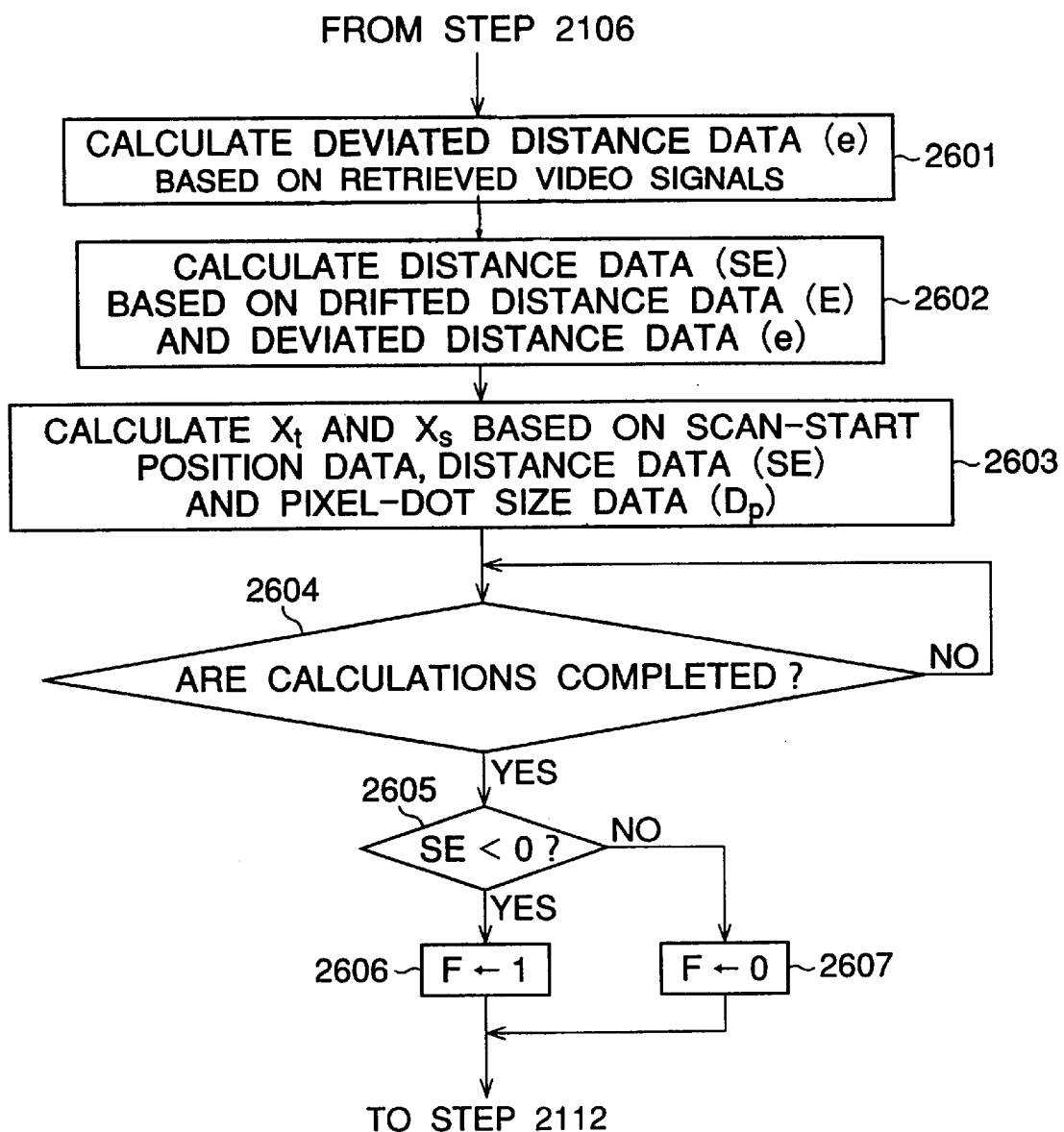
FIG. 26 is a part of a flowchart showing a drawing operation routine with the relative inclination-correction, shown in FIGS. 24 and 25, executed in the second embodiment of the laser drawing apparatus according to the present invention.

A drawing operation routine, in which the relative inclination correction as mentioned above is introduced, is similar to that outlined in the flowchart shown in FIGS. 21 to 23. Namely, the drawing operation routine with the relative inclination correction can be obtained by replacing steps 2107 to 2111, of FIG. 21, with steps 2601 to 2607, of FIG. 26.

At step 2601, a deviated distance data e is calculated on the basis of the video signals of the positioning-marks of the workpiece. Namely, the X–Y coordinates of each positioning-mark are calculated from the video signals of the corresponding positioning mark. Then the deviated distance data e is calculated based on the X–Y coordinates of the positioning-marks.

At step 2602, one-pixel-dot-shift location data ($X_t$) and clock-pulse-phase-shift location data ($X_s$) are calculated on the basis of the scan-start position data, the distance data (SE) and the pixel-dot size data ($D_p$). The calculated location data ($X_t, X_s$) are also temporarily stored in the RAM of the system control circuit 78.

At step 2604, it is determined whether or not the calculations have been completed. When the completion of the calculations is confirmed, the control proceeds from step 2604 to step 2605, in which it is determined whether the distance data (SE) is negative or positive.

When the distance data (SE) is negative (SE<0), the control proceeds from step 2605 to step 2606, in which a flag F is set to "1". On the other hand, when the distance data (SE) is positive (SE>0), the control proceeds from step 2605 to step 2607, in which the flag F is set to "0". Then, the control proceeds to step 2112 of FIG. 21. Thus, the inclined axis RX representing the inclined sub-scanning-lines can be approximated to the axis SX or SX' as a fine zigzag line, as shown in FIG. 20.

Figure 27:
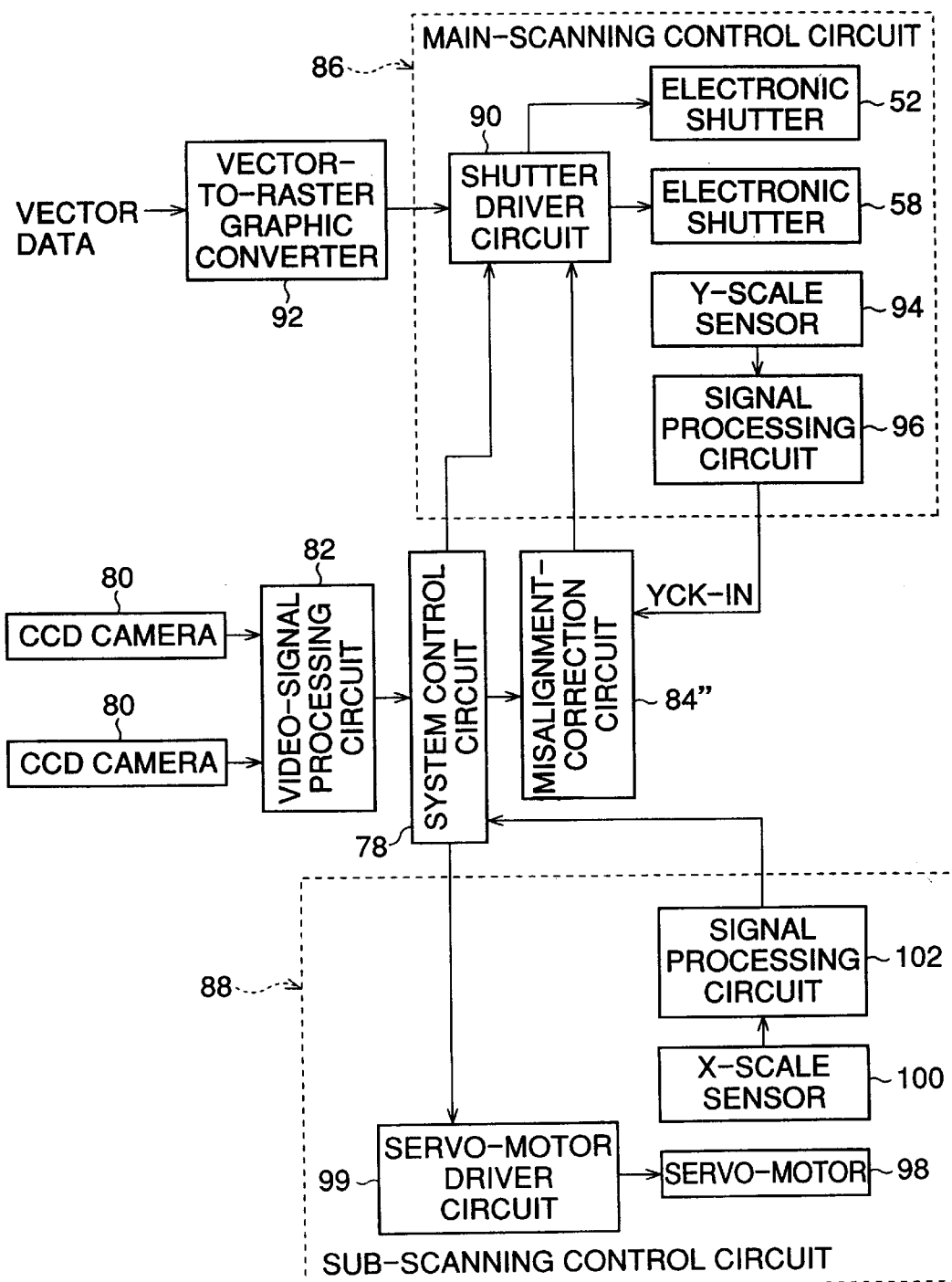
FIG. 27 is a block diagram of a third embodiment of the laser drawing apparatus according to the present invention.

FIG. 27 shows a block diagram of a third embodiment of the laser drawing apparatus according to this invention, in which a misalignment correction, for correcting a misalignment of pixel dots along the sub-scanning lines, is performed with a unit of less than one-pixel size with respect to a pattern to be drawn. Note, in FIG. 27, the features similar to those of FIG. 3 are indicated by the same reference numerals.

In the block diagram of FIG. 27, similar to the above-mentioned second embodiment, a misalignment-correction circuit 84" has substantially the same arrangement as that of the Y-axis pixel-pitch correction circuit 84Y shown in FIG. 4. Namely, any one of the ten-series of clock pulses:

YCK-SFT1; YCK-SFT2; YCK-SFT3; YCK-SFT4; YCK-SFT5; YCK-SFT6; YCK-SFT7; YCK-SFT8; YCK-SFT9; and YCK-SFT10, is selectively output from the misalignment-correction circuit 84" to the synchronizing circuit 90B (FIG. 8) included in the shutter driver circuit 90 of the main-scanning control circuit 86. Thus, the outputting of the ten series of clock pulses (YCK-SFT1; . . . and YCK-SFT10) is switched over by the combination of the output levels of the selection-signals Y-SEL1, Y-SEL2, Y-SEL3 and Y-SEL4, as shown in TABLE 1.

In the third embodiment, the servo-motor 98 is driven in the same manner as in the second embodiment. Namely, a series of clock pulses, output from the signal processing circuit 102, is directly input to the system control circuit 78. The system control circuit 78 outputs a series of clock pulses to the servo-motor driver circuit 99, on the basis of the clock pulses input from the signal processing circuit 102. Then, the servo-motor driver circuit 99 outputs a series of drive pulses to the servo-motor 98 in accordance with the series of clock pulses input from the system control circuit 78.

With reference to FIGS. 28 to 36, a principle of the misalignment correction according to the present invention will now be explained below.

Figure 28:
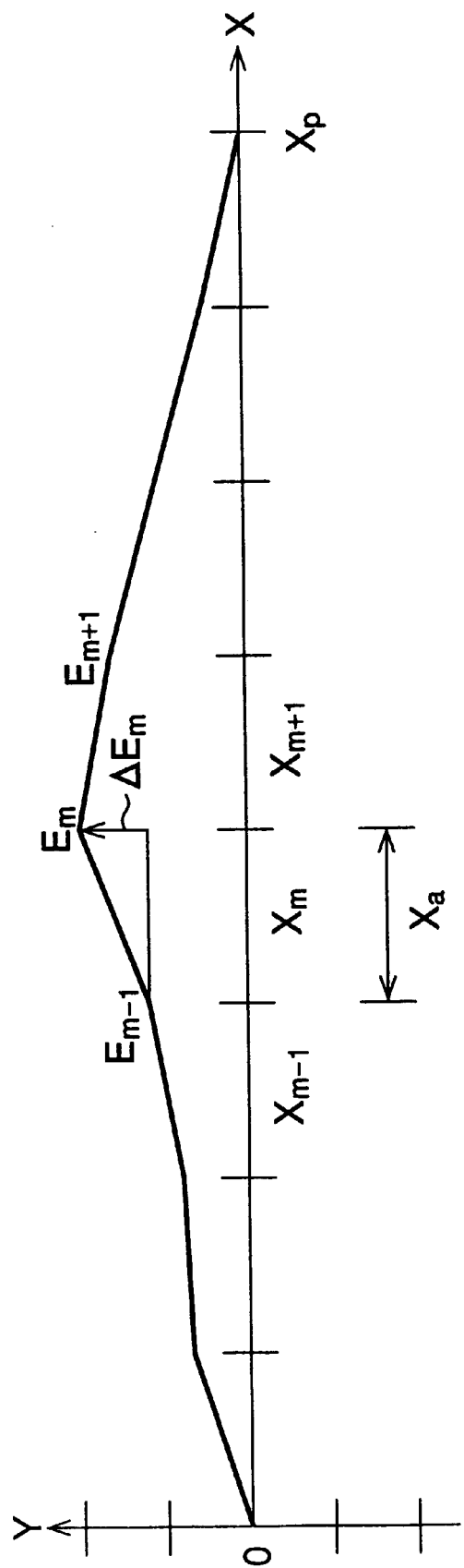
FIG. 28 is a graph representing a misalignment of pixel-dots arranged in a sub-scan-line.

FIG. 28 shows a graph representing a degree of a misalignment of pixel-dots arranged in the sub-scanning direction (X-axis). In this graph, reference $X_p$ indicates a distance of the sub-scanning range in which the sub-scanning lines are included. As mentioned above, when one-pixel-dot size is indicated by $D_p$, a number of pixel-dots, which are arranged in each of the sub-scanning lines in the sub-scanning range, is represented by $X_p/D_p$. For example, if the distance $X_p$ of the sub-scanning range is 480 mm, and if one-pixel-dot size is 5 μm, 96,000 pixel-dots are arranged along each sub-scanning-line of the sub-scanning range of 480 mm. In other words, 96,000 main-scanning lines are included in the sub-scanning range of 480 mm.

In this case, although the 96,000 pixel-dots should be inherently aligned with each other along each of the sub-scanning lines, the alignment of the pixel-dots along the sub-scanning lines cannot be actually obtained due to assembly errors produced during manufacture of the laser drawing apparatus. In other words, the 96,000 main-scanning lines included in the sub-scanning range are irregularly shifted along the Y-axis, resulting in the misalignment of the pixel-dots along each of the sub-scanning lines. In short, the graph of FIG. 28 represents a characteristic of the misalignment of the pixel-dots in the sub-scanning direction.

According to the present invention, the misalignment correction comprises a rough misalignment correction and a fine misalignment correction. In the rough misalignment correction, a misalignment of pixel-dots in the sub-scanning direction is corrected with a unit of one-pixel-dot size. In the fine misalignment correction, a misalignment of pixel-dots is corrected with a unit of less than one-pixel-dot size.

First, for the rough misalignment correction, the sub-scanning range is equally divided into a suitable integer number, "a", of sections indicated by references . . . , $X_{m-1}$, $X_m$, $X_{m+1}$ . . . , respectively. Each section has a distance of $X_a$ In the above-mentioned example, if a=8, the main-scanning-range of 480 mm is divided into eight sections, each of which has a distance of 60 mm. In this case, 12,000 main-scanning lines are included in each of the divided sections ($X_m$). The rough misalignment correction is introduced into the 12,000 main-scanning lines included in each of the sections ($X_m$).

In the graph of FIG. 28, degrees of misalignment on the boundaries of the sections (Em) are represented by . . . , Em−1, Em, Em+1 . . . , respectively. Each of the sections (Xm) exhibits a relative misalignment $\Delta E_m$ as defined by the following formula:

$$\Delta E_m = E_m - E_{m-1}$$

Also, a ratio $\Delta TX_m$ of the relative misalignment $\Delta E_m$ to the distance $X_a$ of the section ($E_m$) is defined as follows:

$$\Delta TX_m = \Delta E_m / X_a$$

Similar to the above-mentioned embodiments, the degrees of misalignment ( . . . , Em−1, Em, Em+1 . . . ) on the boundaries of the sections (Em) are actually measured. The degrees of misalignment, together with the pixel-dot size data (Dp), are stored as misalignment data in a non-volatile memory, such as an electrically erasable read only memory (EEROM), provided in the system control circuit 78. Of course, the misalignment data and the pixel-dot size data may be stored in the ROM of the system control circuit 78, if necessary.

Figure 29:
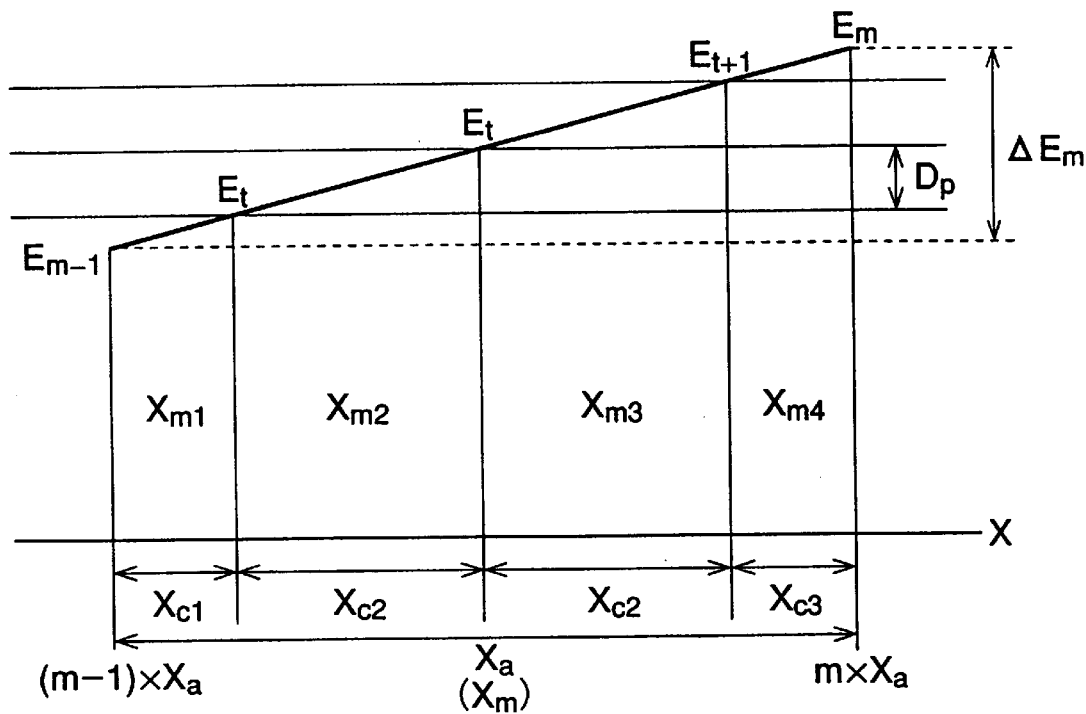
FIG. 29 is a conceptual view illustrating a principle of rough misalignment correction, according to the present invention, for roughly correcting the misalignment of pixel-dots as shown in FIG. 28.

To introduce the rough misalignment correction into the section ($E_m$), the relative misalignment $\Delta E_m$ is gauged with the unit of $D_p$, as shown in FIG. 29. The section ($E_m$) is further divided into sub-sections $X_{m1}$, $X_{m2}$, $X_{m3}$ and $X_{m4}$, on the basis of the gauging of the relative misalignment $\Delta E_m$ with the unit of one-pixel-dot size $D_p$. In this case, the sub-section $X_{m1}$ has a distance $X_{c1}$; each of the sub-sections $X_{m2}$ and $X_{m3}$ has a distance $X_{c2}$; and the sub-section $X_{m4}$ has a distance $X_{c3}$. The respective distances $X_{c1}$, $X_{c2}$ and $X_{c3}$ of the sub-sections $X_{m1}$, $X_{m2}$, $X_{m3}$ and $X_{m4}$ are defined by the following formulas:

$$X_{c1} = (D_p - mod[E_{m-1}/D_p]) / \Delta TX_m$$

$$X_{c2} = D_p / \Delta TX_m$$

$$X_{c3} = mod[E_m/D_p] / \Delta TX_m$$

Herein, "mod[ . . . ]" represents the remainder of the bracketed division.

Note, in the above-mentioned example, the 12,000 main-scanning lines included in the section ($X_m$) are shared among the sub-sections $X_{m1}$, $X_{m2}$, $X_{m3}$ and $X_{m4}$, such that: 2,000 of the main-scanning lines are included in the sub-section $X_{m1}$, having a distance of 10 mm; 4,000 of the main-scanning lines are included in each of the sub-sections $X_{m2}$ and $X_{m3}$, having a distance of 20 mm; and 2,000 of the main-scanning lines are included in the sub-section $X_{m4}$, having a distance of 10 mm.

As shown in FIG. 29, at each trailing end of the sub-sections $X_{m1}$, $X_{m2}$, and $X_{m3}$, the degree of the misalignment of the pixel-dots, in each sub-section, corresponds to an integer number of times of the one-pixel-dot size $D_p$. The rough misalignment correction is performed at each trailing end of the sub-sections $X_{m1}$, $X_{m2}$, and $X_{m3}$. On the other hand, at the trailing end of the sub-section $X_{m4}$, because the degree of the misalignment of the pixel-dots in the sub-section $X_{m4}$ does not correspond to an integer number of times of pixel-dot size $D_p$, the rough misalignment correction is not performed at the trailing end of the sub-section $X_{m4}$.

The rough misalignment correction is substantially identical to the rough inclination correction performed in the second embodiment of the present invention. Namely, the rough misalignment correction, based on a unit of one-pixel-dot size $D_p$, is made possible by controlling a reading-timing of the raster-graphic data from the bit-map memory 90A (FIG. 8).

In particular, during the movement of the workpiece in the sub-scanning direction, whenever the workpiece is scanned with one of the deflected laser beams at a location corresponding to each trailing end of the sub-sections $X_{m1}$, $X_{m2}$, and $X_{m3}$, the main-start-position is shifted by a distance corresponding to one-pixel-dot size $D_p$. The main-start-position is where a modulation of the corresponding laser beam, based upon a raster-graphic datum, is commenced. The shift of the main-scan-start position, by the distance corresponding to one-pixel-dot size $D_p$, is carried out by delaying or advancing the reading-timing of the raster-graphic datum from the bit-map memory 90A, by a tine required to read the one-pixel raster-graphic datum from the bit-map memory 90A.

Note, in the case shown in FIGS. 28 and 29, because the misalignment of the pixel-dots is produced at the positive side of the Y-axis, the reading-timing of the raster-graphic datum, from the bit-map memory 90A, is advanced by the time required to read the one-pixel raster-graphic datum from the bit-map memory 90A. Of course, when the misalignment of the pixel-dots is produced at the negative side of the Y-axis, the reading-timing of the raster-graphic datum, from the bit-map memory 90A, is delayed by the time required to read the one-pixel raster-graphic datum from the bit-map memory 90A.

Figure 30:
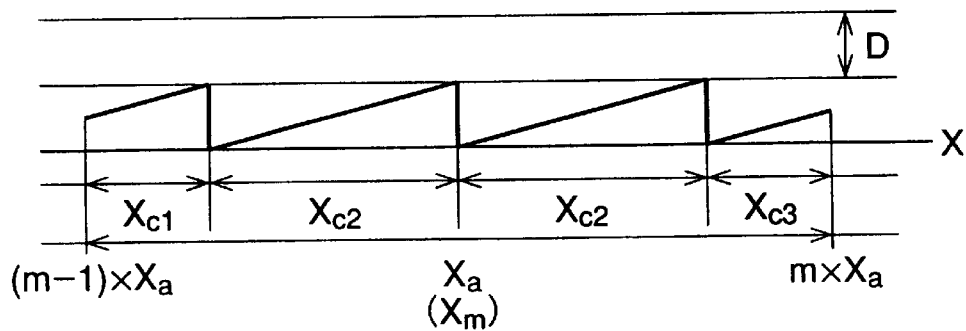
FIG. 30 is a conceptual view, corresponding to FIG. 29, showing results of the rough misalignment correction.

When the rough misalignment correction is performed, the misalignment of the pixel-dots in the sub-scanning direction is corrected to be approximated to the X-axis as a zigzag line, as shown in FIG. 30.

A number of times f(m), that the rough misalignment correction, based on a unit of one-pixel-dot size $D_p$, should be carried out in each of the sections ( . . . , $X_{m-1}$, $X_m$, $X_{m+1}$ . . . ) is defined by the following formula:

$$f(m) = int[E_m/D_p] - int[E_{m-1}/D_p]$$

Herein, "int[ . . . ]" represents the quotient of the bracketed division.

Also, a one-pixel-dot-shift location $DX_t$, where the rough misalignment correction, based on a unit of one-pixel-dot size $D_p$, should be carried out and which is measured from the sub-scan-start position, is defined by the following formula:

$$DX_t = (m-1)*X_a + X_{c1} + i*X_{c2}$$

Herein, $$t = \sum_{m=0}^{m-1} |f(m)| + i, \quad 0 \le i \le f(m) \text{ integer})$$

In FIG. 29, respective degrees of the misalignment of the pixel-dots at the one-pixel-dot-shift locations $DX_t$ are indicated by references . . . , $E_{t-1}$, $E_t$, $E_{t+1}$ . . . , and the misalignment data ($E_t$) is either negative or positive. The above-mentioned non-volatile memory (EEROM) or the ROM of the system control circuit 78, further stores negative/positive data representing whether the misalignment data ($E_t$) is either negative or positive.

According to the present invention, a fine misalignment correction is further introduced into each of the sub-sections $X_{m1}$, $X_{m2}$, $X_{m3}$ and $X_{m4}$. To this end, a relative misalignment of each of the sub-sections $X_{m1}$, $X_{m2}$, $X_{m3}$ and $X_{m4}$ is gauged with a unit ($D_p/n$) of less than one-pixel-dot size. Each of the sub-sections $X_{m1}$, $X_{m2}$, $X_{m3}$ and $X_{m4}$, is then further divided into mini-sections on the basis of the gauging of the relative misalignment of each sub-section $X_{m1}$, $X_{m2}$, $X_{m3}$, $X_{m4}$.

Figure 31:
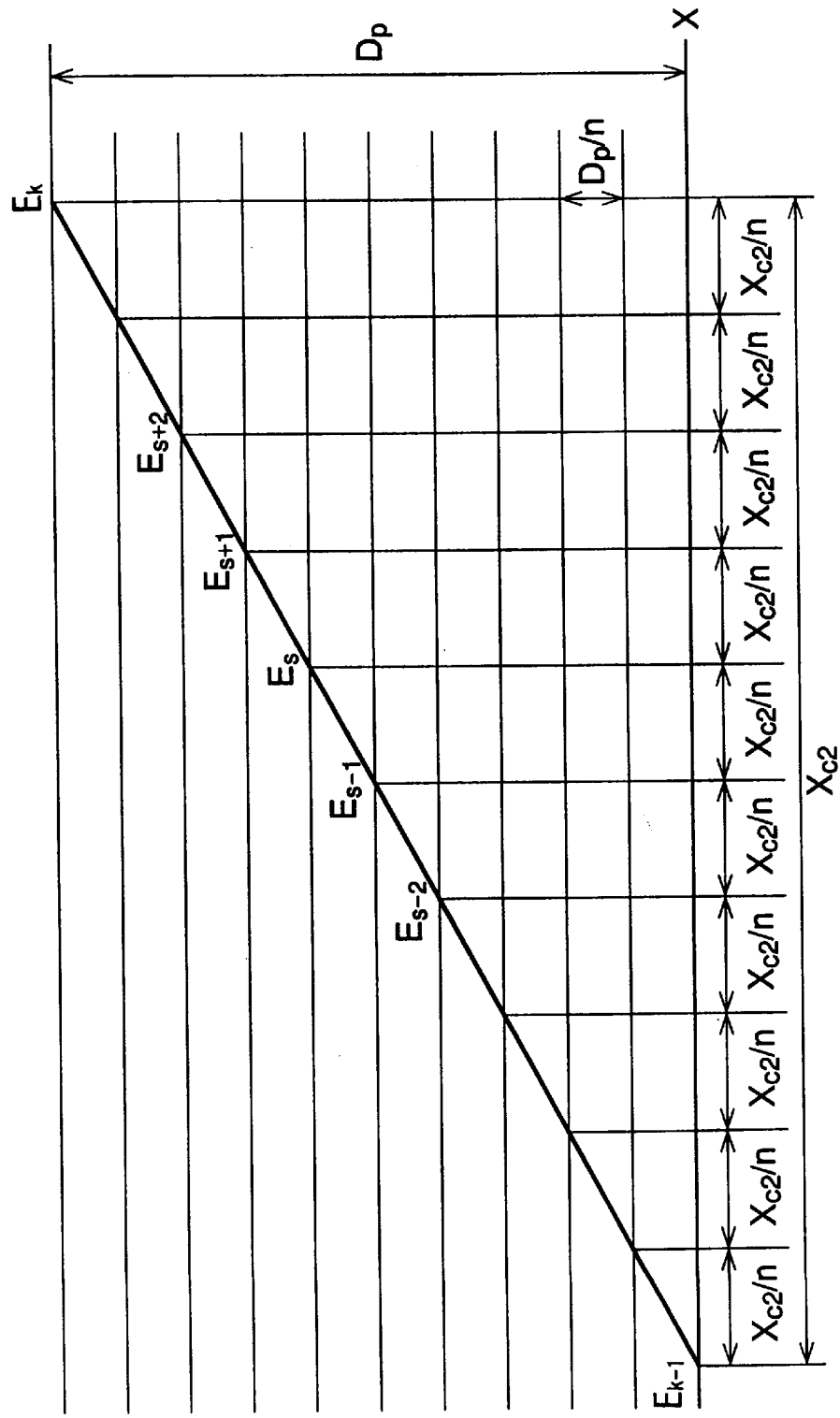
FIG. 31 is a part of a conceptual view illustrating a principle of fine misalignment correction, according to the present invention, for finely correcting the misalignment of pixel-dots as shown in FIG. 28.

In particular, as shown in FIG. 31, the sub-section ($X_{m2}$, $X_{m3}$) having the distance $X_{c2}$ is divided into the mini-sections, each of which has a distance of $X_{c2}/n$. Similar to the embodiments as mentioned above, because the ten series of clock pulses (YCK-SFT1; . . . and YCK-SFT10) are used for the fine misalignment correction, n=10. Thus, in the sub-section ($X_{m2}$, $X_{m3}$) having the degree of the relative misalignment corresponding to one-pixel-dot size $D_p$, the ten mini-sections, each having the distance of $X_{c2}/10$, are obtained. Note, in the above-mentioned example, the distance of $X_{c2}/10$ is 2 mm.

As shown in FIG. 31, at each trailing end of the mini-sections, the degree of the misalignment of the pixel-dots in each mini-section corresponds to an integer number of times of a unit of $D_p/10$. The fine misalignment correction is performed at each trailing end of the mini-sections.

The fine misalignment correction is substantially identical to the fine inclination correction performed in the second embodiment of the present invention. Namely, the fine misalignment correction, based on a unit of $D_p/10$, is made possible by successively switching over the outputting of the ten series of clock pulses (YCK-SFT1; . . . and YCK-SFT10) from the inclination-correction circuit 84" to the synchronizing circuit 90B (FIG. 8).

In particular, during the movement of the workpiece in the sub-scanning direction, whenever the workpiece is scanned with one of the deflected laser beams at a location corresponding to each trailing end of the mini-sections, the outputting of the ten series of clock pulses (YCK-SFT1; . . . and YCK-SFT10) is successively switched over. The switch over is made so that a phase of the output clock pulses (YCK-SFT1; . . . ; YCK-SFT10) is shifted by $\pi/5$.

Figure 32:
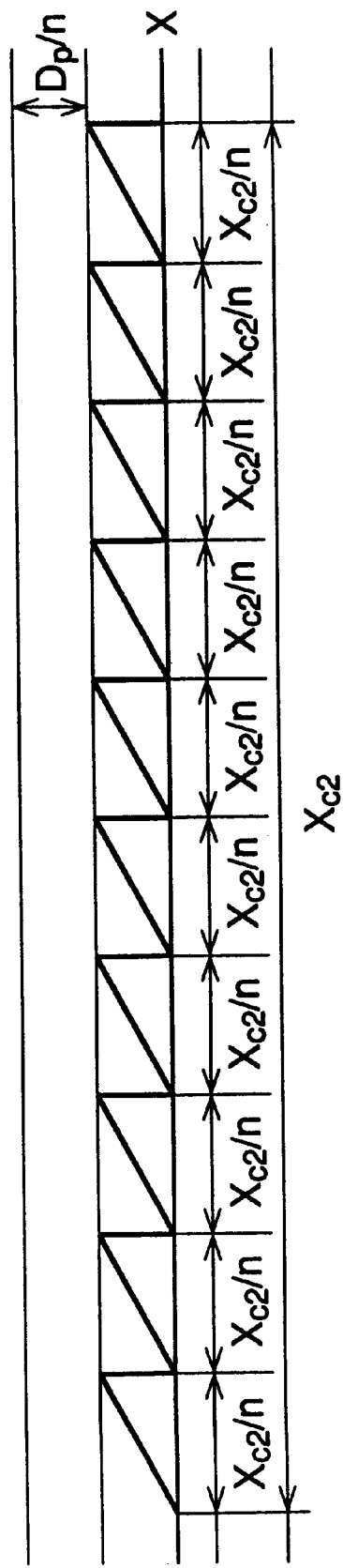
FIG. 32 is a conceptual view, corresponding to FIG. 30, showing results of the fine misalignment correction.

Note, in the case shown in FIGS. 28 and 29, because the misalignment of the pixel-dots is produced at the positive side of the Y-axis, the switching-over of the outputting of the ten series of clock pulses (YCK-SFT1; . . . and YCK-SFT10) is carried out so that a phase of the output clock pulses (YCK-SFT1; . . . ; YCK-SFT10) is advanced by $\pi/5$. The switch over results in achieving the fine misalignment correction based upon a unit of $D_p/10$, as shown in FIG. 32. Namely, the misalignment of the pixel-dots in the sub-section ($X_{m2}$, $X_{m3}$) is corrected so as to be approximated to the X-axis as a fine zigzag line, as shown in FIG. 32.

On the contrary, if the misalignment of the pixel-dots in the sub-section ($X_{m2}$, $X_{m3}$) is produced at the negative side of the Y-axis, the switching-over of the outputting of the ten series of clock pulses (YCK-SFT1; . . . and YCK-SFT10) is carried out so that a phase of the output clock pulses (YCK-SFT1; . . . ; YCK-SFT10) is delayed by $\pi/5$ for the fine misalignment correction.

Figure 33:
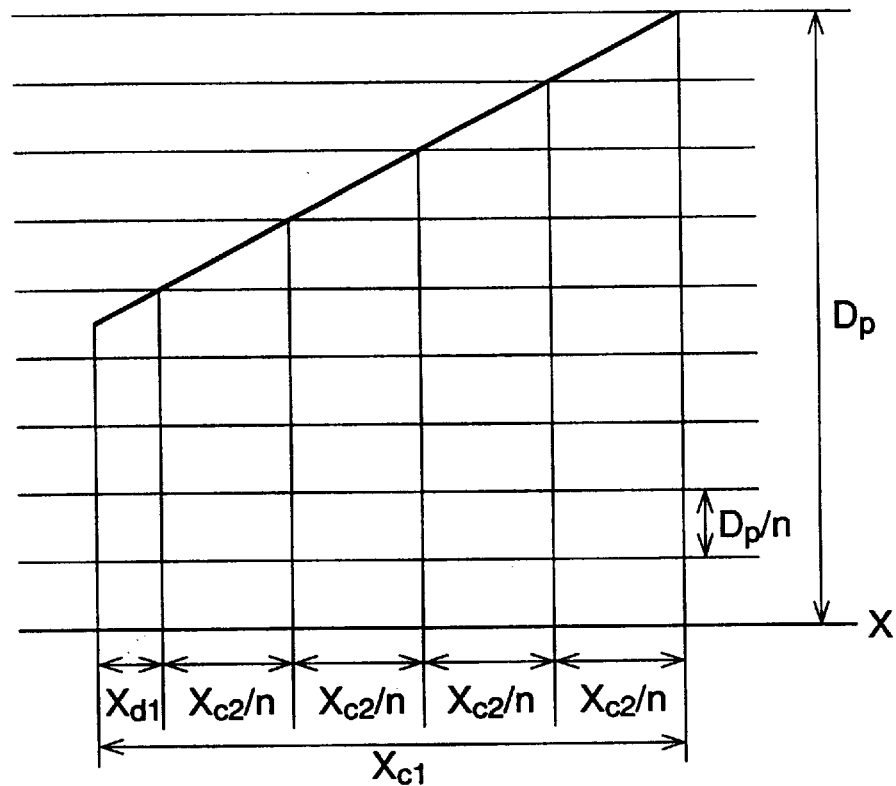
FIG. 33 is another part of the conceptual view illustrating the principle of fine misalignment correction, according to the present invention, for finely correcting the misalignment of pixel-dots as shown in FIG. 28.

Also, the sub-section $X_{m1}$, having the distance $X_{c1}$, is divided into the mini-sections on the basis of gauging the relative misalignment of the sub-section $X_{m1}$ with a unit of $D_p/10$, as shown in FIG. 33. Each of the mini-sections, exclusive of the leftmost mini-section in FIG. 33, has a distance of $X_{c2}/10$. The distance is $X_{c2}/10$ because the characteristic representing the degree of the misalignment of the pixel dots in the sub-section $X_{m1}$ has the same slope as the characteristic representing the degree of the misalignment of the pixel dots in the sub-section $X_{m2}$ or $X_{m3}$.

Note, a distance of the leftmost mini-section is indicated by $X_{d1}$, and the distance $X_{d1}$ is defined by the following formula:

$$X_{d1} = mod[X_{c1}/(X_{c2}/n)]$$

Herein, "mod[ . . . ]" represents the remainder of the bracketed division. Note, in the above-mentioned example, the distance of $X_{d1}$ is 1 mm.

Figure 34:
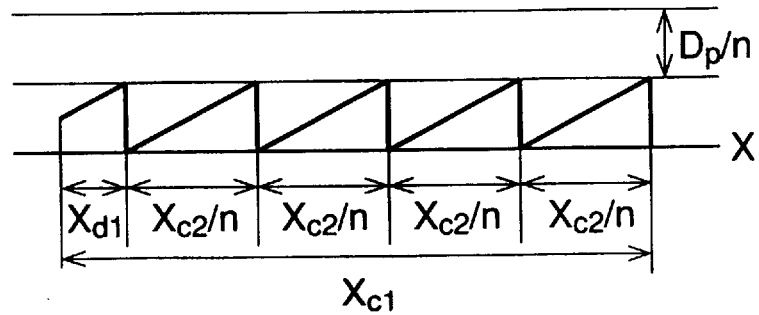
FIG. 34 is a conceptual view, corresponding to FIG. 33, showing results of the fine misalignment correction.

As shown in FIG. 33, at each trailing end of the mini-sections in the sub-section $X_{m1}$, the degree of the misalignment of the pixel-dots in each mini-section corresponds to an integer number of times of a unit of $D_p/10$. The fine misalignment correction is performed at each trailing end of the mini-sections in the same manner as mentioned above. Thus, the misalignment of the pixel-dots in the sub-section $X_{m1}$ is corrected to be approximated to the X-axis by a fine zigzag line, as shown in FIG. 34.

Figure 35:
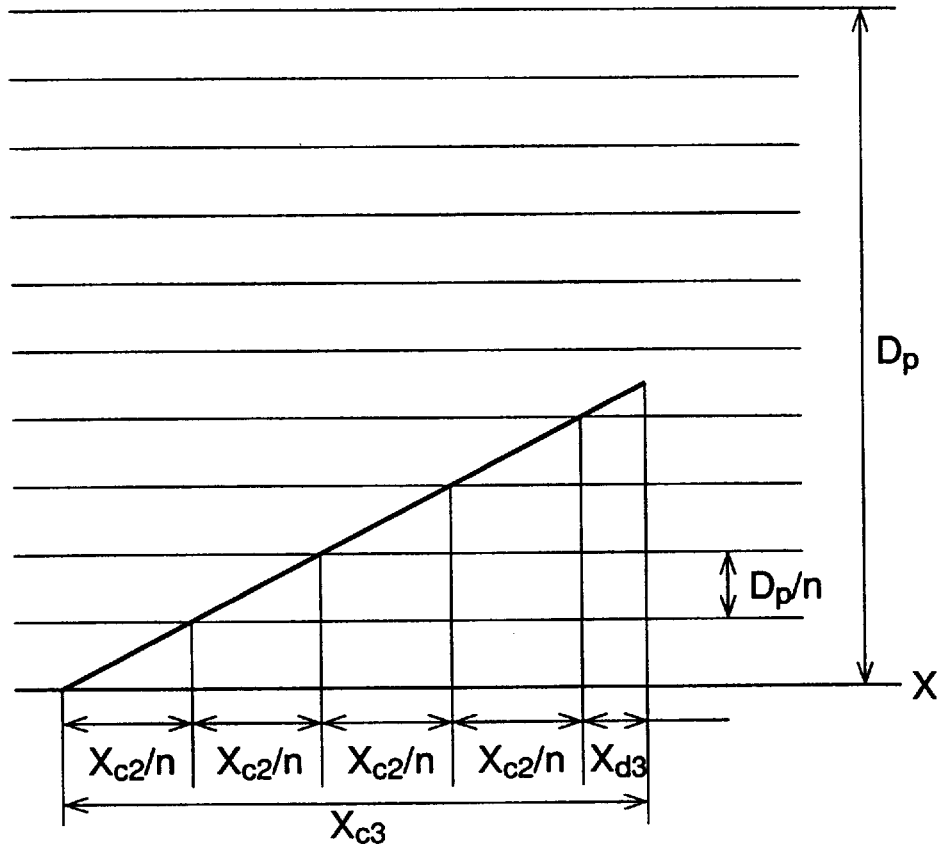
FIG. 35 is the remaining part of the conceptual view illustrating the principle of fine misalignment correction, according to the present invention, for finely correcting the misalignment of pixel-dots as shown in FIG. 28.

Further, the sub-section $X_{m4}$, having the distance $X_{c3}$, is divided into the mini-sections on the basis of gauging the relative misalignment of the sub-section $X_{m4}$ with a unit of $D_p/10$, as shown in FIG. 35. Each of the mini-sections, exclusive of the rightmost mini-section in FIG. 35, has a distance of $X_{c2}/10$ for the same reason as mentioned above. Note, a distance of the rightmost mini-section is indicated by $X_{d3}$, and the distance $X_{d3}$ is defined by the following formula:

$$X_{d3}=mod[X_{c3}/(X_{c2}/n)]$$

Herein, "mod[ . . . ]" represents the remainder of the bracketed division. Note, in the above-mentioned example, the distance of $X_{d3}$ is 1 mm.

Figure 36:
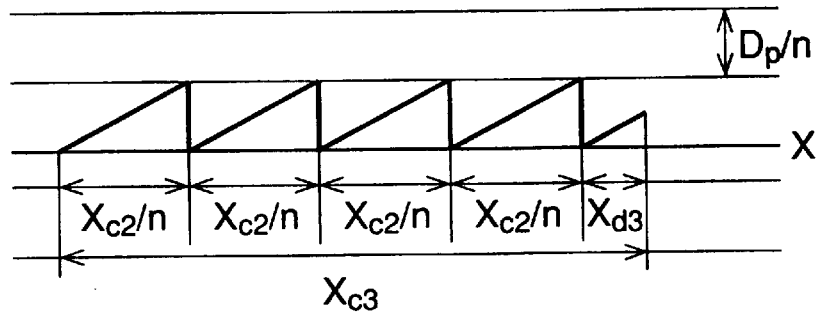
FIG. 36 is a conceptual view, corresponding to FIG. 35, showing results of the fine misalignment correction.

As shown in FIG. 35, at each trailing end of the mini-sections, exclusive of the rightmost mini-section having the distance of $X_{d3}$, the degree of the misalignment of the pixel-dots in each mini-section corresponds to an integer number of times of a unit of $D_p/10$. The fine misalignment correction is performed at each trailing end of the mini-sections, exclusive of the rightmost mini-section having the distance of $X_{d3}$, in the same manner as mentioned above. Thus, the misalignment of the pixel-dots in the sub-section $X_{m4}$ is corrected to be approximated to the X-axis by a fine zigzag line, as shown in FIG. 36.

Note, at the trailing end of the mini-section having the distance of $X_{d3}$, the fine misalignment correction is not executed, because the degree of the misalignment in the mini-section concerned does not correspond to an integer multiple of the unit $D_p/10$.

A number of times f(k) that the fine misalignment correction, based on a unit of $D_p/n$, should be carried out in each of the sub-sections $X_{m1}$, $X_{m2}$, $X_{m3}$ and $X_{m4}$, is defined by the following formula:

$$f(k)=int[E_k*n/D_p]-int[E_{k-1}*n/D_p]$$

Herein, "int[ . . . ]" represents the quotient of the bracketed division, and "$E_k$ and $E_{k-1}$" represent degrees of misalignment on boundaries of the sub-section ($X_{m1}$, $X_{m2}$, $X_{m3}$, $X_{m4}$), as shown in FIG. 31 by way of example.

Also, a clock-pulse-phase-shift location $DX_s$, where the fine misalignment correction, based on a unit of $D_p/n$, should be carried out and which is measured from the sub-scan-start position, is defined by the following formula:

$$DX_s=(m-1)*X_a+X_{d1}+j*X_{d2}$$

Herein, $$s = \sum_{k=0}^{k-1} |f(k)| + j, \quad 0 \leq j \leq f(k) \ (j : \text{integer})$$

In FIG. 31, respective degrees of the misalignment of the pixel-dots at the clock-pulse-phase-shift locations $DX_s$ are indicated by references . . . , $E_{s-1}$, $E_s$, $E_{s+1}$ . . . . The misalignment data ($E_s$) is either negative or positive.

Further, the above-mentioned non-volatile memory (EEROM) or the ROM of the system control circuit 78 stores the negative/positive data representing whether the misalignment data ($E_s$) is either negative or positive.

Figure 37:
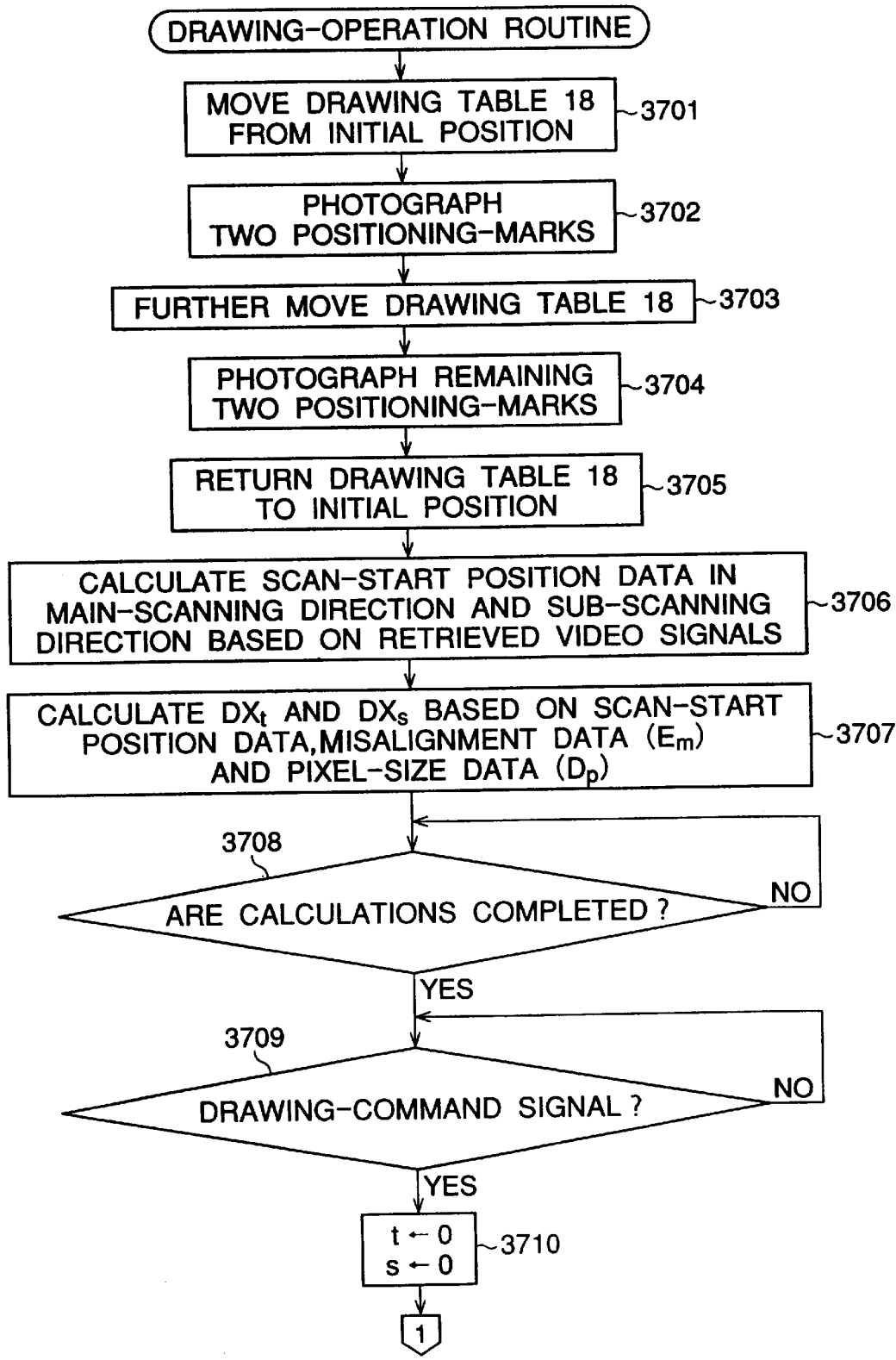
FIG. 37 is a part of a flowchart showing a drawing operation routine with the misalignment-correction, executed in the third embodiment of the laser drawing apparatus according to the present invention.
Figure 38:
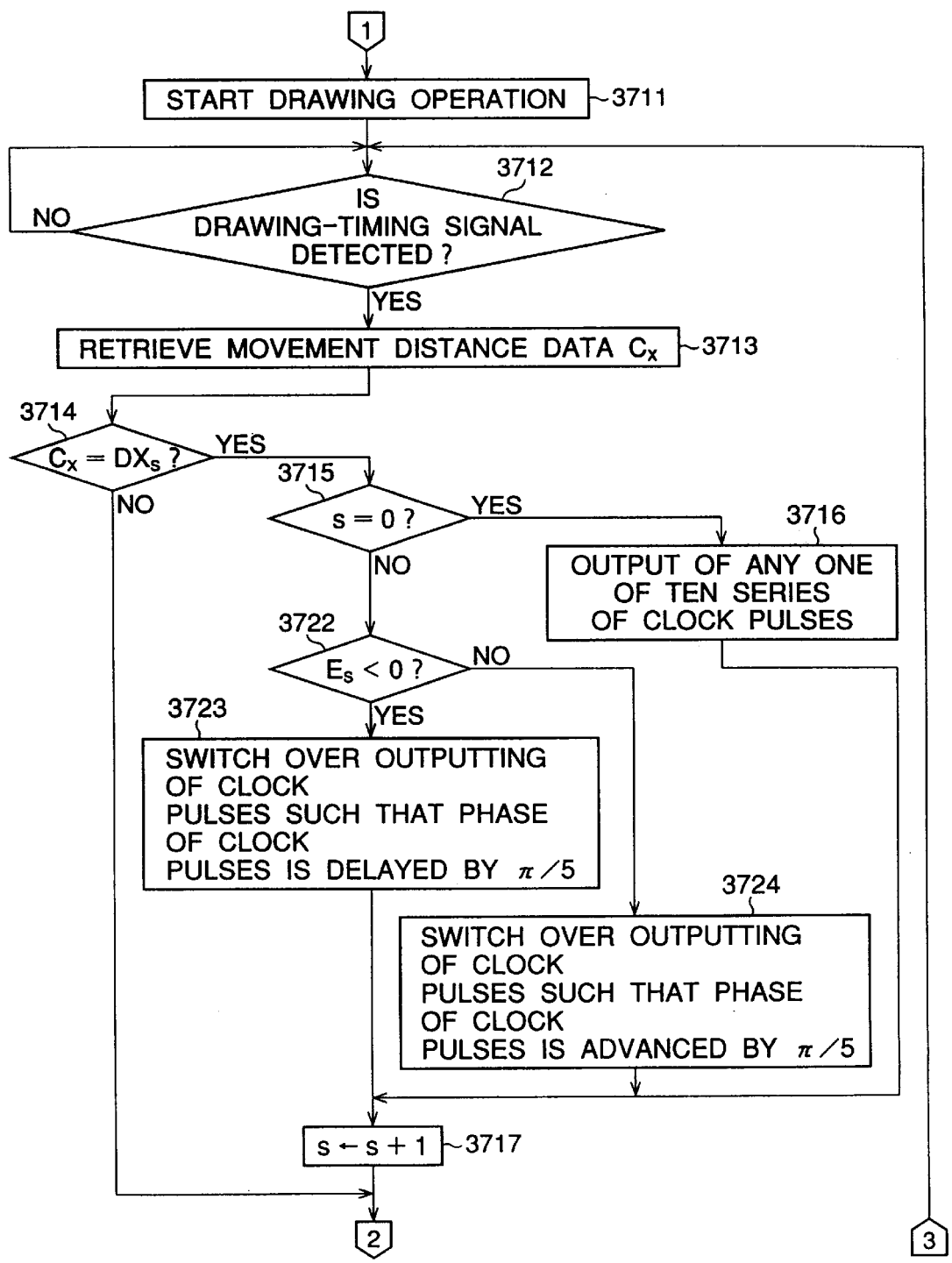
FIG. 38 is another part of the flowchart showing the drawing operation routine with the misalignment-correction, executed in the third embodiment of the laser drawing apparatus according to the present invention.
Figure 39:
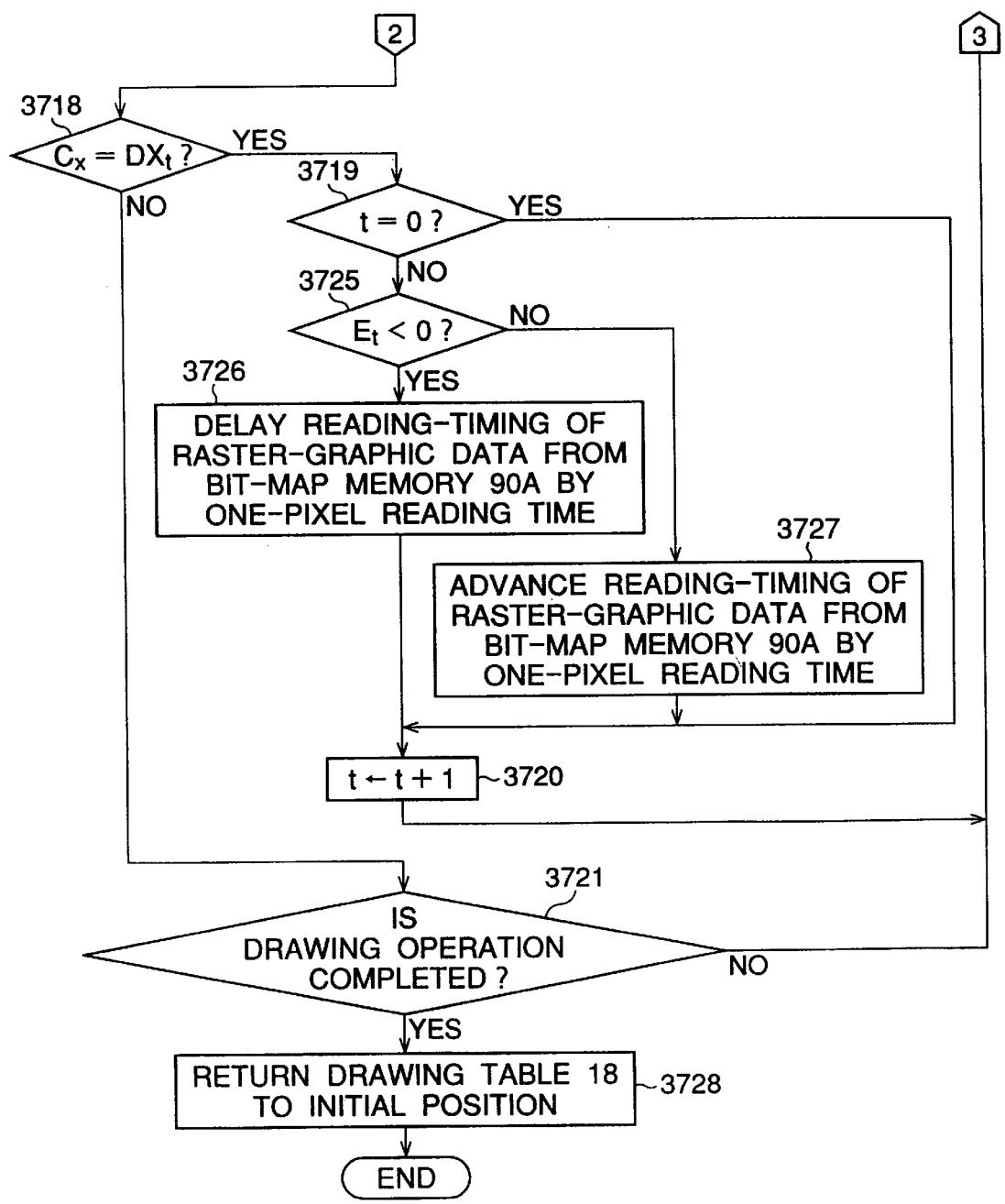
FIG. 39 is the remaining part of the flowchart showing the drawing operation routine with the misalignment-correction, executed in the third embodiment of the laser drawing apparatus according to the present invention.

FIGS. 37 to 39 show a flowchart for a drawing operation routine executed according to the third embodiment of the laser drawing apparatus of the present invention.

At step 3701, the drawing table 18 is moved from an initial position or retracted position along the X-axis of the X–Y coordinate system, by driving the servo-motor 98. The motor is driven until two of the four positioning-marks of a workpiece, placed on the drawing table 18, are observed by the CCD cameras 80. When the positioning-marks are observed by the CCD cameras 80, the drawing table 18 is stopped.

At step 3702, the positioning-marks are photographed by the CCD cameras 80. Namely, the respective photographed positioning-mark images are converted into video signals by the CCD image sensors of the CCD cameras 80. The converted video signals are suitably processed in the video-signal processing circuit 82, and are then retrieved by the system control circuit 78.

At step 3703, the drawing table 18 is further moved in the X-axis direction of the X–Y coordinate system, by driving the servo-motor 98. The motor is driven until the remaining two positioning-marks of the workpiece, placed on the drawing table 18, are observed by the CCD cameras 80. When the remaining two positioning-marks are observed by the CCD cameras 80, the drawing table 18 is stopped.

At step 3704, the remaining two positioning-marks are photographed by the CCD cameras 80. Namely, the respective photographed positioning-mark images are converted into video signals by the CCD image sensors of the CCD cameras 80. The converted video signals are suitably processed in the video-signal processing circuit 82, and are then retrieved by the system control circuit 78. At step 3705, the drawing table 18 is returned to the initial position or retracted position.

At step 3706, a main-scan-start position, along the main-scanning direction, and a sub-scan-start position, along the sub-scanning direction, are calculated on the basis of the processed video signals of the positioning-marks of the workpiece. The calculated main-scan-start position data and sub-scan-start position data are temporarily stored in the RAM of the system control circuit 78.

At step 3707, one-pixel-dot-shift location data ($DX_t$) and clock-pulse-phase-shift location data ($DX_s$) are calculated on the basis of the scan-start position data, the drifted distance data ($E_m$) and the pixel-dot size data ($D_p$). The calculated location data ($DX_t$, $DX_s$) are also temporarily stored in the RAM of the system control circuit 78.

At step 3708, it is determined whether or not the calculations have been completed. When the completion of the calculations is confirmed, the control proceeds from step 3708 to step 3709, in which it is determined whether or not a signal for commanding a drawing-operation is received from the EWS (engineering work station) through the LAN (local area network). When it is confirmed that the drawing-command signal is received, the control proceeds to step 3710, in which counters t and s are reset.

Then, at step 3711, a drawing-operation is started. Namely, the workpiece placed on the drawing table 18 is moved from the initial position toward a drawing-start position, defined by the main-scanning position and the sub-scanning position. The movement of the drawing table 18 is carried out by driving the servo-motor 98, in accordance with the series of drive pulses output from the servo-motor driver circuit 99.

At step 3712, it is monitored whether or not an initial drawing-timing signal is detected by the system control circuit 78, during the movement of the drawing table 18 toward the drawing-start position. The drawing-timing signal is used to properly draw a pattern on the basis of the raster-graphic data stored and developed in the bit-map memory 90A (FIG. 8).

In particular, before the proper drawing of the pattern can be achieved, the modulation of the laser beams, based upon the raster-graphic data read from the bit-map memory 90A, must be commenced whenever the deflected laser beams reach the main-scan-start position in the main-scanning direction. To ensure the commencement of the modulation of the laser beams, at the time when the laser beams reach the main-scan-start position, a mirror is provided at the outside of the main-scanning range such that one of the deflected laser beams passes through the mirror. The drawing-timing signal is produced by detecting a laser beam reflected from the mirror. The commencement of the modulation of the laser beams is controlled on the basis of the production of the drawing-timing signal. Thus, proper drawing of the pattern is ensured.

When the production of the drawing-timing signal is detected by the system control circuit 78, the control proceeds from step 3712 to step 3713, in which movement-distance data $C_x$ of the drawing table 18 is retrieved from the X-scale sensor 100 by the system control circuit 78. The movement-distance data $C_x$ represents a distance over which the drawing table 18 is moved, from the sub-scanning-start position in the sub-scanning direction, at the time when the movement-distance data $C_x$ is retrieved.

At step 3714, it is determined whether or not the retrieved movement-distance data $C_x$ coincides with initial clock-pulse-phase-shift location data ($DX_{s=0}$). At the initial stage, the retrieved movement-distance data $C_x$ corresponds to the sub-scan-start position, which coincides with the initial clock-pulse-phase-shift location $DX_{s=0}$. Nevertheless, the switching-over of the outputting of the ten clock pulses (YCK–SFT1; . . . ; YCK–SFT10), as mentioned above, cannot be carried out, because none of the ten series of clock pulses (YCK–SFT1; . . . ; YCK–SFT10) has been output from the misalignment-correction circuit 84" to the synchronizing circuit 90B (FIG. 8). Note, the initial clock-pulse-phase-shift location $DX_{s=0}$ corresponds to the origin of the X–Y coordinate system as shown in FIG. 28.

Namely, the control proceeds from step 3714 to step 3715, in which it is determined whether or not a count number of the counter s is "0". Then, the control proceeds to step 3716 (s=0 at the initial stage), in which any one of the ten series of clock pulses (YCK–SFT1; . . . ; YCK–SFT10), for example, the first series of clock pulses YCK–SFT1, is output from the misalignment-correction circuit 84" to the synchronizing circuit 90B.

Thereafter, at step 3717, the count number of the counter s is incremented by "1". Then, the control proceeds to step 3718, in which it is further determined whether or not the retrieved movement-distance data $C_x$ coincides with initial one-pixel-dot-shift location data ($DX_{t=0}$). As mentioned above, at the initial stage, the retrieved movement-distance data $C_x$ corresponds to the sub-scan-start position, which also coincides with the initial one-pixel-dot-shift location $DX_{t=0}$. Nevertheless, the shift of the main-scan-start position by the distance corresponding to one-pixel-dot size, as mentioned above, cannot be carried out, because the initial one-pixel-dot-shift location $DX_{t=0}$ corresponds to the origin of the X–Y coordinate system as shown in FIG. 28.

Namely, the control proceeds from step 3718 to step 3719, in which it is determined whether or not a count number of the counter t is "0". Then, the control proceeds to step 3720 (t=0 at the initial stage), in which the count number of the counter t is incremented by "1".

Thereafter, the control returns from step 3720 to step 3712, in which it is monitored whether or not a next drawing-timing signal is detected by the system control circuit 78. When the production of the next drawing-timing signal is detected by the system control circuit 78, the control proceeds to step 3713, in which movement-distance data $C_x$ of the drawing table 18 is retrieved from the X-scale sensor 100 by the system control circuit 78.

At step 3714, it is determined whether or not the retrieved movement-distance data $C_x$ coincides with clock-pulse-phase-shift location data ($DX_{s=1}$). Note, in the example shown in FIGS. 28 to 36, $DX_{s=1}$=2 mm. At this second stage, because $C_x \neq DX_{s=1}$, the control proceeds from step 3714 to step 3718, in which it is further determined whether or not the retrieved movement-distance data $C_x$ coincides with one-pixel-dot-shift location data ($DX_{t=1}$). Note, in the example shown in FIGS. 18 to 20, $DX_{t=1}$=20 mm. At this second stage, since $C_x \neq DX_{t=1}$, the control proceeds from step 3718 to step 3721, in which it is determined whether or not the entire drawing-operation is completed.

At the second stage, because the entire drawing-operation is not yet completed, the control again returns from step 3721 to step 3712. Namely, the routine comprising steps 3712, 3713, 3714, 3718 and 3721 is repeatedly executed until the retrieved movement-distance data $C_x$ coincides with the clock-pulse-phase-shift location data ($DX_{s=1}$).

At step 3714, when the retrieved movement-distance data $C_x$ coincides with the clock-pulse-phase-shift location data ($DX_{s=1}$), the control proceeds from step 3714 to step 3722 through step 3715 (s≠0). At step 3722, it is determined whether the degree ($E_{s=1}$) of the misalignment of the pixel-dots, at the clock-pulse-phase-shift location $Dx_{s=1}$, is negative or positive.

If $E_{s=1}$<0, the control proceeds from step 3722 to step 3723, in which the outputting of the ten series of clock pulses (YCK–SFT1; . . . ; YCK–SFT10) is switched over in such a manner that a phase of the clock pulses is delayed by $\pi/5$. For example, when the series of clock pulses YCK–SFT1 has been output from the misalignment-correction circuit 84", the outputting of the series of clock pulses YCK–SFT1 is switched over to the outputting of the series of clock pulses YCK–SFT2.

On the other hand, if $E_{s=1}$>0 (as the example shown in FIG. 29), the control proceeds from step 3722 to step 3724, in which the outputting of the ten series of clock pulses (YCK–SFT1; . . . ; YCK–SFT10) is switched over so that a phase of the clock pulses is advanced by $\pi/5$. For example, when the series of clock pulses YCK–SFT1 has been output from the misalignment-correction circuit 84", the outputting of the series of clock pulses YCK–SFT1 is switched over to the outputting of the series of clock pulses YCK–SFT10.

After the switching-over of the outputting of the series of clock pulses (YCK–SFT1; . . . and YCK–SFT10) is carried out, at step 3723 or step 3724, the control proceeds to step 3717, in which the count number of the counter s is incremented by "1". Then, the control proceeds to step 3718, in which it is further determined whether or not the retrieved movement-distance data $C_x$, which coincides with the clock-pulse-phase-shift location data ($DX_{s=1}$), now coincides with the one-pixel-dot-shift location data ($DX_{t=1}$). Of course, at this stage, because $C_x \neq DX_{t=1}$, the control proceeds from step 3718 to step 3721, in which it is determined whether or not the entire drawing-operation is completed.

At this stage, because the entire drawing-operation is not yet completed, the control further returns from step 3721 to step 3712. Namely, the routine comprising steps 3712, 3713, 3714, 3718, 3721, 3715, 3722, 3723, 3724 and 3717 is repeatedly executed until the retrieved movement-distance data $C_x$ coincides with the one-pixel-dot-shift location data $(DX_{t=1})$.

At step 3718, when the retrieved movement-distance data $C_x$ coincides with the one-pixel-dot-shift location data $(DX_{t=1})$, the control proceeds from step 3718 to step 3725 through step 3719 ($t \neq 0$). At step 3725, it is determined whether the degree ($E_{t=1}$) of the misalignment of the pixel-dots, at the one-pixel-dot-shift location $DX_{t=1}$, is negative or positive.

If $E_{t=1}<0$, the control proceeds from step 3725 to step 3726, in which the reading-timing of raster-graphic data, from the bit-map memory 90A, is delayed by a time required to read a one-pixel raster-graphic datum from the bit-map memory 90A. Namely, the main-scan-start position, where the modulation of the scanning laser beams based upon the raster-graphic data is commenced, is shifted by a distance corresponding to one-pixel-dot size $D_p$ toward the positive side of the Y-axis.

On the other hand, if $E_{t=1}>0$ (as the example shown in FIG. 29), the control proceeds from step 3725 to step 3727, in which the reading-timing of the raster-graphic data, from the bit-map memory 90A, is advanced by the time required to read the one-pixel raster-graphic datum from the bit-map memory 90A. Namely, the main-scan-start position, where the modulation of the scanning laser beams based upon the raster-graphic data is commenced, is shifted by the distance corresponding to one-pixel-dot size $D_p$ toward the negative side of the Y-axis.

After the shift of the main-scan-start position by one-pixel-dot size $D_p$ is carried out at step 3726 or step 3727, the control proceeds to step 3720, in which the count number of the counter t is incremented by "1". Then, the control further returns to step 3712. Namely, the routine comprising steps 3712, 3713, 3714, 3718, 3721, 3715, 3722, 3723, 3724, 3717, 3719, 3725, 3726, 3727 and 3720 is repeatedly executed until the entire sub-scanning operation is completed.

At step 3721, when the completion of the entire drawing-operation is confirmed, the control proceeds from step 3721 to step 3728, in which the drawing table 18 is returned to the initial position by driving the servo-motor 98. Thus, the execution of the drawing-operation is completed.

Finally, it will be understood by those skilled in the art that the foregoing description is of preferred embodiments of the apparatus and that various changes and modifications may be made to the present invention without departing from the spirit and scope thereof.

The present disclosure relates to subject matter contained in Japanese Patent Applications No. 8-245644 (filed on Aug. 28, 1996), No. 8-257844 (filed on Sep. 6, 1996) and No. 8-302508 (filed on Oct. 28, 1996) which are expressly incorporated herein by reference in their entireties.

We claim:

1. A laser drawing apparatus for drawing a pattern on a workpiece by scanning the workpiece with at least one laser beam and by modulating the laser beam on the basis of raster-graphic data, in accordance with a series of clock pulses, said apparatus comprising:

a calculator for calculating respective clock-pulse-phase-shift location data, to which a phase of said clock pulses should be shifted, with a unit of less than $2\pi$, on the basis of pixel-dot-pitch discrepancy data previously measured along equally-divided sections of a scanning line defined by the scanning laser beam; and a clock-pulse-outputting controller for controlling outputting of said clock pulses so that the phase of said clock pulses is shifted, with the unit of less than $2\pi$, whenever said laser beam reaches each clock-pulse-phase-shift location, represented by said clock-pulse-phase-shift location data, during the scanning of said workpiece with said laser beam, whereby a pixel-dot-pitch discrepancy in each of said equally-divided sections of said scanning line can be corrected with a unit of less than a one-pixel-dot size.

2. The laser drawing apparatus of claim 1, further comprising a determiner for determining whether production of pixel-dot-pitch discrepancy at each clock-pulse-phase-shift location results from the pixel-dots being spaced too close to each other or too far away from each other, wherein the phase of said clock pulses with the unit of less than $2\pi$ is shifted such that a pixel-dot-pitch is made larger when said determiner determines the production of the pixel-dot-pitch discrepancy results from the pixel-dots being spaced too close to each other, and wherein the phase of said clock pulses, with the unit of less than $2\pi$ is shifted such that the pixel-dot-pitch is made smaller when said determiner determines the production of the pixel-dot-pitch discrepancy results from the pixel-dots being spaced too far away from each other.

3. A laser drawing apparatus for drawing a pattern on a workpiece by scanning the workpiece with at least one laser beam and by modulating the laser beam on the basis of raster-graphic data in accordance with a series of clock pulses, the workpiece being scanned with the laser beam by deflecting the laser beam with respect to the workpiece, said apparatus comprising:

a calculator for calculating respective clock-pulse-phase-shift location data, to which a phase of said clock pulses should be shifted, with a unit of less than $2\pi$, on the basis of pixel-dot-pitch discrepancy data previously measured along equally-divided sections of a scanning line defined by the deflection of said laser beam in a main-scanning direction; and a clock-pulse-outputting controller for controlling outputting of said clock pulses so that the phase of said clock pulses is shifted, with the unit of less than $2\pi$, whenever said laser beam reaches each clock-pulse-phase-shift location, represented by said clock-pulse-phase-shift location data, during the scanning of said workpiece with said laser beam, whereby a pixel-dot-pitch discrepancy in each of said equally-divided sections of said scanning line can be corrected with a unit of less than a one-pixel-dot size.

4. The laser drawing apparatus of claim 3, further comprising a determiner for determining whether production of pixel-dot-pitch discrepancy at each clock-pulse-phase-shift location results from the pixel-dots being spaced too close to each other or too far away from each other, wherein the phase of said clock pulses, with the unit of less than $2\pi$, is shifted such that the phase of said clock pulses is delayed when said determiner determines the production of the pixel-dot-pitch discrepancy results from the pixel-dots being spaced too close to each other, and wherein the phase of said clock pulses, with the unit of less than $2\pi$, is shifted such that the phase of said clock pulses is advanced when said determiner determines the production of the pixel-dot-pitch discrepancy results from the pixel-dots being spaced too far from each other.

5. The laser drawing apparatus of claim 4, wherein said clock-pulse-outputting controller further comprises:

- a clock pulse generator for producing a plurality of series of clock pulses based on a series of basic clock pulses, the respective series of clock pulses having phases shifted from each other within a range of $2\pi$;
- a switcher for selectively outputting one of the series of clock pulses from said clock pulse generator; and
- a regulator for regulating said switcher to output one of the series of clock pulses in one of a first clock-pulse-outputting manner, to cause a delay in the phase of the output clock pulses, and a second clock-pulse-outputting manner, to cause an advance in the phase of the output clock pulses,
- wherein said regulator regulates said switcher to output one of the series of clock pulses in said first clock-pulse-outputting manner when said determiner determines that the production of the pixel-dot-pitch discrepancy results from the pixel-dots being spaced too close to each other, and
- wherein said regulator regulates said switcher to output one of the series of clock pulses in said second clock-pulse-outputting manner when said determiner determines the production of the pixel-dot-pitch discrepancy results from the pixel-dots being spaced too far from each other.

6. A laser drawing apparatus for drawing a pattern on a workpiece by scanning the workpiece with at least one laser beam and by modulating the laser beam on the basis of raster-graphic data in accordance with a series of clock pulses, the workpiece being scanned with the laser beam by moving the workpiece with respect to the laser beam, said apparatus comprising:

- a calculator for calculating respective clock-pulse-phase-shift location data, to which a phase of said clock pulses should be shifted, with a unit of less than $2\pi$, on the basis of pixel-dot-pitch discrepancy data previously measured along equally-divided sections of a scanning line defined by the movement of said workpiece with respect to said laser beam; and
- a clock-pulse-outputting controller for controlling outputting said clock pulses so that the phase of said clock pulses is shifted, with the unit of less than $2\pi$, whenever said laser beam reaches each clock-pulse-phase-shift location, represented by said clock-pulse-phase-shift location data, during the movement of said workpiece along said scanning line, whereby a pixel-dot-pitch discrepancy in each of said equally-divided sections of said scanning line can be corrected with a unit of less than a one-pixel-dot size.

7. The laser drawing apparatus of claim 6, further comprising a determiner for determining whether production of pixel-dot-pitch discrepancy at each clock-pulse-phase-shift location results from the pixel-dots being spaced too close to each other or too far away from each other,

- wherein the phase of said clock pulses, with the unit of less than $2\pi$, is shifted such that the phase of said clock pulses is advanced when said determiner determines the production of the pixel-dot-pitch discrepancy results from the pixel-dots being spaced too close to each other, and
- wherein the phase of said clock pulses, with the unit of less than $2\pi$, is shifted such that the phase of said clock pulses is delayed when said determiner determines the production of the pixel-dot-pitch discrepancy results from the pixel-dots being spaced too far away from each other.

8. The laser drawing apparatus of claim 7, wherein said clock-pulse-outputting controller comprises:

- a clock pulse generator for producing a plurality of series of clock pulses based on a series of basic clock pulses, the respective series of clock pulses having phases shifted from each other within a range of $2\pi$;
- a switcher for selectively outputting one of the series of clock pulses from said clock pulse generator; and
- a regulator for regulating said switcher to output one of the series of clock pulses in one of a first clock-pulse-outputting manner, to cause a delay in the phase of the output clock pulses, and a second clock-pulse-outputting manner, to cause an advance in the phase of the output clock pulses,
- wherein said regulator regulates said switcher to output one of the series of clock pulses in said second clock-pulse-outputting manner when said determiner determines the production of the pixel-dot-pitch discrepancy results from the pixel-dots being spaced too close to each other, and
- wherein said regulator regulates said switcher to output one of the series of clock pulses in said first clock-pulse-outputting manner when said determiner determines that the production of the pixel-dot-pitch discrepancy results from the pixel-dots being spaced too far from each other.

9. A laser drawing apparatus for drawing a pattern on a workpiece by scanning the workpiece with at least one laser beam in both a main-scanning direction and in a sub-scanning direction, the laser beam being modulated on the basis of raster-graphic data in accordance with a first series of clock pulses, scanning of the workpiece with the laser beam in the main-scanning direction being carried out by deflecting the laser beam with respect to the workpiece, scanning of the workpiece with the laser beam in the sub-scanning direction being carried out by moving the workpiece with respect to the laser beam in accordance with a second series of clock pulses, said apparatus comprising:

- a first calculator for calculating first respective clock-pulse-phase-shift location data, by which a phase of said first clock pulses should be shifted, with a unit of less than $2\pi$, on the basis of pixel-dot-pitch discrepancy data previously measured along first equally-divided sections of a main-scanning line defined by the deflection of said laser beam in said main-scanning direction;
- a second calculator for calculating second respective clock-pulse-phase-shift location data, by which a phase of said second clock pulses should be shifted with a unit of less than $2\pi$, on the basis of pixel-dot-pitch discrepancy data previously measured along second equally-divided sections of a sub-scanning line which is defined by the movement of said workpiece in said sub-scanning direction with respect to said laser beam;
- a first clock-pulse-outputting controller for controlling outputting of said first clock pulses such that the phase of said first clock pulse is shifted, with the unit of less than $2\pi$, whenever said laser beam reaches each main-scanning-clock-pulse-phase-shift location, represented by said first clock-pulse-phase-shift location data, during the scanning of said workpiece with said laser beam in said main-scanning direction, whereby a pixel-dot-pitch discrepancy in each of said first equally-divided sections of said main-scanning direction can be corrected with a unit of less than one-pixel-dot size; and
- a second clock-pulse-outputting controller for controlling outputting of said second clock pulses such that the phase of said second clock pulses is shifted, with the unit of less than $2\pi$, whenever said laser beam reaches each of sub-scanning-clock-pulse-phase-shift location, represented by said second clock-pulse-phase-shift location data, during the movement of said workpiece in said sub-scanning direction, whereby a pixel-dot-pitch discrepancy in each of said second equally-divided sections of said sub-scanning direction can be corrected with a unit of less than one-pixel-dot size.

10. The laser drawing apparatus of claim 9, further comprising a first determiner for determining whether a production of a pixel-dot-pitch discrepancy at each main-scanning-clock-pulse-phase-shift location results from the pixel-dots being spaced too close to each other or too far away from each other,
wherein the shift of the phase of said first clock pulses, with the unit of less than $2\pi$, is carried out such that the phase of said first clock pulses is delayed when the first determiner determines the production of the pixel-dot-pitch discrepancy results from the pixel-dots being spaced too close to each other, and
wherein the shift of the phase of said first clock pulses, with the unit of less than $2\pi$, is carried out such that the phase of said first clock pulses is advanced when said first determiner determines the production of the pixel-dot-pitch discrepancy results from the pixel-dots being spaced too far away from each other.

11. The laser drawing apparatus of claim 10, wherein said first clock-pulse-outputting controller comprises:
a clock pulse generator for producing a plurality of series of clock pulses on the basis of a series of basic clock pulses, the respective series of clock pulses having phases shifted from each other within a range of $2\pi$;
a switcher for selectively outputting one of the series of clock pulses from said clock pulse generator; and
a regulator for regulating said switcher to output one of the series of clock pulses in one of a first clock-pulse-outputting manner, to cause a delay in the phase of the output clock pulses, and a second clock-pulse-outputting manner, to cause an advance in the phase of the output clock pulses,
wherein said regulator regulates said switcher to output one of the series of clock pulses in said first clock-pulse outputting manner when said determiner determines the production of the pixel-dot-pitch discrepancy results from the pixel-dots being spaced too close to each other, and
wherein said regulator regulates said switcher to output one of the series of clock pulses in said second clock-pulse-outputting manner when said determiner determines the production of the pixel-dot-pitch discrepancy results from the pixel-dots being spaced too far from each other.

12. The laser drawing apparatus of claim 10, further comprising a second determiner for determining whether production of a pixel-dot-pitch discrepancy at each sub-scanning-clock-pulse-phase-shift location results from said pixel-dots being spaced too close to each other or too far away from each other,
wherein the shift of the phase of said second clock pulses, with the unit of less than $2\pi$, is carried out such that the phase of said second clock pulses is advanced when said second determiner determines the production of the pixel-dot-pitch discrepancy results from the pixel-dots being spaced too close to each other, and
wherein the shift of the phase of said second clock pulses, with the unit of less than $2\pi$, is carried out such that the phase of said second clock pulses is delayed when said second determiner determines the production of the pixel-dot-pitch discrepancy results from the pixel-dots being spaced too far away from each other.

13. The laser drawing apparatus of claim 12, wherein said second clock-pulse-outputting controller comprises:
a clock pulse generator for producing a plurality of series of clock pulses on the basis of a series of basic clock pulses, the respective series of clock pulses having phases which are shifted from each other within a range of $2\pi$;
a switcher for selectively outputting one of the plurality of series of clock pulses from said clock pulse generator; and
a regulator for regulating said switcher to output one of the plurality of series of clock pulses in one of a first clock-pulse-outputting manner, to cause a delay in the phase of the output clock pulses, and a second clock-pulse-outputting manner, to cause an advance in the phase of the output clock pulses,
wherein said regulator regulates said switcher to output one of the series of clock pulses in said first clock-pulse outputting manner when said determiner determines the production of the pixel-dot-pitch discrepancy results from the pixel-dots being spaced too far away from each other, and
wherein said regulator regulates said switcher to output one of the series of clock pulses in said second clock-pulse-outputting manner when said determiner determines the production of the pixel-dot-pitch discrepancy results from the pixel-dots being spaced too close to each other.

14. A laser drawing apparatus for drawing a pattern on a workpiece by scanning the workpiece with at least one laser beam in both a main-scanning direction and in a sub-scanning direction, the laser beam being modulated on the basis of raster-graphic data in accordance with a series of clock pulses stored in a memory, scanning of the workpiece with the laser beam in the main-scanning direction being carried out by deflecting the laser beam with respect to the workpiece, scanning of the workpiece with the laser beam in the sub-scanning direction being carried out by moving the workpiece with respect to the laser beam, said apparatus comprising:
a first calculator for calculating one-pixel-dot-shift location data, indicating where a main-scan-start position in said main-scanning direction should be shifted by a distance corresponding to a one-pixel-dot size, on the basis of previously-measured inclination data of a sub-scanning line with respect to said main-scanning direction, the sub-scanning line being defined by the movement of said workpiece in said sub-scanning direction with respect to said laser beam,
a first controller for controlling the shift of said main-scan-start position by regulating a reading-timing of said raster-graphic data from said memory whenever said laser beam reaches each one-pixel-dot-shift location, represented by said one-pixel-dot-shift location data, during the movement of said workpiece in said sub-scanning direction, whereby an inclination of said sub-scanning line with respect to said main-scanning direction can be corrected with a unit of a one-pixel-dot size;
a second calculator for calculating clock-pulse-phase-shift location data, indicating where a phase of said clock pulses should be shifted, with a unit of less than $2\pi$, on the basis of said inclination data; and a second controller for controlling outputting of said clock pulses so that the phase of said clock pulses is shifted, with the unit of less than 2π, whenever said laser beam reaches each clock-pulse-phase-shift location, represented by said clock-pulse-phase-shift location data, during the movement of said workpiece in said sub-scanning direction, whereby the inclination of said sub-scanning line with respect to said main-scanning direction can be finely corrected with a unit of less than said one-pixel-dot size.

15. The laser drawing apparatus of claim 14, further comprising a determiner for determining whether the inclination of said sub-scanning line is positive or negative, the inclination of said sub-scanning line being defined as being positive when a drifted distance of said sub-scanning line, resulting from the inclination thereof, is produced in said main-scanning direction, the inclination of said sub-scanning line being defined as being negative when a drifted distance of said sub-scanning line, resulting from the inclination thereof, is produced in an opposite direction to said main-scanning direction, wherein the reading-timing of said raster-graphic data from said memory is advanced by a time required to read a one-pixel raster-graphic datum from said memory when said determiner determines the inclination of said sub-scanning line is positive, wherein the reading-timing of said raster-graphic data from said memory is delayed by the time required to read said one-pixel raster-graphic datum from said memory when said determiner determines the inclination of said sub-scanning line is negative, wherein the shift of the phase of said clock pulses, with the unit of less than 2π, is carried out such that the phase of said clock pulses is advanced when said determiner determines the inclination of said sub-scanning line is positive, and wherein the shift of the phase of said clock pulses, with the unit of less than 2π, is carried out such that the phase of said clock pulses is delayed when said determiner determines the inclination of said sub-scanning line is negative.

16. The laser drawing apparatus of claim 15, wherein said second controller comprises:

a clock pulse generator for producing a plurality of series of clock pulses on the basis of a series of basic clock pulses, the series of clock pulses having phases which are shifted from each other within a range of 2π;

a switcher for selectively outputting one of the series of clock pulses from said clock pulse generator; and a regulator for regulating said switcher to output one of the series of clock pulse in one of a first clock-pulse-outputting manner, to cause a delay in the phase of the output clock pulses, and a second clock-pulse-outputting manner, to cause an advance in the phase of the output clock pulses, wherein said regulator regulates said switcher to output one of the series of clock pulses in said first clock-pulse-outputting manner when said determiner determines that the inclination of said sub-scanning line is negative, and wherein said regulator regulates said switch to output one of the series of clock pulses in said second clock-pulse-outputting manner when said determiner determines that the inclination of said sub-scanning line is positive.

17. A laser drawing apparatus for drawing a pattern on a workpiece by scanning the workpiece with at least one laser beam in both a main-scanning direction and in a sub-scanning direction, the laser beam being modulated on the basis of raster-graphic data read from a memory in accordance with a series of clock pulses, scanning of the workpiece with the laser beam in the main-scanning direction being carried out by deflecting the laser beam with respect to the workpiece, scanning of the workpiece with the laser beam in the sub-scanning direction being carried out by moving the workpiece with respect to the laser beam, said apparatus comprising:

a first calculator for calculating one-pixel-dot-shift location data, indicating where a main-scan-start position should be shifted, by a distance corresponding to a one-pixel-dot size, on the basis of relative inclination data of a sub-scanning line with respect to said main-scanning direction, the sub-scanning line being defined by the movement of said workpiece in said sub-scanning direction with respect to said laser beam, the relative inclination data of said sub-scanning line being determined on the basis of previously-measured absolute inclination data of said sub-scanning line with respect to said main-scanning direction and inclination data of an axis, defined by positioning-marks of said workpiece, with respect to said main-scanning line;

a first controller for controlling the shift of said main-scan-start position by regulating a reading time of said raster-graphic data from said memory whenever said laser beam reaches each one-pixel-dot-shift location, represented by said one-pixel-dot-shift location data, during the movement of said workpiece in said sub-scanning direction, whereby a relative inclination of said sub-scanning line with respect to said main-scanning direction can be corrected with a unit of a one-pixel-dot size so that said sub-scanning line is approximate to said axis defined by the positioning-marks of said workpiece;

a second calculator for calculating clock-pulse-phase-shift location data, indicating where a phase of said clock pulses should be shifted, with a unit of less than 2π, on the basis of said inclination data; and a second controller for controlling outputting of said clock pulses so that the phase of said clock pulses is shifted, with the unit of less than 2π, whenever said laser beam reaches each clock-pulse-phase-shift location, represented by said clock-pulse-phase-shift location data, during the movement of said workpiece in said sub-scanning direction, whereby the relative inclination of said sub-scanning line, with respect to said main-scanning direction, can be finely corrected with a unit of less than said one-pixel-dot size so that said sub-scanning line is more closely approximate to said axis defined by the positioning-marks of said workpiece.

18. The laser drawing apparatus of claim 17, further comprising a determiner for determining whether the relative inclination of said sub-scanning line is positive or negative, the relative inclination of said sub-scanning line being defined as being positive when a shifted distance of said sub-scanning line resulting from the inclination thereof is in said main-scanning direction, the relative inclination of said sub-scanning line being defined as being negative when a shifted distance of said sub-scanning line resulting from the inclination thereof is in an opposite direction to said main-scanning direction, wherein the reading time of said raster-graphic data from said memory is advanced by a time required to read a one-pixel raster-graphic datum from said memory when said determiner determines that the relative inclination of said sub-scanning line is positive, wherein the reading time of said raster-graphic data from said memory is delayed by the time required to read said one-pixel raster-graphic datum from said memory when said determiner determines that the relative inclination of said sub-scanning line is negative, wherein the shift of the phase of said clock pulses, with the unit of less than $2\pi$, is carried out such that the phase of said clock pulses is advanced when said determiner determines that the inclination of said sub-scanning line is positive, and wherein the shift of the phase of said clock pulses, with the unit of less than $2\pi$, is carried out such that the phase of said clock pulses is delayed when said determiner determines that the inclination of said sub-scanning line is negative.

19. The laser drawing apparatus of claim 18, wherein said second controller comprises:

a clock pulse generator for producing a plurality of series of clock pulses on the basis of a series of basic clock pulses, the series of clock pulses having phases which are shifted from each other within a range of $2\pi$;

a switcher for selectively outputting one of the series of clock pulses from said clock pulse generator; and a regulator for regulating said switcher to output one of the series of clock pulses in one of a first clock-pulse-outputting manner, to cause a delay in the phase of the output clock pulses, and a second clock-pulse-outputting manner, to cause an advance in the phase of the output clock pulses, wherein said regulator regulates said switcher to output one of the series of clock pulses in said first clock-pulse-outputting manner when said determiner determines that the relative inclination of said sub-scanning line is negative, and wherein said regulator regulates said switches to output one of the series of clock pulses in said second clock-pulse-outputting manner when said determiner determines that the inclination of said sub-scanning line is positive.

20. The laser drawing apparatus of claim 17, further comprising:

a detector for detecting the positioning-marks of said workpiece; and a calculator for calculating the inclination data of said axis, defined by the positioning-marks of said workpiece, on the basis of the detection of said positioning-marks by said detector.

21. The laser drawing apparatus of claim 20, wherein said detector comprises:

an image sensor for optically and electronically sensing the positioning-marks of said workpiece, with respect to a coordinate system defined in a drawing plane of said apparatus, to produce video signals carrying the positioning-marks of said workpiece; and a video-signal processor for processing the video signals to obtain the inclination data of said axis defined by the positioning-marks of said workpiece.

22. A laser drawing apparatus for drawing a pattern on a workpiece by scanning the workpiece with at least one laser beam in both a main-scanning direction and in a sub-scanning direction, the laser beam being modulated on the basis of raster-graphic data read from a memory in accordance with a series of clock pulses, scanning of the workpiece with the laser beam in the main-scanning direction being carried out by deflecting the laser beam with respect to the workpiece, scanning of the workpiece with the laser beam in the sub-scanning direction being carried out by moving the workpiece with respect to the laser beam, said apparatus comprising:

a first calculator for calculating one-pixel-dot-shift location data, indicating where a main-scan-start position in said main-scanning direction should be shifted, by a distance corresponding to a one-pixel-dot size, on the basis of previously-measured pixel-dot-misalignment data of pixel-dots included in a sub-scanning line defined by the movement of said workpiece in said sub-scanning direction;

a first controller for controlling the shift of said main-scan-start position by regulating a reading time of said raster-graphic data from said memory whenever said laser beam reaches each one-pixel-dot-shift location, represented by said one-pixel-dot-shift location data, during the movement of said workpiece in said sub-scanning direction, whereby a pixel-dot-misalignment of pixel-dots included in said sub-scanning line can be corrected with a unit of a one-pixel-dot size;

a second calculator for calculating clock-pulse-phase-shift location data, indicating where a phase of said clock pulses should be shifted, with a unit of less than $2\pi$, on the basis of said pixel-dot-misalignment data; and a second controller for controlling outputting of said clock pulses so that the phase of said clock pulses is shifted, with the unit of less than $2\pi$, whenever said laser beam reaches each clock-pulse-phase-shift location, represented by said clock-pulse-phase-shift location data, during the movement of said workpiece in said sub-scanning direction, whereby said pixel-dot-misalignment can be finely corrected with a unit of less than a one-pixel-dot size.

23. The laser drawing apparatus of claim 22, further comprising:

a first determiner for determining whether production of a pixel-dot-misalignment at each one-pixel-dot-shift location is positive or negative, the pixel-dot-misalignment being defined as being positive when produced at each of said one-pixel-dot-shift locations in said main-scanning direction, the pixel-dot-misalignment being defined as being negative when produced at each one-pixel-dot-shift location in an opposite direction to said main-scanning direction; and a second determiner for determining whether production of a pixel-dot-misalignment at said clock-pulse-phase-shift location is positive or negative, the pixel-dot-misalignment being defined as being positive when produced at each clock-pulse-phase-shift location in said main-scanning direction, the pixel-dot-misalignment being defined as being negative when produced at each clock-pulse-phase-shift location in an opposite direction to said main-scanning direction, wherein the reading time of said raster-graphic data from said memory is advanced by a time required to read a one-pixel raster-graphic datum from said memory when said first determiner determines that the pixel-dot-misalignment is positive, wherein the reading time of said raster-graphic data from said memory is delayed by the time required to read said one-pixel raster-graphic datum from said memory when said first determiner determines that the pixel-dot-misalignment is negative, wherein the shift of the phase of said clock pulses, with the unit of less than 2π, is carried out such that the phase of said clock pulses is advanced when said second determiner determines that the pixel-dot-misalignment is positive, and wherein the shift of the phase of said clock pulses, with the unit of less than 2π, is carried out such that the phase of said clock pulses is delayed when said second determiner determines that the pixel-dot-misalignment is negative.

24. The laser drawing apparatus of claim 23, wherein said second controller comprises:

a clock pulse generator for producing a plurality of series of clock pulses on the basis of a series of basic clock pulses, the respective series of clock pulses having phases which are shifted from each other within a range of 2π;

a switcher for selectively outputting one of the series of clock pulses from said clock pulse generator; and a regulator for regulating said switcher to output one of the series of clock pulses in one of a first clock-pulse-outputting manner, to cause a delay in the phase of the output clock pulses, and a second clock-pulse-outputting manner, to cause an advance in the phase of the output clock pulses, wherein said regulator regulates said switcher to output one of the series of clock pulses in said first clock-pulse-outputting manner when said second determiner determines that the pixel-dot-misalignment is negative, and wherein said regulator regulates said switches to output one of the series of clock pulses in said second clock-pulse-outputting manner when said second determiner determines that the pixel-dot-misalignment is positive.

25. A laser drawing apparatus for drawing a pattern on a workpiece by scanning the workpiece with at least one laser beam and by modulating the laser beam on the basis of raster-graphic data in accordance with a series of clock pulses, said apparatus comprising:

calculator means for calculating respective clock-pulse-phase-shift location data, indicating where a phase of said clock pulses should be shifted, with a unit of less than 2π, on the basis of pixel-dot-pitch discrepancy data previously measured along equally-divided sections of a scanning line defined by the scanning laser beam; and clock-pulse-outputting controller means for controlling outputting of said clock pulses so that the phase of said clock pulses is shifted, with the unit of less than 2π, whenever said laser beam reaches each clock-pulse-phase-shift location, represented by said clock-pulse-phase-shift location data, during the scanning of said workpiece with said laser beam, whereby a pixel-dot-pitch discrepancy in each of said equally-divided sections of said scanning line can be corrected with a unit of less than a one-pixel-dot size.

26. The laser drawing apparatus of claim 25, further comprising determiner means for determining whether production of a pixel-dot-pitch discrepancy at each clock-pulse-phase-shift location results from the pixel-dots being spaced too close to each other or too far away from each other;

wherein the shift of the phase of said clock pulses, with a unit of less than 2π, is carried out such that a pixel-dot-pitch is made larger when said determiner means determines that the production of the pixel-dot-pitch discrepancy results from the pixel-dots being spaced too close to each other, and wherein the shift of the phase of said clock pulses, with a unit of less than 2π, is carried out such that the pixel-dot-pitch is made smaller when said determiner means determines that the production of the pixel-dot-pitch discrepancy results from the pixel-dots being spaced too far from each other.

27. A laser drawing apparatus for drawing a pattern on a workpiece by scanning the workpiece with at least one laser beam and by modulating the laser beam on the basis of raster-graphic data in accordance with a series of clock pulses, the workpiece being scanned with the laser beam by deflecting the laser beam with respect to the workpiece, said apparatus comprising:

calculator means for calculating respective clock-pulse-phase-shift location data, indicating where a phase of said clock pulses should be shifted, with a unit of less than 2π, on the basis of pixel-dot-pitch discrepancy data previously-measured along equally-divided sections of a scanning line defined by the deflection of said laser beam in said main-scanning direction; and clock-pulse-outputting controller means for controlling outputting of said clock pulses so that the phase of said clock pulses is shifted, with a unit of less than 2π, whenever said laser beam reaches each clock-pulse-phase-shift location, represented by said clock-pulse-phase-shift location data, during the scanning of said workpiece with said laser beam, whereby a pixel-dot-pitch discrepancy in each of said equally-divided sections of said scanning line can be corrected with a unit of less than a one-pixel-dot size.

28. The laser drawing apparatus of claim 27, further comprising determiner means for determining whether production of a pixel-dot-pitch discrepancy at each of said clock-pulse-phase-shift locations results from the pixel-dots being spaced too close to each other or too far away from each other, wherein the shift of the phase of said clock pulses, with a unit of less than 2π, is carried out such that the phase of said clock pulses is delayed when said determiner means determines the production of the pixel-dot-pitch discrepancy results from the pixel-dots being spaced too close to each other, and wherein the shift of the phase of said clock pulses, with a unit of less than 2π, is carried out such that the phase of said clock pulses is advanced when said determiner means determines the production of the pixel-dot-pitch discrepancy results from the pixel-dots being spaced too far away from each other.

29. The laser drawing apparatus of claim 28, wherein said clock-pulse-outputting controller means comprises:

clock pulse generator means for producing a plurality of series of clock pulses on the basis of a series of basic clock pulses, the respective series of clock pulses having phases which are shifted from each other within a range of 2π;

switcher means for selectively outputting one of the series of clock pulses from said clock pulse generator means; and regulator means for regulating said switcher means to output one of the series of clock pulses in one of a first clock-pulse-outputting manner, to cause a delay in the phase of the output clock pulses, and a second clock-pulse-outputting manner, to cause an advance in the phase of the clock pulses, wherein said regulator means regulates said switcher means to output one of the series of clock pulses in said first clock-pulseoutputting manner when said determiner means determines that the production of the pixel-dot-pitch discrepancy results from the pixel-dots being spaced too close to each other, and wherein said regulator means regulates said switcher means to output one of the series of clock pulses in said second clock-pulse-outputting manner when said determiner means determines that the production of the pixel-dot-pitch discrepancy results from the pixel-dots being spaced too far away from each other.

30. A laser drawing apparatus for drawing a pattern on a workpiece by scanning the workpiece with at least one laser beam and by modulating the laser beam on the basis of raster-graphic data in accordance with a series of clock pulses, the workpiece being scanned with the laser beam by moving the workpiece with respect to the laser beam, said apparatus comprising:

calculator means for calculating respective clock-pulse-phase-shift location data indicating where a phase of said clock pulses should be shifted, with a unit of less than $2\pi$, on the basis of pixel-dot-pitch discrepancy data previously-measured along equally-divided sections of a scanning line defined by the movement of said workpiece with respect to said laser beam; and clock-pulse-outputting controller means for controlling outputting of said clock pulses so that the phase of said clock pulses is shifted, with a unit of less than $2\pi$, whenever said laser beam reaches each clock-pulse-phase-shift location, represented by said clock-pulse-phase-shift location data, during the movement of said workpiece along said scanning line, whereby a pixel-dot-pitch discrepancy in each of said equally-divided sections of said scanning line can be corrected with a unit of less than a one-pixel-dot size.

31. The laser drawing apparatus of claim 30, further comprising determiner means for determining whether a production of a pixel-dot-pitch discrepancy at each clock-pulse-shift location results from the pixel-dots being spaced too close to each other or too far away from each other, wherein the shift of the phase of said clock pulses, with a unit of less than $2\pi$, is carried out such that the phase of said clock pulses is advanced when said determiner means determines the production of the pixel-dot-pitch discrepancy results from the pixel-dots being spaced too close to each other, and wherein the shift of the phase of the said clock pulses, with a unit of less than $2\pi$, is carried out such that the phase of said clock pulses is delayed when said determiner means determines that the production of the pixel-dot-pitch discrepancy results from the pixel-dots being spaced too far away from each other.

32. The laser drawing apparatus of claim 31, wherein said clock-pulse-outputting controller means comprises:

clock pulse generator means for producing a plurality of series of clock pulses on the basis of a series of basic clock pulses, the respective series of clock pulses having phases which are shifted from each other within a range of $2\pi$;

switcher means for selectively outputting one of the series of clock pulses from said clock pulse generator means; and regulator means for regulating said switcher means to output one of the series of clock pulses in one of a first clock-pulse-outputting manner, to cause a delay in the phase of the output clock pulses, and a second clock-pulse-outputting manner, to cause an advance in the phase of the output clock pulses, wherein said regulator means regulates said switcher means to output one of the series of clock pulses in said second clock-pulse-outputting manner when said determiner means determines that the production of the pixel-dot-pitch discrepancy results from the pixel-dots being spaced too close to each other, and wherein said regulator means regulates said switcher means to output one of the series of clock pulses in said first clock-pulse-outputting manner when said determiner means determines that the production of the pixel-dot-pitch discrepancy results from the pixel-dots being spaced too far away from each other.

33. A laser drawing apparatus for drawing a pattern on a workpiece by scanning the workpiece with at least one laser beam in both a main-scanning direction and in a sub-scanning direction, the laser beam being modulated on the basis of raster-graphic data in accordance with a first series of clock pulses, scanning of the workpiece with the laser beam in the main-scanning direction being carried out by deflecting the laser beam with respect to the workpiece, scanning of the workpiece with the laser beam in the sub-scanning direction being carried out by moving the workpiece with respect to the laser beam, in accordance with a second series of clock pulses, said apparatus comprising:

first calculator means for calculating first respective clock-pulse-phase-shift location data indicating where a phase of said first clock pulses should be shifted, with a unit of less than $2\pi$, on the basis of pixel-dot-pitch discrepancy data previously-measured along first equally-divided sections of a main-scanning line defined by the deflection of said laser beam in said main-scanning direction;

second calculator means for calculating second respective clock-pulse-phase-shift location data indicating where a phase of said second clock pulses should be shifted, with a unit of less than $2\pi$, on the basis of pixel-dot-pitch discrepancy data previously-measured along second equally-divided sections of a sub-scanning line defined by the movement of said workpiece in said sub-scanning direction with respect to said laser beam;

first clock-pulse-outputting controller means for controlling outputting of said first clock pulses so that the phase of said first clock pulses is shifted, with the unit of less than $2\pi$, whenever said laser beam reaches each main-scanning-clock-pulse-phase-shift location, represented by said first clock-pulse-phase-shift location data, during the scanning of said workpiece with said laser beam in said main-scanning direction, whereby a pixel-dot-pitch discrepancy in said first equally-divided sections of said main-scanning direction can be corrected with a unit of less than a one-pixel-dot size; and second clock-pulse-outputting controller means for controlling outputting of said second clock pulses so that the phase of said second clock pulses is shifted, with the unit of less than $2\pi$, whenever said laser beam reaches each sub-scanning-clock-pulse-phase-shift location, represented by said second clock-pulse-phase-shift location data, during the movement of said workpiece in said sub-scanning direction, whereby a pixel-dot-pitch discrepancy in said second equally-divided sections of said sub-scanning direction can be corrected with a unit of less than a one-pixel-dot size.

34. The laser drawing apparatus of claim 33, further comprising first determiner means for determining whether production of a pixel-dot-pitch discrepancy at each main-scanning-clock-pulse-phase-shift location results from the pixel-dots being spaced too close to each other or too far away from each other, wherein the shift of the phase of said first clock pulses, with a unit of less than 2π, is carried out such that the phase of said first clock pulses is delayed when said first determiner means determines that the production of the pixel-dot-pitch discrepancy results from the pixel-dots being spaced too close to each other, and wherein the shift of the phase of said first clock pulses, with a unit of less than 2π, is carried out such that the phase of said first clock pulses is advanced when said first determiner means determines that the production of the pixel-dot-pitch discrepancy results from the pixel-dots being spaced too far away from each other.

35. The laser drawing apparatus of claim 34, wherein said first clock-pulse-outputting controller means comprises:

clock pulse generator means for producing a plurality of series of clock pulses on the basis of a series of basic clock pulses, the respective series of clock pulses having phases which are shifted from each other within a range of 2π;

switcher means for selectively outputting one of the series of clock pulses from said clock pulse generator means; and regulator means for regulating said switcher means to output one of the series of clock pulses in one of a first clock-pulse-outputting manner, to cause a delay in the phase of the output clock pulses, and a second clock-pulse-outputting manner, to cause an advance in the phase of the output clock pulses, wherein said regulator means regulates said switcher means to output one of the series of clock pulses in said first clock-pulse-outputting manner when said determiner means determines that the production of the pixel-dot-pitch discrepancy results from the pixel-dots being spaced too close to each other, and wherein said regulator means regulates said switcher means to output one of the series of clock pulses in said second clock-pulse-outputting manner when said determiner means determines that the production of the pixel-dot-pitch discrepancy results from the pixel-dots being spaced too far away from each other.

36. The laser drawing apparatus of claim 34, further comprising second determiner means for determining whether production of a pixel-dot-pitch discrepancy at each sub-scanning-clock-pulse-phase-shift location results from the pixel-dots being spaced too close to each other or too far away from each other, wherein the shift of the phase of said second clock pulses, with a unit of less than 2π, is carried out such that the phase of said second clock pulses is advanced when said second determiner means determines that the production of the pixel-dot-pitch discrepancy results from the pixel-dots being spaced too close to each other, and wherein the shift of the phase of said second clock pulses, with a unit of less than 2π, is carried out such that the phase of said second clock pulses is delayed when said second determiner means determines that the production of the pixel-dot-pitch discrepancy results from the pixel-dots being spaced too far away from each other.

37. The laser drawing apparatus of claim 36, wherein said second clock-pulse-outputting controller means comprises:

clock pulse generator means for producing a plurality of series of clock pulses on the basis of a series of basic clock pulses, the respective series of clock pulses having phases which are shifted from each other within a range of 2π;

switcher means for selectively outputting one of the series of clock pulses from said clock pulse generator means; and regulator means for regulating said switcher means to output one of the series of clock pulses in one of a first clock-pulse-outputting manner, to cause a delay in the phase of the output clock pulses, and a second clock-pulse-outputting manner, to cause an advance in the phase of the output clock pulses, wherein said regulator means regulates said switcher means to output one of the series of clock pulses in said first clock-pulse-outputting manner when said determiner means determines that the production of the pixel-dot-pitch discrepancy results from the pixel-dots being spaced too far away from each other, and wherein said regulator means regulates said switcher means to output one of the series of clock pulses in said second clock-pulse-outputting manner when said determiner means determines that the production of the pixel-dot-pitch discrepancy results from the pixel-dots being spaced too close to each other.

38. A laser drawing apparatus for drawing a pattern on a workpiece by scanning the workpiece with at least one laser beam in both a main-scanning direction and in a sub-scanning direction, the laser beam being modulated on the basis of raster-graphic data, read from a memory, in accordance with a series of clock pulses, scanning of the workpiece with the laser beam in the main-scanning direction being carried out by deflecting the laser beam with respect to the workpiece, scanning of the workpiece with the laser beam in the sub-scanning direction being carried out by moving the workpiece with respect to the laser beam, said apparatus comprising:

first calculator means for calculating one-pixel-dot-shift location data indicating where a main-scan-start position in said main-scanning direction should be shifted by a distance corresponding to a one-pixel-dot size on the basis of previously-measured inclination data of a sub-scanning line with respect to said main-scanning direction, the sub-scanning line being defined by the movement of said workpiece in said sub-scanning direction with respect to said laser beam;

first controller means for controlling the shift of said main-scan-start position by regulating a reading time of said raster-graphic data from said memory whenever said laser beam reaches each one-pixel-dot-shift location, represented by said one-pixel-dot-shift location data, during the movement of said workpiece in said sub-scanning direction, whereby an inclination of said sub-scanning line with respect to said main-scanning direction can be corrected with a unit of a one-pixel-dot size;

second calculator means for calculating clock-pulse-phase-shift location data indicating where a phase of said clock pulses should be shifted, with a unit of less than 2π, on the basis of said inclination data; and second controller means for controlling outputting of said clock pulses so that the phase of said clock pulses is shifted, with the unit of less than 2π, whenever said laser beam reaches each clock-pulse-phase-shift location, represented by said clock-pulse-phase-shift location data, during the movement of said workpiece in said sub-scanning direction, whereby the inclination of said sub-scanning line with respect to said main-scanning direction can be finely corrected with a unit of less than a one-pixel-dot size.

39. The laser drawing apparatus of claim 38, further comprising determiner means for determining whether the inclination of said sub-scanning line is positive or negative, the inclination of said sub-scanning line being defined as positive when a shifted distance of said sub-scanning line, resulting from the inclination of said sub-scanning line, is produced in said main-scanning direction, the inclination of said sub-scanning line being defined as negative when a shifted distance of said sub-scanning line, resulting from the inclination thereof, is produced in an opposite direction to said main-scanning direction, wherein the reading time of said raster-graphic data from said memory is advanced by a time required to read a one-pixel raster-graphic datum from said memory when said determiner means determines that the inclination of said sub-scanning line is positive, wherein the reading time of said raster-graphic data from said memory is delayed by the time required to read said one-pixel raster-graphic datum from said memory when said determiner means determines that the inclination of said sub-scanning line is negative, wherein the shift of the phase of said clock pulses, with a unit of less than $2\pi$, is carried out such that the phase of said clock pulses is advanced when said determiner means determines that the inclination of said sub-scanning line is positive, and wherein the shift of the phase of said clock pulses with a unit of less than $2\pi$ is carried out such that the phase of said clock pulses is delayed when said determiner means determines that the inclination of said sub-scanning line is negative.

40. The laser drawing apparatus of claim 39, wherein said second controller means comprises:

clock pulse generator means for producing a plurality of series of clock pulses on the basis of a series of basic clock pulses, the series of clock pulses having phases which are shifted from each other within a range of $2\pi$;

switcher means for selectively outputting one of the series of clock pulses from said clock pulse generator means; and regulator means for regulating said switcher means to output one of the series of clock pulses in one of a first clock-pulse-outputting manner, to cause a delay in the phase of the output clock pulses, and a second clock-pulse-outputting manner, to cause an advance in the phase of the output clock pulses, wherein said regulator means regulates said switcher means to output one of the series of clock pulses in said first clock-pulse-outputting manner when said determiner means determines that the inclination of said sub-scanning line is negative, and wherein said regulator means regulates said switcher means to output one of the series of clock pulses in said second clock-pulse-outputting manner when said determiner means determines that the inclination of said sub-scanning line is positive.

41. A laser drawing apparatus for drawing a pattern on a workpiece by scanning the workpiece with at least one laser beam in both a main-scanning direction and in a sub-scanning direction, the laser beam being modulated on the basis of raster-graphic data, read from a memory, in accordance with a series of clock pulses, scanning of the workpiece with the laser beam in the main-scanning direction being carried out by deflecting the laser beam with respect to the workpiece, scanning of the workpiece with the laser beam in the sub-scanning direction being carried out by moving the workpiece with respect to the laser beam, said apparatus comprising:

first calculator means for calculating one-pixel-dot-shift location data indicating where a main-scan-start position should be shifted, by a distance corresponding to a one-pixel-dot size, on the basis of relative inclination data of a sub-scanning line with respect to said main-scanning direction, the sub-scanning line being defined by the movement of said workpiece in said sub-scanning direction with respect to said laser beam, the relative inclination data of said sub-scanning line being prepared on the basis of previously-measured absolute inclination data of said sub-scanning line, with respect to said main-scanning direction, and inclination data of an axis, defined by positioning-marks of said workpiece, with respect to said main-scanning line;

first controller means for controlling the shift of said main-scan-start position by regulating a reading time of said raster-graphic data from said memory whenever said laser beam reaches each one-pixel-dot-shift location, represented by said one-pixel-dot-shift location data, during the movement of said workpiece in said sub-scanning direction, whereby a relative inclination of said sub-scanning line, with respect to said main-scanning direction, can be corrected with a unit of a one-pixel-dot size so that said sub-scanning line is approximate to said axis defined by the positioning-marks of said workpiece;

second calculator means for calculating clock-pulse-phase-shift location data indicating where a phase of said clock pulses should be shifted, with a unit of less than $2\pi$, on the basis of said relative inclination data; and second controller means for controlling outputting of said clock pulses so the phase of said clock pulses is shifted, with the unit of less than $2\pi$, whenever said laser beam reaches each clock-pulse-phase-shift location, represented by said clock-pulse-phase-shift location data, during the movement of said workpiece in said sub-scanning direction, whereby the relative inclination of said sub-scanning line, with respect to said main-scanning direction, can be finely corrected with a unit of less than said one-pixel-dot size so said sub-scanning line is more closely approximate to said axis defined by the positioning-marks of said workpiece.

42. The laser drawing apparatus of claim 41, further comprising determiner means for determining whether the relative inclination of said sub-scanning line is positive or negative, the relative inclination of said sub-scanning line being defined as positive when a shifted distance of said sub-scanning line, resulting from the relative inclination of said sub-scanning line, is produced in said main-scanning direction, the relative inclination of said sub-scanning line being defined as negative when a shifted distance of said sub-scanning line, resulting from the relative inclination of said sub-scanning line, is produced in an opposite direction to said main-scanning direction, wherein the reading time of said raster-graphic data from said memory is advanced by a time required to read a one-pixel raster-graphic datum from said memory when said determiner means determines that the relative inclination of said sub-scanning line is positive, wherein the reading time of said raster-graphic data from said memory is delayed by the time required to read said one-pixel raster-graphic datum from said memory when said determiner means determines that the relative inclination of said sub-scanning line is negative, wherein the shift of the phase of said clock pulses, with a unit of less than 2π, is carried out such that the phase of said clock pulses is advanced when said determiner means determines that the inclination of said sub-scanning line is positive, and wherein the shift of the phase of said clock pulses, with a unit of less than 2π, is carried out such that the phase of said clock pulses is delayed when said determiner means determines that the inclination of said sub-scanning line is negative.

43. The laser drawing apparatus of claim 42, wherein said second controller means comprises:

clock pulse generator means for producing a plurality of series of clock pulses on the basis of a series of basic clock pulses, the respective series of clock pulses having phases which are shifted from each other within a range of 2π;

switcher means for selectively outputting one of the series of clock pulses from said clock pulse generator means; and regulator means for regulating said switcher means to output one of the series of clock pulses in one of a first clock-pulse-outputting manner, to cause a delay in the phase of the output clock pulses, and a second clock-pulse-outputting manner, to cause an advance in the phase of the output clock pulses, wherein said regulator means regulates said switcher means to output one of the series of clock pulses therefrom in said first clock-pulse-outputting manner when said determiner means determines that the relative inclination of said sub-scanning line is negative, and wherein said regulator means regulates said switcher means to output one of the series of clock pulses in said second clock-pulse-outputting manner when said determiner means determines that the inclination of said sub-scanning line is positive.

44. The laser drawing apparatus of claim 41, further comprising:

detector means for detecting the positioning-marks of said workpiece; and calculator means for calculating the inclination data of said axis, defined by the positioning-marks of said workpiece, on the basis of the detection of said positioning-marks by said detector means.

45. The laser drawing apparatus of claim 44, wherein said detector means comprises:

image sensor means for optically and electronically sensing the positioning-marks of said workpiece, with respect to a coordinate system defined in a drawing plane of said apparatus, to produce video signals containing the positioning-marks; and video-signal processor means for processing the video signals to obtain the inclination data of said axis defined by the positioning-marks of said workpiece.

46. A laser drawing apparatus for drawing a pattern on a workpiece by scanning the workpiece with at least one laser beam in both a main-scanning direction and in a sub-scanning direction, the laser beam being modulated on the basis of raster-graphic data, read from a memory, in accordance with a series of clock pulses, scanning of the workpiece with the laser beam in the main-scanning direction being carried out by deflecting the laser beam with respect to the workpiece, scanning of the workpiece with the laser beam in the sub-scanning direction being carried out by moving the workpiece with respect to the laser beam, said apparatus comprising:

first calculator means for calculating one-pixel-dot-shift location data indicating when a main-scan-start position in said main-scanning direction should be shifted, by a distance corresponding to a one-pixel-dot size, on the basis of previously-measured pixel-dot-misalignment data of pixel-dots included in a sub-scanning line defined by the movement of said workpiece in said sub-scanning direction;

first controller means for controlling the shift of said main-scan-start position by regulating a reading time of said raster-graphic data from said memory whenever said laser beam reaches each one-pixel-dot-shift location, represented by said one-pixel-dot-shift location data, during the movement of said workpiece in said sub-scanning direction, whereby a pixel-dot-misalignment of said pixel-dots included in said sub-scanning line can be corrected with a unit of said one-pixel-dot size;

second calculator means for calculating clock-pulse-phase-shift location data indicating where a phase of said clock pulses should be shifted, with a unit of less than 2π, on the basis of said pixel-dot-misalignment data; and second controller means for controlling outputting of said clock pulses so the phase of said clock pulses is shifted, with the unit of less than 2π, whenever said laser beam reaches each clock-pulse-phase-shift- location, represented by said clock-pulse-phase-shift location data, during the movement of said workpiece in said sub-scanning direction, whereby said pixel-dot-misalignment can be finely corrected with a unit of less than said one-pixel-dot size.

47. The laser drawing apparatus of claim 46, further comprising:

first determiner means for determining whether production of a pixel-dot-misalignment at each one-pixel-dot-shift location is positive or negative, the pixel-dot-misalignment being defined as positive when produced at each one-pixel-dot-shift location in said main-scanning direction, the pixel-dot-misalignment being defined as negative when produced at each one-pixel-dot-shift location in an opposite direction to said main-scanning direction; and second determiner means for determining whether production of a pixel-dot-misalignment at each clock-pulse-phase-shift location is positive or negative, the pixel-dot-misalignment being defined as positive when produced at each clock-pulse-phase-shift location in said main-scanning direction, the pixel-dot-misalignment being defined as negative when produced at each clock-pulse-phase-shift location in an opposite direction to said main-scanning direction, wherein the reading time of said raster-graphic data from said memory is advanced by a time required to read a one-pixel raster-graphic datum from said memory when said first determiner means determines that the pixel-dot-misalignment is positive, wherein the reading-timing of said raster-graphic data from said memory is delayed by the time required to read said one-pixel raster-graphic datum from said memory when said first determiner means determines that the pixel-dot-misalignment is negative, wherein the shift of the phase of said clock pulses, with the unit of less than 2π, is carried out such that the phase of said clock pulses is advanced when said second determiner means determines that the pixel-dot-misalignment is positive, and wherein the shift of the phase of said clock pulses, with the unit of less than 2π, is carried out such that the phase of said clock pulses is delayed when said second determiner means determines that the pixel-dot-misalignment is negative.

48. The laser drawing apparatus of claim 47, wherein said second controller means comprises:

clock pulse generator means for producing a plurality of series of clock pulses on the basis of a series of basic clock pulses, the respective series of clock pulses having phases which are shifted from each other within a range of 2π;

switcher means for selectively outputting one of the series of clock pulses from said clock pulse generator means; and regulator means for regulating said switcher means to output one of the series of clock pulses in one of a first clock-pulse-outputting manner, to cause a delay in the phase of the output clock pulses, and a second clock-pulse-outputting manner, to cause an advance in the phase of the output clock pulses, wherein said regulator means regulates said switcher means to output one of the series of clock pulses in said first clock-pulse-outputting manner when said second determiner means determines that the pixel-dot-misalignment is negative, and wherein said regulator means regulates said switcher means to output one of the series of clock pulses in said second clock-pulse-outputting manner when said second determiner means determines that the pixel-dot-misalignment is positive.

* * * * *